US008927981B2

(12) United States Patent
Akimoto et al.

(10) Patent No.: US 8,927,981 B2
(45) Date of Patent: Jan. 6, 2015

(54) SEMICONDUCTOR DEVICE AND METHOD FOR MANUFACTURING THE SAME

(75) Inventors: Kengo Akimoto, Atsugi (JP); Hiromichi Godo, Isehara (JP); Akiharu Miyanaga, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1003 days.

(21) Appl. No.: 12/725,478

(22) Filed: Mar. 17, 2010

(65) Prior Publication Data

US 2010/0244031 A1 Sep. 30, 2010

(30) Foreign Application Priority Data

Mar. 30, 2009 (JP) .................... 2009-083250

(51) Int. Cl.
*H01L 29/12* (2006.01)
*H01L 29/786* (2006.01)
*H01L 27/12* (2006.01)
*H01L 29/417* (2006.01)
*H01L 29/45* (2006.01)

(52) U.S. Cl.
CPC ........ *H01L 29/7869* (2013.01); *H01L 27/1225* (2013.01); *H01L 29/41733* (2013.01); *H01L 27/1214* (2013.01); *H01L 29/45* (2013.01)
USPC .......... 257/43; 257/57; 257/66; 257/E21.414; 438/149; 438/151; 438/104; 438/158

(58) Field of Classification Search
USPC ........ 438/158, 151, 104, 149; 257/23, 43, 57, 257/E21.414, E21.413, E29.296, E29.273, 257/72, 350, 61
See application file for complete search history.

(56) References Cited

U.S. PATENT DOCUMENTS 5,047,819 A * 9/1991 Tanaka et al. ................. 257/350
5,270,567 A * 12/1993 Mori et al. .................... 257/412

(Continued)

FOREIGN PATENT DOCUMENTS

EP 0622855 A 11/1994
EP 1737044 A 12/2006

(Continued)

OTHER PUBLICATIONS

Granvist et al. "Transparent and conducting ITO films: new developments and." Thin Solid Films. 411. (2002): 1-5. Print.*

(Continued)

*Primary Examiner* — Samuel Gebremariam
*Assistant Examiner* — Lauren R Bell
(74) *Attorney, Agent, or Firm* — Eric J. Robinson; Robinson Intellectual Property Law Office, P.C.

(57) ABSTRACT

The drain voltage of a transistor is determined depending on the driving voltage of an element connected to the transistor. With downsizing of a transistor, intensity of the electric field concentrated in the drain region is increased, and hot carriers are easily generated. An object is to provide a transistor in which the electric field hardly concentrates in the drain region. Another object is to provide a display device including such a transistor. End portions of first and second wiring layers having high electrical conductivity do not overlap with a gate electrode layer, whereby concentration of an electric field in the vicinity of a first electrode layer and a second electrode layer is reduced; thus, generation of hot carriers is suppressed. In addition, one of the first and second electrode layers having higher resistivity than the first and second wiring layers is used as a drain electrode layer.

17 Claims, 31 Drawing Sheets

(56) References Cited

U.S. PATENT DOCUMENTS

| | | | |
|---|---|---|---|
| 5,473,168 A | 12/1995 | Kawai et al. | |
| 5,731,856 A | 3/1998 | Kim et al. | |
| 5,744,864 A | 4/1998 | Cillessen et al. | |
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,680,223 B1 * | 1/2004 | Yamazaki et al. | 438/149 |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 * | 3/2006 | Hoffman et al. | 257/72 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 | 3/2007 | Akimoto et al. | |
| 2007/0090365 A1 | 4/2007 | Hayashi et al. | |
| 2007/0108446 A1 * | 5/2007 | Akimoto | 257/61 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0239335 A1 | 9/2009 | Akimoto et al. | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0003783 A1 | 1/2010 | Akimoto | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117077 A1 | 5/2010 | Yamazaki et al. | |
| 2010/0213461 A1 | 8/2010 | Akimoto et al. | |

FOREIGN PATENT DOCUMENTS

| | | | |
|---|---|---|---|
| EP | 2226847 A | | 9/2010 |
| GB | 2211992 A | * | 7/1989 |
| JP | 60-198861 | | 10/1985 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 03-231472 A | | 10/1991 |
| JP | 05-251705 A | | 9/1993 |
| JP | 06-314789 A | | 11/1994 |
| JP | 08-264794 | | 10/1996 |
| JP | 08-264794 A | | 10/1996 |
| JP | 11-505377 | | 5/1999 |
| JP | 2000-044236 A | | 2/2000 |
| JP | 2000-150900 | | 5/2000 |
| JP | 2002-076356 A | | 3/2002 |
| JP | 2002-289859 A | | 10/2002 |
| JP | 2003-086000 A | | 3/2003 |
| JP | 2003-086808 A | | 3/2003 |
| JP | 2004-103957 | | 4/2004 |
| JP | 2004-273614 A | | 9/2004 |
| JP | 2004-273732 A | | 9/2004 |
| JP | 2007-081362 | | 3/2007 |
| JP | 2007-096055 | | 4/2007 |
| JP | 2007-123700 | | 5/2007 |
| JP | 2007-123861 | | 5/2007 |
| JP | 2007-150158 A | | 6/2007 |

(56) References Cited

FOREIGN PATENT DOCUMENTS

| | | |
|---|---|---|
| JP | 2007-250983 A | 9/2007 |
| WO | WO-2004/114391 | 12/2004 |
| WO | WO-2007/119386 | 10/2007 |

OTHER PUBLICATIONS

Handbook of Chemistry and Physics. 93. 2002. 12-41 to 12-42. Print.*

Miller. "The Electrical Conductivity of Zinc Oxide." Physical Review. 60.Dec. 15, 1941: 890-895. Print.*

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nakamura et al., "Syntheses and crystal structures of new homologous compounds, indium iron zinc oxides ($InFeO_3(ZnO)_m$) (m: natural number) and related compounds," Kotai Butsuri (Solid State Physics), 1993, vol. 28, No. 5, pp. 317-327 (with full translation).

Nomura et al., "Thin-Film Transistor Fabricated in Single-Crystalline Transparent Oxide Semiconductor," Science, May 23, 2003, vol. 300, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Lee.J et al., "World's Largest (15-inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.

(56) References Cited

OTHER PUBLICATIONS

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Bule Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe$_2$O$_4$, and Yb$_2$Fe$_3$O$_7$ Types of Structures for Compounds in the In$_2$O$_3$and Sc$_2$O$_3$—A$_2$O$_3$—BO Systems [A: Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Nomura, K., et al., "Thin-Film Transistor Fabricated in Single-Crystalline Transparent Oxide Semiconductor," Science, May 23, 2003, vol. 300, No. 5623, pp. 1269-1272.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp.2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters ) , Jun. 26, 2007, vol. 90, No. 26, pp. 262106-1-262106-3.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08, SID International Symposium Digest of Technical Papers, May 20, 2008, vol. 29, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 15, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics ), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters ) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(NnO)m (m < 4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW'08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

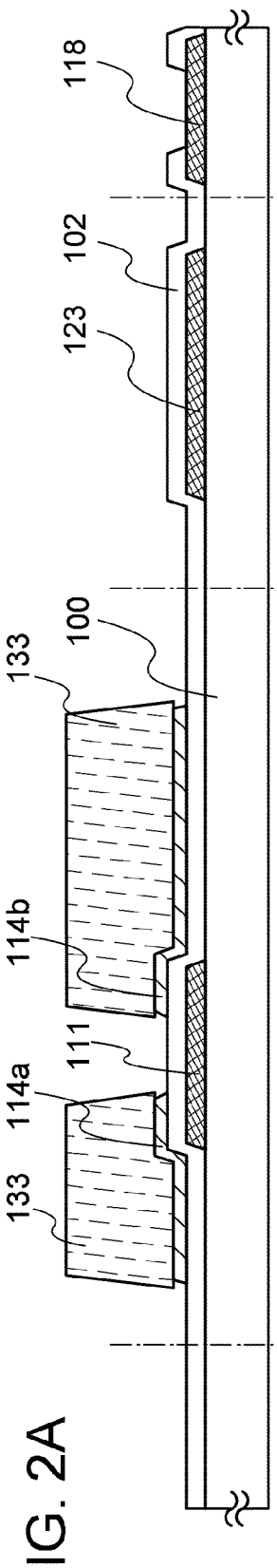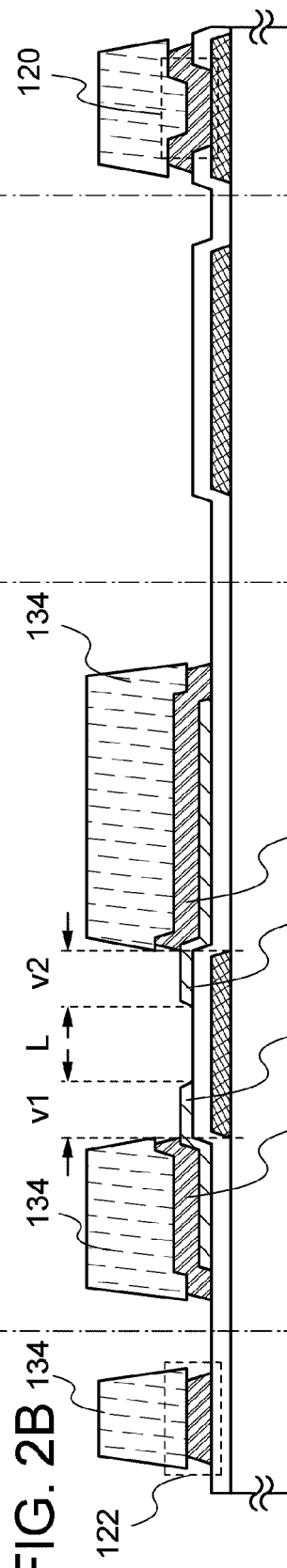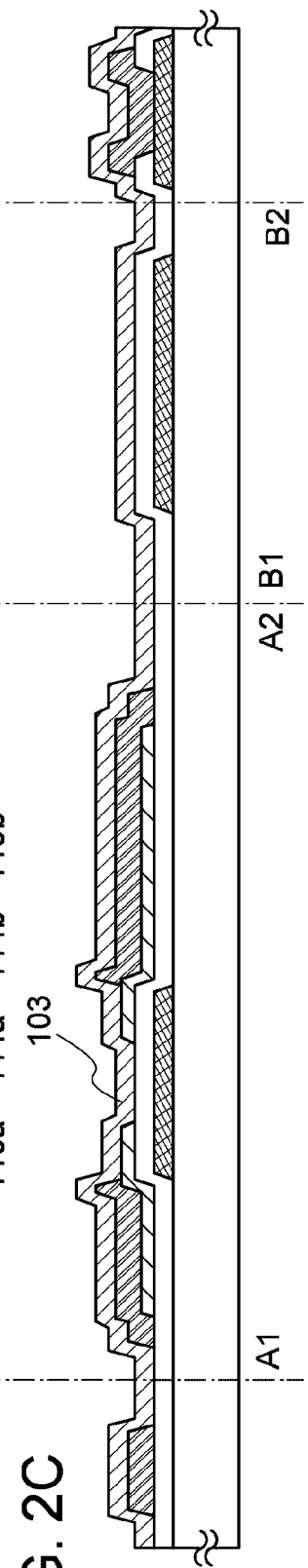

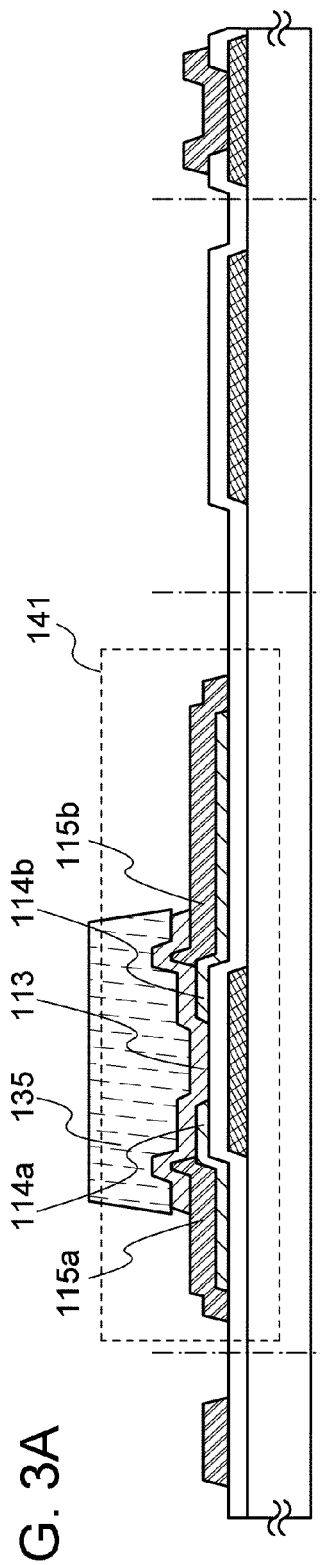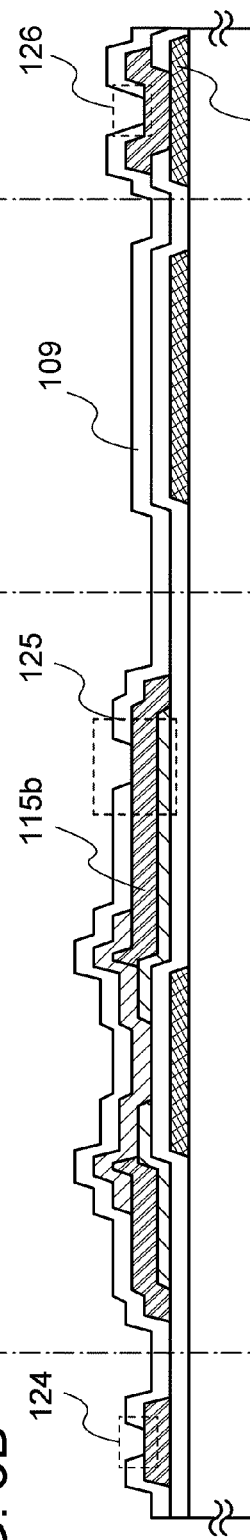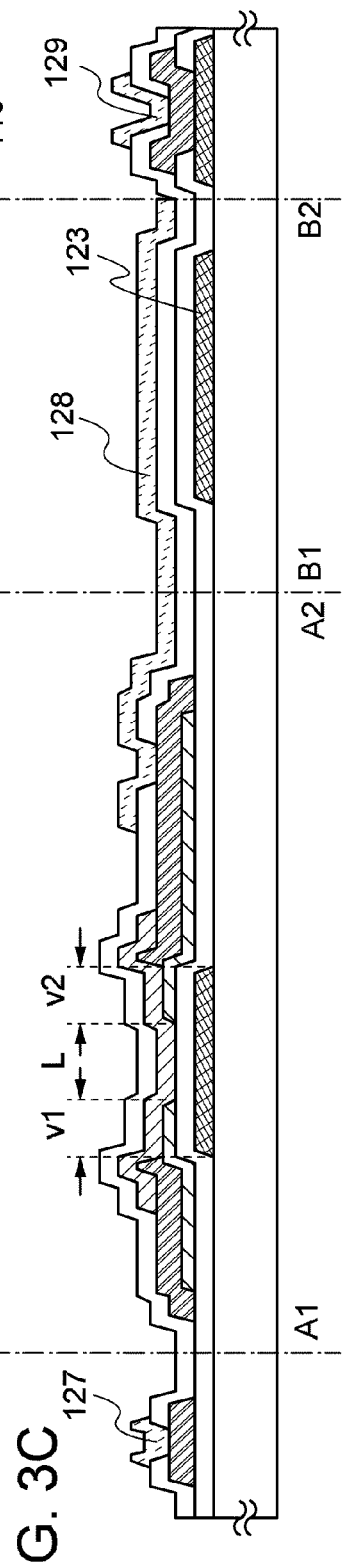

FIG. 4A1
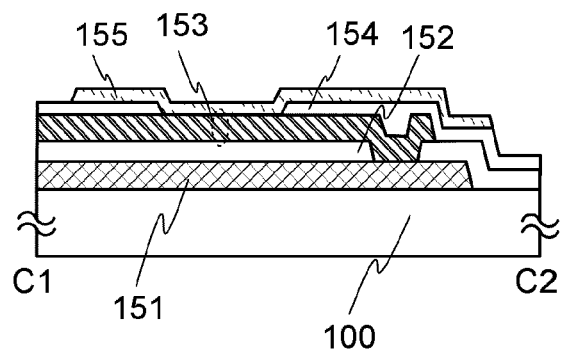
FIG. 4A2
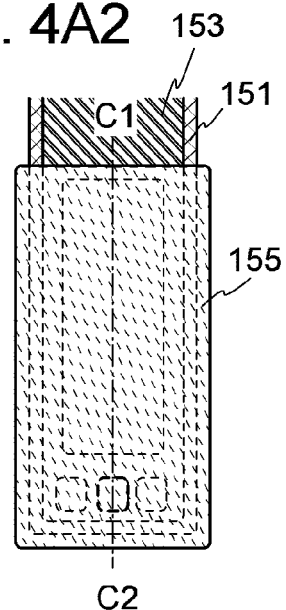
FIG. 4B1
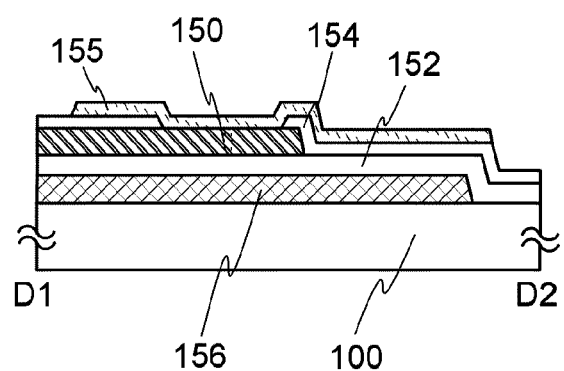
FIG. 4B2
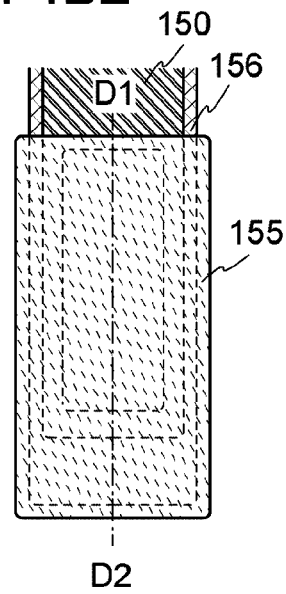

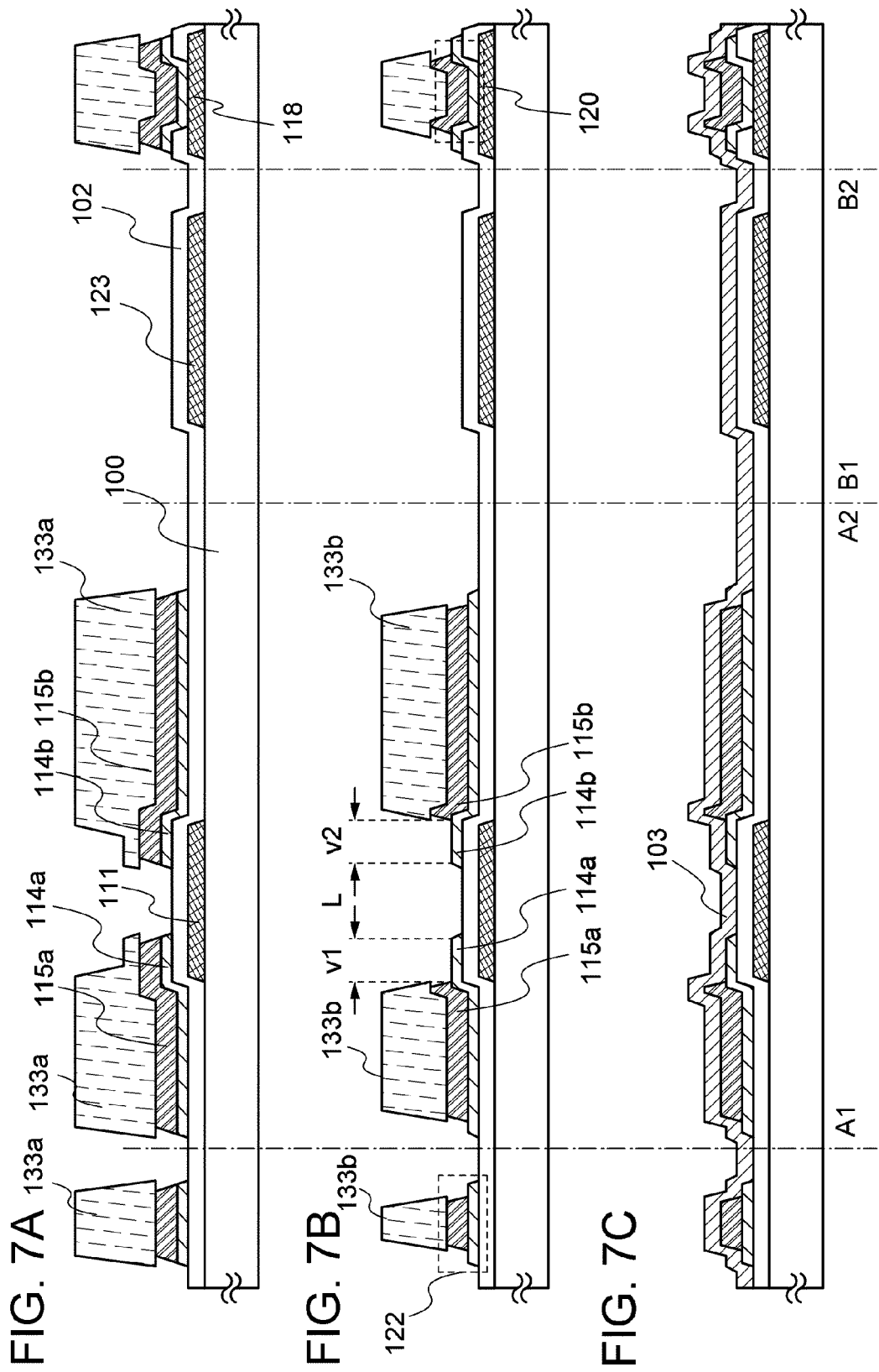

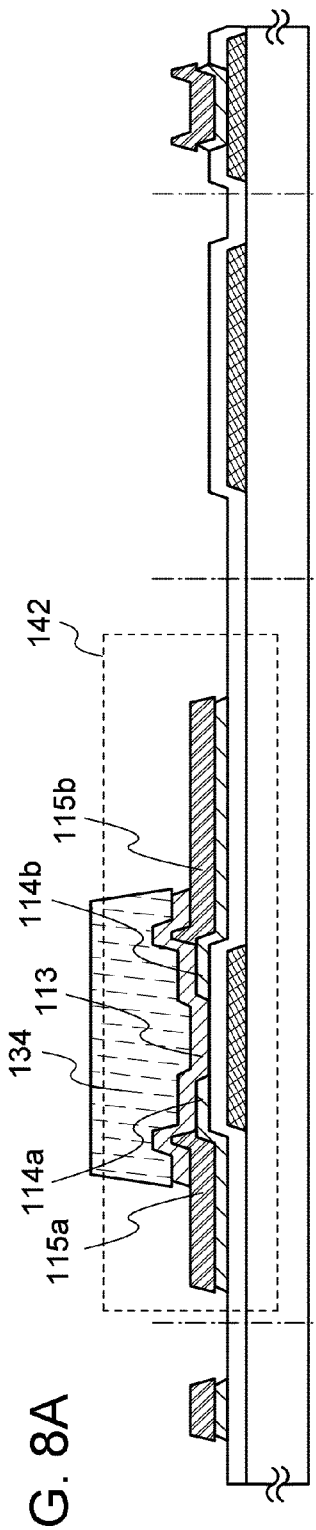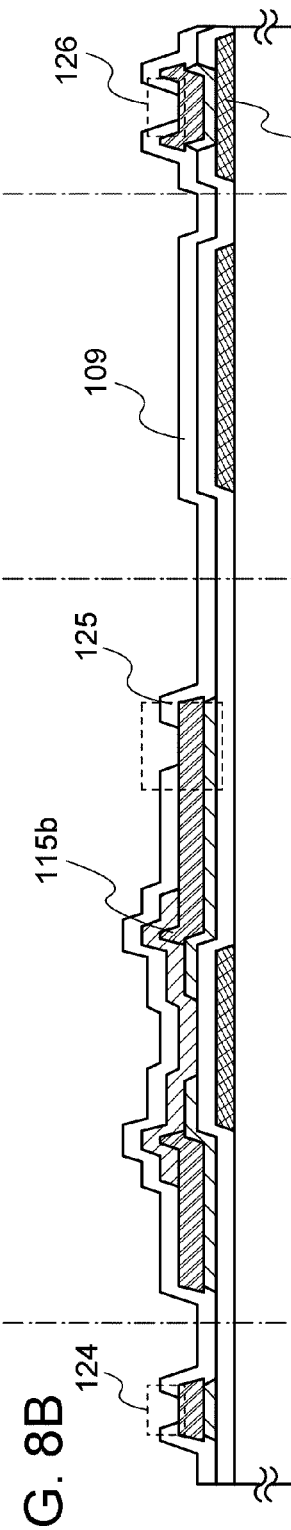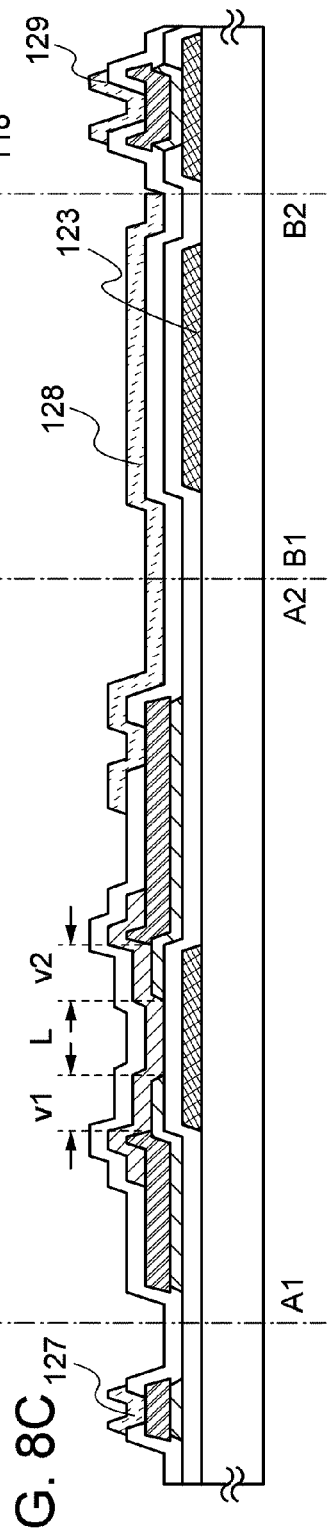

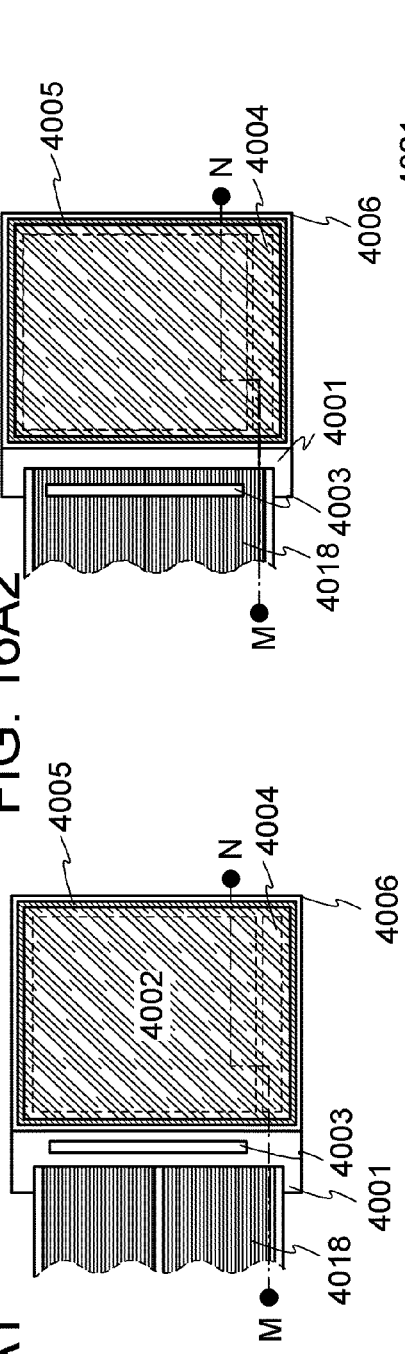
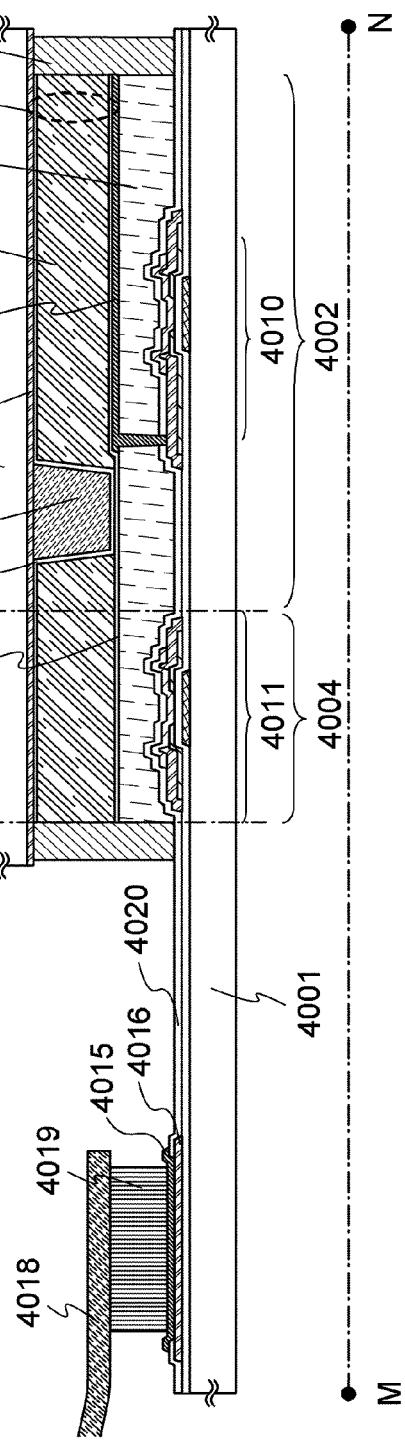
FIG. 16A1
FIG. 16A2
FIG. 16B

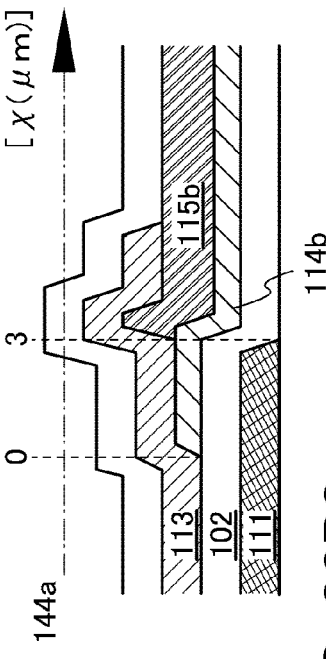
FIG. 26A2
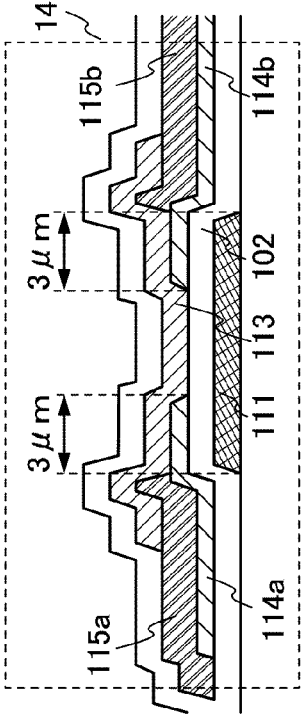
FIG. 26A1
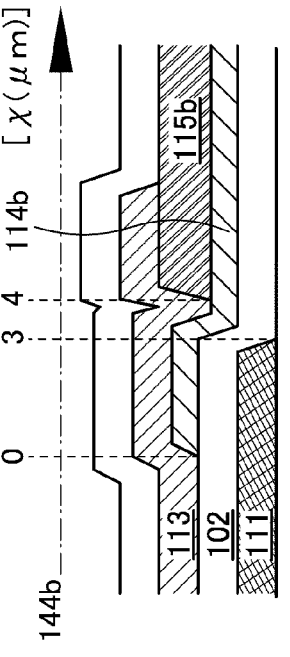
FIG. 26B2
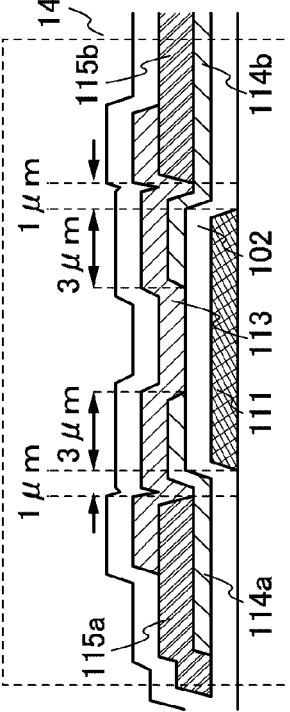
FIG. 26B1
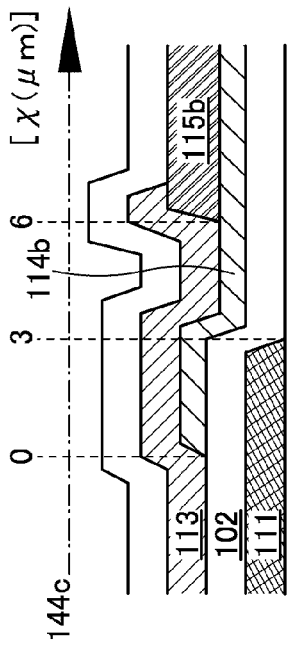
FIG. 26C2
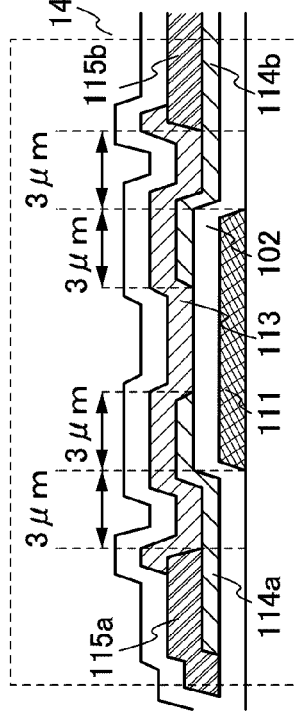
FIG. 26C1

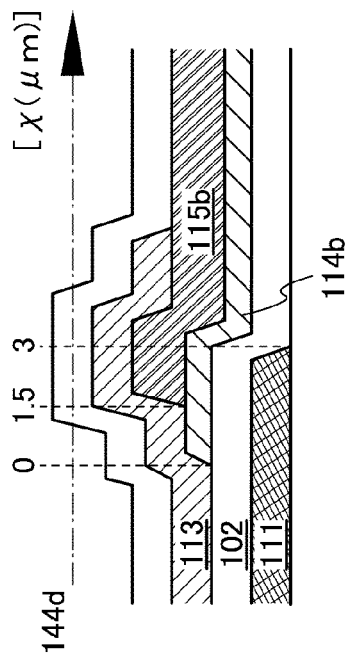
FIG. 27A1
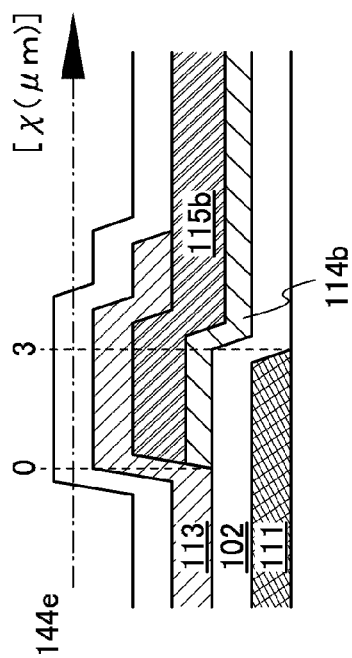
FIG. 27A2
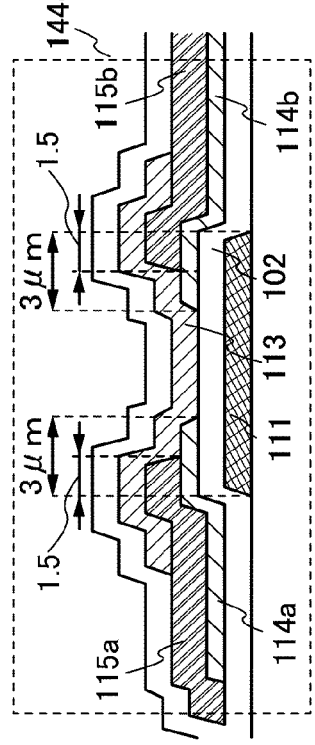
FIG. 27B1
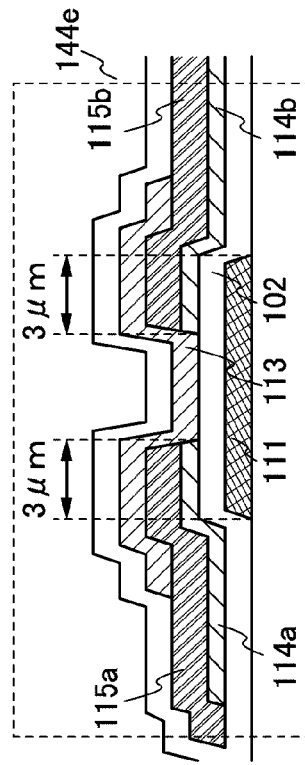
FIG. 27B2

SEMICONDUCTOR DEVICE AND METHOD FOR MANUFACTURING THE SAME

BACKGROUND OF THE INVENTION

1. Field of the Invention

The present invention relates to a semiconductor device including a semiconductor element and a manufacturing method thereof 2. Description of the Related Art Various metal oxides are used for a variety of applications.

Indium oxide is a well-known material and is used as a transparent electrode material which is necessary for liquid crystal displays and the like.

Some metal oxides have semiconductor characteristics. For example, tungsten oxide, tin oxide, indium oxide, zinc oxide, and the like can be given as metal oxides exhibiting semiconductor characteristics. References disclose a thin film transistor in which such a metal oxide exhibiting semiconductor characteristics is used for a channel formation region (Patent Documents 1 to 4, and Non-Patent Document 1).

Examples of metal oxides include not only an oxide of a single metal element but also an oxide of a plurality of metal elements (multi-component). For example, $InGaO_3(ZnO)_m$ (m is a natural number) having homologous series has been known as a multi-component oxide semiconductor including In, Ga, and Zn (Non-Patent Documents 2 to 4).

Furthermore, it is proved that an oxide semiconductor including an In—Ga—Zn-based oxide is applicable to a channel layer of a thin film transistor (Patent Document 5 and Non-Patent Documents 5 and 6).

In a conventional technique, amorphous silicon or polycrystalline silicon has been used for a thin film transistor (a TFT) provided for each pixel of an active matrix liquid crystal display. However, in place of these silicon materials, attention has been attracted to a technique for manufacturing a thin film transistor including the metal oxide semiconductor described above. For example, Patent Documents 6 to 9 disclose a technique in which a thin film transistor is formed using zinc oxide or an In—Ga—Zn—O-based oxide semiconductor as a metal oxide semiconductor and is used as a switching element or the like of an image display device. It is also known that semiconductors including elements of Group 14 other than silicon and compound semiconductors other than the oxide semiconductor described above can be used for a channel layer of a transistor.

An oxide semiconductor film can be deposited at temperature of 300° C. or lower by a sputtering method or the like, and thin film transistors in each of which a channel formation region is formed using an oxide semiconductor can be easily formed in a wide region of a large substrate. Thus, application of oxide semiconductors to active matrix display devices has been expected.

REFERENCE

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Patent Document 6] Japanese Published Patent Application No. 2007-123861

[Patent Document 7] Japanese Published Patent Application No. 2007-096055

[Patent Document 8] Japanese Published Patent Application No. 2007-081362

[Patent Document 9] Japanese Published Patent Application No. 2007-123700

[Non-Patent Document]

[Non-Patent Document 1] PRINS. M et al., "A FERROELECTRIC TRANSPARENT THIN-FILM TRANSISTOR", *APPL. PHYS. LETT. (APPLIED PHYSICS LETTERS)*, Jun. 17, 1996, Vol. 68, No. 25, pp. 3650-3652

[Non-Patent Document 2] NAKAMURA. M et al., "THE PHASE RELATIONS IN THE $In_2O_3$—$Ga_2ZnO_4$—ZnO SYSTEM AT 1350° C.", *JOURNAL OF SOLID STATE CHEMISTRY*, Aug. 1, 1991, Vol. 93, No. 2, pp. 298-315

[Non-Patent Document 3] KIMIZUKA. N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *JOURNAL OF SOLID STATE CHEMISTRY*, Apr. 1, 1995, Vol. 116, No. 1, pp. 170-178

[Non-Patent Document 4] NAKAMURA. M et al., "Syntheses and crystal structures of new homologous compounds, indium iron zinc oxides ($InFeO_3(ZnO)_m$) (m:natural number) and related compounds", *KOTAI BUTSURI (SOLID STATE PHYSICS)*, 1993, Vol. 28, No. 5, pp. 317-327

[Non-Patent Document 5] NOMURA. K et al., "THIN-FILM TRANSISTOR FABRICATED IN SINGLE-CRYSTALLINE TRANSPARENT OXIDE SEMICONDUCTOR", *SCIENCE*, May 23, 2003, Vol. 300, pp. 1269-1272

[Non-Patent Document 6] NOMURA. K et al., "ROOM-TEMPERATURE FABRICATION OF TRANSPARENT FLEXIBLE THIN-FILM TRANSISTORS USING AMORPHOUS OXIDE SEMICONDUCTORS", *NATURE*, Nov. 25, 2004, Vol. 432, pp. 488-492

SUMMARY OF THE INVENTION

The drain voltage of the transistor connected to a liquid crystal display element or a light-emitting element is determined depending on the driving voltage of such an element. In the case of using a transistor, for example, for display, the transistor is preferably downsized in order to improve the aperture ratio for the purpose of high luminance, to achieve high definition, and to reduce power consumption, and thus, a channel region in the transistor is preferably short. However, when the channel length in the transistor is reduced with the drain voltage kept at the same voltage level, intensity of the electric field which concentrates in the vicinity of the drain region increases, and hot carriers are easily generated.

When the generated hot carriers are injected in the vicinity of the drain region, for example, to be fixed charge, a phenomenon that the on current (the drain current flowing during an on state of a semiconductor element) of the transistor is reduced over time, that is, hot-carrier degradation, is caused.

Thus, it is an object of an embodiment of the present invention to provide a transistor in which the electric field hardly concentrates in the drain region. Further, it is another object to provide a display device including such a transistor.

A summary of the present invention is a transistor including a first electrode layer, a second electrode layer, a first wiring layer electrically connected to the first electrode layer, a second wiring layer electrically connected to the second electrode layer, an oxide semiconductor layer over the first electrode layer and the second electrode layer, a gate insulating film which is in contact with the oxide semiconductor layer, and a gate electrode layer overlapping with end portions of the first and second electrode layers with the gate insulating film between the gate electrode layer and the first and second electrode layers, where the first wiring layer and the second wiring layer overlap with an opening portion of the gate electrode layer, the oxide semiconductor layer is electrically connected to a side face and a top face of the first electrode layer and a side face and a top face of the second electrode layer, electrical conductivity of the first electrode layer and electrical conductivity of the second electrode layer are equal to or higher than electrical conductivity of the oxide semiconductor layer and are equal to or lower than electrical conductivity of the first wiring layer and electrical conductivity of the second wiring layer. Note that in this specification, the sentence "the first wiring layer and the second wiring layer overlap with an opening portion of the gate electrode layer" means that the first wiring layer and the second wiring layer do not overlap with the gate electrode layer.

In other words, end portions of the first and second wiring layers having high electrical conductivity are provided so as not to overlap with the gate electrode layer. As a result, in the transistor, concentration of an electric field in the vicinity of the first electrode layer and the second electrode layer is reduced, whereby generation of hot carriers is suppressed. In addition, one of the first and second electrode layers having higher resistance than the first and second wiring layers is used as a drain electrode layer.

An embodiment of the invention to be disclosed is a semiconductor device including a gate electrode layer, a gate insulating film over the gate electrode layer, a first electrode layer and a second electrode layer which are over the gate insulating film and each have an end portion overlapping with the gate electrode layer, a first wiring layer and a second wiring layer which are over the gate insulating film and overlap with an opening portion of the gate electrode layer, and an oxide semiconductor layer in a region which overlaps with the gate electrode layer. The first wiring layer and the first electrode layer are electrically connected, and the second wiring layer and the second electrode layer are electrically connected. The first electrode layer is extended so as to have the end portion positioned more inwardly than an end portion of the first wiring layer and overlap with the gate electrode layer, and the second electrode layer is extended so as to have the end portion positioned more inwardly than an end portion of the second wiring layer and overlap with the gate electrode layer. The oxide semiconductor layer is electrically connected to a side face and a top face of the first electrode layer and a side face and a top face of the second electrode layer. The oxide semiconductor layer is in contact with a top face of the gate insulating film. Electrical conductivity of the first electrode layer and electrical conductivity of the second electrode layer are equal to or higher than electrical conductivity of the oxide semiconductor layer and are equal to or lower than electrical conductivity of the first wiring layer and electrical conductivity of the second wiring layer.

In the semiconductor device, electrical conductivity of the first electrode layer and electrical conductivity of the second electrode layer are each within the range of from $1\times10^{-4}$ S/cm to $1\times10^{2}$ S/cm inclusive, more preferably, $1\times10^{-3}$ S/cm to $1\times10^{1}$ S/cm inclusive.

Further, in the semiconductor device, a length (v1) of the region where the first electrode layer overlaps with the gate electrode layer and a length (v2) of the region where the second electrode layer overlaps with the gate electrode layer are each within the range of from 0.2 µm to 5 µm inclusive.

Furthermore, in the semiconductor device, a thickness of the oxide semiconductor layer is within the range of from 5 nm to 200 nm inclusive, preferably, from 20 nm to 60 nm inclusive, and each thickness of the first electrode layer and the second electrode layer is within the range of from 5 nm to 200 nm inclusive, preferably, from 5 nm to a half of the thickness of the oxide semiconductor layer.

Note that the end portion of the first wiring layer is located above one of the end portions of the gate electrode layer with the gate insulating film and the first electrode layer therebetween, and the end portion of the second wiring layer is located above the other end portion of the gate electrode layer with the gate insulating film and the second electrode layer therebetween.

Another embodiment of the invention to be disclosed is a semiconductor device including a first electrode layer, a second electrode layer, a first wiring layer electrically connected to the first electrode layer, a second wiring layer electrically connected to the second electrode layer, an oxide semiconductor layer over the first electrode layer and the second electrode layer, a gate insulating film over the oxide semiconductor layer, and a gate electrode layer which is over the gate insulating film and overlaps with each end portion of the first and second electrode layers. The first wiring layer and the second wiring layer are provided in an opening portion of the gate electrode layer. The oxide semiconductor layer is electrically connected to a side face and a top face of the first electrode layer and a side face and a top face of the second electrode layer. Electrical conductivity of the first electrode layer and electrical conductivity of the second electrode layer are equal to or higher than electrical conductivity of the oxide semiconductor layer and are equal to or lower than electrical conductivity of the first wiring layer and electrical conductivity of the second wiring layer.

In the semiconductor device, electrical conductivity of the first electrode layer and electrical conductivity of the second electrode layer are each within the range of from $1\times10^{-4}$ S/cm to $1\times10^{2}$ S/cm inclusive, preferably, $1\times10^{-3}$ S/cm to $1\times10^{1}$ S/cm inclusive.

Further, a length (v1) of a region where the first electrode layer overlaps with the gate electrode layer and a length (v2) of a region where the second electrode layer overlaps with the gate electrode layer are each within the range of from 0.2 µm to 5 µm inclusive.

Furthermore, a thickness of the oxide semiconductor layer is within the range of from 5 nm to 200 nm inclusive, preferably, from 20 nm to 60 nm inclusive, and each thickness of the first electrode layer and the second electrode layer is within the range of from 5 nm to 200 nm inclusive, preferably, from 5 nm to a half of the thickness of the oxide semiconductor layer.

Note that one of end portions of the gate electrode layer is located above an end portion of the first wiring layer with the oxide semiconductor layer and the gate insulating film therebetween, and the other end portion of the gate electrode layer is located above an end portion of the second wiring layer with the oxide semiconductor layer and the gate insulating film therebetween.

Another embodiment of the invention to be disclosed is a method for manufacturing a semiconductor device including the steps of forming a gate electrode layer over a substrate, forming a gate insulating film over the gate electrode layer, forming a first electrode layer and a second electrode layer each of which is over the gate insulating film and has an end portion overlapping with the gate electrode layer, forming a first wiring layer electrically connected to the first electrode layer and a second wiring layer electrically connected to the second electrode layer to overlap with an opening portion of the gate electrode layer, and forming an oxide semiconductor layer in a region overlapping with the gate electrode layer. The first electrode layer is extended so as to have the end portion positioned more inwardly than an end portion of the first wiring layer and overlap with the gate electrode layer, and the second electrode layer is extended so as to have the end portion positioned more inwardly than an end portion of the second wiring layer and overlap with the gate electrode layer. The oxide semiconductor layer is electrically connected to a side face and a top face of the first electrode layer and a side face and a top face of the second electrode layer. The oxide semiconductor layer is in contact with a top face of the gate insulating film. Electrical conductivity of the first electrode layer and electrical conductivity of the second electrode layer are equal to or higher than electrical conductivity of the oxide semiconductor layer and are equal to or lower than electrical conductivity of the first wiring layer and electrical conductivity of the second wiring layer.

Another embodiment of the invention to be disclosed is a method for manufacturing a semiconductor device including the steps of forming a first electrode layer and a second electrode layer over a substrate, forming a first wiring layer electrically connected to the first electrode layer and a second wiring layer electrically connected to the second electrode layer, forming an oxide semiconductor layer over the first electrode layer and the second electrode layer, forming a gate insulating film over the oxide semiconductor layer, and forming a gate electrode layer which is over the gate insulating film and overlaps with each end portions of the first and second electrode layers. The gate electrode layer is provided in an opening portion between the first wiring layer and the second wiring layer. The oxide semiconductor layer is electrically connected to a side face and a top face of the first electrode layer and a side face and a top face of the second electrode layer. Electrical conductivity of the first electrode layer and electrical conductivity of the second electrode layer are equal to or higher than electrical conductivity of the oxide semiconductor layer and are equal to or lower than electrical conductivity of the first wiring layer and electrical conductivity of the second wiring layer. Note that the ordinal numbers such as "first" and "second" in this specification are used for convenience and do not denote the order of steps and the stacking order of layers. In addition, the ordinal numbers in this specification do not denote particular names which specify the present invention.

Further, the term "semiconductor device" in this specification generally indicates all devices that are capable of functioning with use of semiconductor characteristics, and semiconductor circuits, electro-optic devices and electronic devices using semiconductor characteristics are all semiconductor devices.

According to an embodiment of the present invention, a transistor in which concentration of an electric field in the vicinity of first and second electrode layers is reduced and generation of hot carriers is suppressed can be provided.

By using the transistor for a pixel portion and a driver circuit portion of a display device, the display device can have high electrical characteristics and high reliability.

BRIEF DESCRIPTION OF THE DRAWINGS

FIGS. 2A to 2C illustrate a manufacturing method of a semiconductor device according to one embodiment of the present invention.

FIGS. 3A to 3C illustrate a manufacturing method of a semiconductor device according to one embodiment of the present invention.

FIGS. 4A1 and 4A2 and 4B1 and 4B2 illustrate a semiconductor device according to one embodiment of the present invention.

FIGS. 7A to 7C illustrate a manufacturing method of a semiconductor device according to one embodiment of the present invention.

FIGS. 8A to 8C illustrate a manufacturing method of a semiconductor device according to one embodiment of the present invention.

FIGS. 16A1 and 16A2 and 16B illustrate a semiconductor device according to one embodiment of the present invention.

FIGS. 26A1 and 26A2, 26B1 and 26B2, and 26C1 and 26C2 illustrate semiconductor devices according to one embodiment of the present invention.

FIGS. 27A1 and 27A2 and 27B1 and 27B2 illustrate semiconductor devices according to one embodiment of the present invention.

DETAILED DESCRIPTION OF THE INVENTION

Figure 1A:
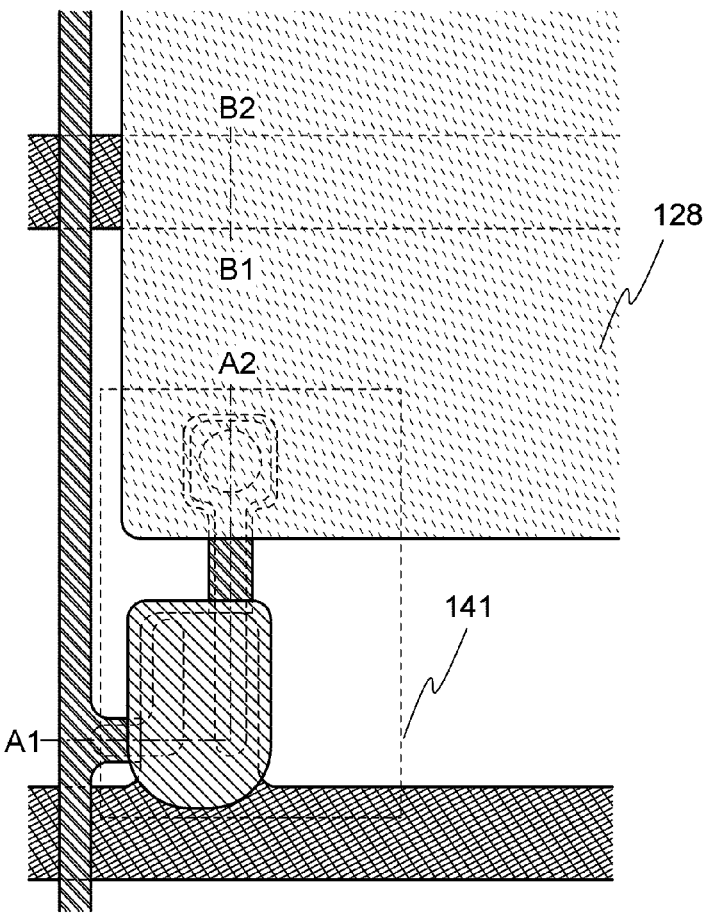
FIGS. 1A to 1C illustrate a semiconductor device according to one embodiment of the present invention.

Embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the structures to be given below, the same portions or portions having similar functions are denoted by the same reference numerals in different drawings, and repetitive description thereof is omitted.

(Embodiment 1)

In this embodiment, a structure of a transistor, which is an embodiment of a semiconductor device, will be described.

Figure 1B:
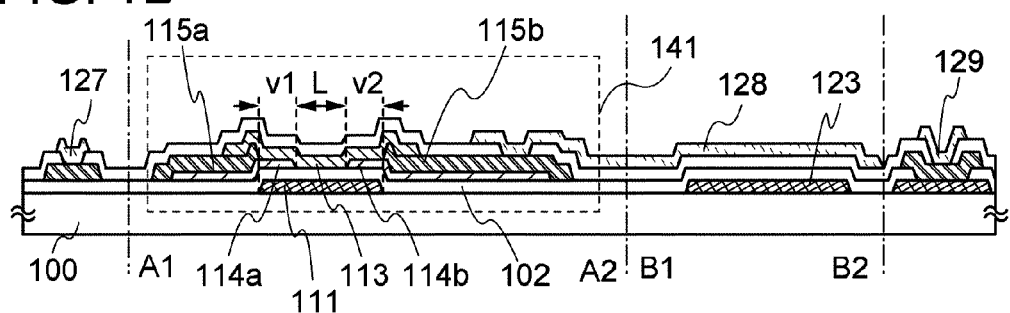
Figure 1C:
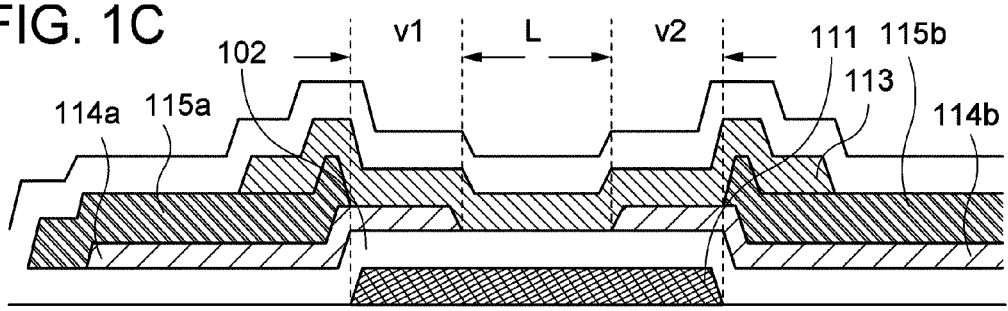

A transistor having a bottom gate structure of this embodiment is illustrated in FIGS. 1A to 1C. FIG. 1A is a plan view, and FIG. 1B is a cross-sectional view taken along line A1-A2 and line B1-B2 of FIG. 1A. FIG. 1C is a cross-sectional view in which a portion in a transistor 141 of FIG. 1B where a first electrode layer 114a is extended more inwardly than a first wiring layer 115a and a second electrode layer 114b is extended more inwardly than a second wiring layer 115b is enlarged.

In the transistor 141 illustrated in FIGS. 1A to 1C, a gate electrode layer 111 is formed over a substrate 100, a gate insulating film 102 is formed over the gate electrode layer 111, and the first electrode layer 114a and the second electrode layer 114b serving as a source electrode layer and a drain electrode layer are formed over the gate insulating film 102 in such a way that end portions of the first electrode layer 114a and the second electrode layer 114b overlap with the gate electrode layer 111. The first wiring layer 115a and the second wiring layer 115b are provided over the first electrode layer 114a and the second electrode layer 114b, respectively, to be electrically connected to each other. In addition, a semiconductor layer 113 is provided in a region overlapping with the gate electrode layer 111. In this embodiment, an oxide semiconductor layer is formed as the semiconductor layer 113.

The first wiring layer 115a and the second wiring layer 115b each overlap with an opening portion of the gate electrode layer 111. An end portion of the first wiring layer 115a is located above one of end portions of the gate electrode layer 111 with the gate insulating film 102 and the first electrode layer 114a therebetween, and an end portion of the second wiring layer 115b is located above the other end portion of the gate electrode layer 111 with the gate insulating film 102 and the second electrode layer 114b therebetween. The first electrode layer 114a is extended so as to have the end portion positioned more inwardly than the end portion of the first wiring layer 115a and overlap with the gate electrode layer 111, and the second electrode layer 114b is extended so as to have the end portion positioned more inwardly than the end portion of the second wiring layer 115b and overlap with the gate electrode layer 111.

Note that the semiconductor layer 113 is provided to be in contact with side faces and top faces of the first electrode layer 114a and the second electrode layers 114b, and at least part of the semiconductor layer 113 is provided to be in contact with of the gate insulating film 102.

In FIG. 1B, any of the following substrates can be used as the substrate 100: an alkali-free glass substrate formed using barium borosilicate glass, aluminoborosilicate glass, aluminosilicate glass, or the like manufactured by a fusion method or a float method; a ceramic substrate; a plastic substrate having heat resistance enough to withstand a temperature of a manufacturing process of a semiconductor device in this embodiment; and the like. For example, a glass substrate which includes more barium oxide (BaO) than boric acid ($B_2O_3$) in composition ratio and whose strain point is 730° C. or higher is preferable. This is because the glass substrate is not strained even when the oxide semiconductor layer is thermally processed at high temperatures of about 700° C.

Alternatively, a metal substrate such as a stainless steel alloy substrate which is provided with an insulating film over the surface may also be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm or 730 mm×920 mm), the fifth generation (1000 mm×1200 mm or 1100 mm×1250 mm), the sixth generation (1500 mm×1800 mm), the seventh generation (1900 mm×2200 mm), the eighth generation (2160 mm×2460 mm), the ninth generation (2400 mm×2800 mm or 2450 mm×3050 mm), the tenth generation (2950 mm×3400 mm), and the like.

Further, an insulating film may be provided as a base film over the substrate 100. The base film may be formed to have a single-layer structure or a stacked structure of a silicon oxide film, a silicon nitride film, a silicon oxynitride film, and/or a silicon nitride oxide film by a CVD method, a sputtering method, or the like.

The gate electrode layer 111 can be formed with a single-layer structure or a stacked structure using a metal material such as aluminum (Al), copper (Cu), gold (Au), silver (Ag), platinum (Pt), molybdenum (Mo), titanium (Ti), chromium (Cr), tantalum (Ta), tungsten (W), neodymium (Nd), or scandium (Sc); an alloy material containing any of these metal materials as its main component; and/or a nitride containing any of these metal materials as its component. The gate electrode layer 111 is preferably formed using a low-resistance conductive material such as aluminum or copper; however, the low-resistance conductive material has disadvantages of low heat resistance and being easily eroded. Thus, the low-resistance conductive material is preferably used in combination with a heat-resistant conductive material. As the heat-resistant conductive material, molybdenum, titanium, chromium, tantalum, tungsten, neodymium, scandium, or the like is used.

As a conductive film including aluminum as a first component, it is preferable to use an aluminum alloy to which an element such as titanium (Ti), tantalum (Ta), tungsten (W), molybdenum (Mo), chromium (Cr), neodymium (Nd), scandium (Sc), nickel (Ni), platinum (Pt), copper (Cu), gold (Au), silver (Ag), manganese (Mn), carbon (C), or silicon (Si), or an alloy material or compound including any of these elements as a main component is added.

For example, when a conductive film formed of a heat-resistant conductive material is stacked over a low-resistant conductive film, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable.

Alternatively, a transparent conductive film may be used, and as a material of the transparent conductive film, indium oxide-tin oxide alloy ($In_2O_3$—$SnO_2$, abbreviated as ITO), indium tin oxide containing silicon or silicon oxide, indium zinc oxide, zinc oxide, zinc oxide to which aluminum is added (AZO), zinc oxide to which gallium is added (GZO) or the like can be used.

As an insulating film which can be used as the gate insulating film 102, a silicon oxide film, a silicon nitride film, a silicon oxynitride film, a silicon nitride oxide film, an aluminum oxide film, an aluminum nitride film, a magnesium oxide film, an yttrium oxide film, a hafnium oxide film, or a tantalum oxide film can be given. A single layer or a stacked layer including any of these may be used.

Note that in this specification, the term "oxynitride" refers to a substance that contains more oxygen atoms than nitrogen atoms and the term "nitride oxide" refers to a substance that contains more nitrogen atoms than oxygen atoms. For example, a "silicon oxynitride film" means a film that contains more oxygen atoms than nitrogen atoms, and oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively, when they are measured by RBS (Rutherford Backscattering Spectrometry) and HFS (Hydrogen Forward Scattering). Further, a "silicon nitride oxide film" means a film that contains more nitrogen atoms than oxygen atoms, and oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively, when they are measured by RBS and HFS. Note that percentages of nitrogen, oxygen, silicon, and hydrogen fall within the ranges given above, where the total number of atoms contained in the silicon oxynitride or the silicon nitride oxide is defined as 100 at. %.

The gate insulating film may have either a single layer or stacked layers of two or three layers. For example, by forming the gate insulating film in contact with the substrate, using a silicon nitride film or a silicon nitride oxide film, adhesion between the substrate and the gate insulating film is increased, and in the case where a glass substrate is used as the substrate, an impurity can be prevented from diffusing into the semiconductor layer from the substrate and further, the gate electrode layer can be prevented from being oxidized. That is to say, film peeling can be prevented, and thus electric characteristics of a transistor which is completed later can be improved.

A lower conductive film to be the first and second electrode layers 114a and 114b may be formed using a metal or a semiconductor, but a conductive film having electrical conductivity which is equal to or lower than that of the first and second wiring layers 115a and 115b and is equal to or higher than that of the semiconductor layer 113 is used. Specifically, the first and second electrode layers 114a and 114b are formed using a conductive film having electrical conductivity within the range of from $1\times10^4$ S/cm to $1\times10^2$ S/cm inclusive, preferably, $1\times10^{-3}$ S/cm to $1\times10^1$ S/cm inclusive. Further, the lower conductive film can be formed with a single layer or a stacked layer.

Note that there is a case where an element included in the first and second electrode layers 114a and 114b and an element included in the semiconductor layer 113 formed thereover mutually diffuse to form a mixed layer or a case where an element contained in a deposition atmosphere for the semiconductor layer 113 is reacted with a surface of the first and second electrode layers 114a and 114b to form a film. In such a case, it is preferable that a combination of materials of the conductive film and the semiconductor layer 113 be selected so that the mixed layer or the film has a conductive property.

For example, in the case of using an oxide semiconductor for the semiconductor layer 113 as in this embodiment, molybdenum (Mo), titanium (Ti), tungsten (W), or the like is preferably used as a metal material forming the first and second electrode layers 114a and 114b because an oxide film having a conductive property is generated at an interface.

As a semiconductor material forming the first and second electrode layers 114a and 114b, indium oxide-tin oxide alloy, indium tin oxide containing silicon or silicon oxide, indium zinc oxide, zinc oxide, zinc oxide to which aluminum is added (AZO), zinc oxide to which gallium is added (GZO) or the like can be used.

Alternatively, the first and second electrode layers 114a and 114b can be formed using a semiconductor material which can be used for the semiconductor layer 113 including a channel formation region if the carrier concentration of the semiconductor material is increased. For example, an In—Ga—Zn—O-based oxide semiconductor film which has n-type conductivity and a carrier concentration within the range of from $1\times10^{16}/cm^3$ to $1\times10^{18}/cm^3$ inclusive can be formed by adjusting the oxygen concentration in the deposition gas.

In addition, each thickness of the first electrode layer 114a and the second electrode layer 114b is preferably from 5 nm to 200 nm inclusive, more preferably equal to or less than half the thickness of the semiconductor layer 113. As the thicknesses of the first electrode layer 114a and the second electrode layer 114b are smaller, a step existing over the gate insulating film is smaller. Thus, the semiconductor layer easily covers the step. As a result, the semiconductor layer including a channel formation region can be formed, without a structure such as a space, which hinders carrier movement, in the semiconductor layer in contact with the step portion. On the other hand, when the first and second electrode layers 114a and 114b are too thin, processing is difficult and electric resistance is high, and thus the electrode layer cannot serve as an electrode.

Further, the first and second electrode layers 114a and 114b are preferably formed to have an end portion in a curved surface shape (where a bottom of the end portion is in contact with the base (here, the gate insulating film 102), and the side face thereof is formed into an arc of a quarter circle or an arc of an inverted quarter circle), a wedge-like shape (tapered shape), or an S-like shape. This is because the step generated over the base is smaller, which is preferable.

FIG. 1C is a cross-sectional view in which the portion where the first electrode layer 114a and the second electrode layer 114b are in contact with the semiconductor layer 113 is enlarged. Each of the length v1 and the length v2 is preferably from 0.2 μm to 5 μm. Here, as illustrated in FIG. 1C, the length v1 indicates a length between the end portion of the first wiring layer 115a, which is in contact with the first electrode layer 114a, and the end portion of the first electrode layer 114a, which is positioned to overlap with the gate electrode layer 111 and be in contact with the base; the length v2 indicates a length between the end portion of the second wiring layer 115b, which is in contact with the second electrode layer 114b, and the end portion of the second electrode layer 114, which is positioned to overlap with the gate electrode layer 111 and be in contact with the base.

If the lengths (v1 and v2) of the first electrode layer 114a and the second electrode layer 114b extending more inwardly than the end portion of the first wiring layer 115a and the end portion of the second wiring layer 115b are too small, it becomes difficult to obtain preferable electrical connection between the semiconductor layer 113 and the side and top faces of the first electrode layer 114a and preferable electrical connection between the semiconductor layer 113 and the side and top faces of the second electrode layer 114b. In addition, if the lengths v1 and v2 are too small, the electric fields concentrating in the end portions of the first or second electrode layers 114a and 114b and the electric field concentrating on the end portions of the gate electrode layer 111 overlap with each other, whereby the electric fields are increased. In such a case, an effect of reducing concentration of the electric field by provision of v1 or v2 is minimized Moreover, if v1 and v2 are too large, in addition to increase in the size of the transistor, a defect of decrease in drain current flowing during an on state of the transistor is caused by electric resistance of the first and second electrode layers 114a and 114b.

The channel length L of the transistor 141 in which the first and second electrode layers 114a and 114b serve as the source and drain electrode layers corresponds to the interval between the first electrode layer 114a and the second electrode layer 114b.

The first wiring layer 115a and the second wiring layer 115b can be formed with a single layer or a stacked layer of a plurality of layers, using a material similar to that of the gate electrode layer 111. In particular, a wiring layer containing aluminum as its main component is preferable because it has low electric resistance, is easy to process, and is inexpensive. Further, each thickness of the first wiring layer 115a and the second wiring layer 115b is preferably from 5 nm to 1000 nm As the thickness of the wiring layer is larger, the wiring resistance is lowered, but if the thickness is too large, it takes long to deposit a film serving as the wiring layer, and stress is increased, which causes film peeling.

Examples of a semiconductor used in this specification include a semiconductor including a Group 14 element typified by Si or Ge; a compound semiconductor such as GaAs, InP, ZnSe, CdS, or CuAlOS; a nitride semiconductor such as GaN, AlN, or InN; and an oxide semiconductor such as ZnO or $CuAlO_2$. Further, the semiconductor may have an amorphous, microcrystalline, polycrystalline, or single crystal structure. The semiconductor layer 113 can include any of these semiconductors.

In this embodiment, an oxide semiconductor is used for the semiconductor layer 113. As an oxide semiconductor which forms the semiconductor layer 113, it is preferable to use an oxide semiconductor whose composition formula is represented by $InMO_3(ZnO)_m$ (m>0). In particular, it is preferable to use an In—Ga—Zn—O-based oxide semiconductor. Note that M denotes one or more metal elements selected from gallium (Ga), iron (Fe), nickel (Ni), manganese (Mn), and cobalt (Co). For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M. In this specification, among the oxide semiconductors whose composition formulas are represented by $InMO_3 (ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

By X-ray diffraction (XRD) spectrometry, an amorphous structure is observed in the In—Ga—Zn—O based non-single-crystal film. In addition, the In—Ga—Zn—O-based non-single-crystal film is formed by a sputtering method and then subjected to heat treatment at 200° C. to 500° C., typically 300° C. to 400° C. for 10 minutes to 100 minutes.

However, the oxide semiconductor which forms the semiconductor layer 113 is not limited to the oxide semiconductor whose composition formula is represented by $InMO_3(ZnO)_m$ (m>0). For example, an oxide semiconductor made of indium oxide ($InO_x$), zinc oxide ($ZnO_x$), tin oxide (SnO), indium zinc oxide (IZO), indium tin oxide (ITO), indium tin oxide containing silicon oxide (ITSO), indium zinc oxide containing silicon oxide (IZO containing $SiO_x$), zinc oxide containing silicon oxide (ZSO), zinc oxide containing silicon oxide and tin oxide (TSZO), zinc oxide doped with gallium (GZO), or the like may be used.

The thickness of the semiconductor layer 113 including an oxide semiconductor is from 5 nm to 200 nm, preferably from 20 nm to 60 nm.

The range of the carrier concentration of the semiconductor layer 113 including an oxide semiconductor is preferably lower than $1 \times 10^{17}/cm^3$ (more preferably, $1 \times 10^{11}/cm^3$ or higher). When the carrier concentration of the semiconductor layer 113 including an oxide semiconductor exceeds the above range, the transistor has a risk of being normally on.

As the oxide semiconductor applied to the semiconductor layer 113, any of the following oxide semiconductors can be applied in addition to the above: an In—Sn—Zn—O-based oxide semiconductor; a Sn—Ga—Zn—O-based oxide semiconductor; an In—Zn—O-based oxide semiconductor; a Sn—Zn—O-based oxide semiconductor; a Ga—Zn—O-based oxide semiconductor; an In—O-based oxide semiconductor; a Sn—O-based oxide semiconductor; and a Zn—O-based oxide semiconductor. In other words, when an insulating impurity is included in such an oxide semiconductor, crystallization of the semiconductor layer 113 is suppressed and thus characteristics of the transistor can be stabilized.

An insulating impurity may be added to the semiconductor layer 113 including an oxide semiconductor. As the impurity, insulating oxide typified by silicon oxide, germanium oxide, or the like; insulating nitride typified by silicon nitride or the like; or insulating oxynitride such as silicon oxynitride or the like can be applied.

The insulating oxide or the insulating nitride is added to the oxide semiconductor at a concentration at which electrical conductivity of the oxide semiconductor does not deteriorate.

Addition of an insulating impurity to the semiconductor layer 113 including an oxide semiconductor can suppress crystallization of the semiconductor layer 113 including an oxide semiconductor. By the suppression of the crystallization of the semiconductor layer 113 including an oxide semiconductor, characteristics of the transistor can be stabilized.

In addition, by addition of an impurity such as silicon oxide to the In—Ga—Zn—O-based oxide semiconductor, crystallization of the oxide semiconductor or generation of microcrystal grains can be prevented even if heat treatment is performed at 300° C. to 600° C.

In a manufacturing process of the transistor in which an In—Ga—Zn—O-based oxide semiconductor is used for a channel formation region, a subthreshold swing value (an S value) or field effect mobility can be improved by heat treatment. Moreover, even in such a state, when the In—Ga—Zn—O-based oxide semiconductor is made to contain the impurity such as silicon oxide, the transistor can be prevented from being normally on. Further, even if heat stress or bias stress is applied to the transistor, a shift of threshold voltage can be prevented.

With the above-described structure, the end portions of the first wiring layer and the second wiring layer having high electrical conductivity do not overlap with the gate electrode layer, whereby concentration of an electric field in the vicinity of the first electrode layer and the second electrode layer is reduced. Thus, a transistor in which generation of hot carriers is suppressed can be provided. In addition, a transistor in which hot-carrier degradation, that is, reduction in the on current (drain current flowing during an on state of a semiconductor element) over time is hardly caused can be provided.

Moreover, when the end portions of the first wiring layer and the second wiring layer are provided above the end portions of the gate electrode layer, a transistor in which the drain current flowing during an on state of the transistor is hardly reduced can be provided.

Note that the structure described in this embodiment can be combined with any structure exemplified in the other embodiments as appropriate.

(Embodiment 2)

In this embodiment, a method for manufacturing the transistor 141 of FIGS. 1A to 1C will be described with reference to FIGS. 2A to 2C and FIGS. 3A to 3C. Specifically, a manufacturing process of a pixel portion of a display device including the transistor will be described.

The substrate 100 is a substrate similar to the substrate in Embodiment 1, and the material of the conductive film used for the gate electrode layer 111 described in Embodiment 1 is deposited entirely over the substrate 100 by a sputtering method or a vacuum evaporation method. Next, a first photolithography step is performed. A resist mask is formed, and unnecessary portions are removed by etching to form a gate wiring including the gate electrode layer 111, a capacitor wiring 123, and a first terminal 118. At this time, etching is preferably performed so that at least an end portion of the gate electrode layer 111 has a taper shape, for the sake of prevention of disconnection due to a step.

Then, the gate insulating film 102 is entirely formed over the gate electrode layer 111. The gate insulating film 102 is formed to a thickness of 50 nm to 250 nm by a CVD method, a sputtering method, or the like.

For example, as the gate insulating film 102, a silicon oxide film is formed to a thickness of 100 nm by a CVD method or a sputtering method. Needless to say, the gate insulating film 102 is not limited to the silicon oxide film, and can be formed with a single layer or a stacked layer of various materials described in Embodiment 1.

Alternatively, as the gate insulating film 102, a silicon oxide layer can be formed by a CVD method using an organosilane gas. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Next, a second photolithography step is performed. A resist mask is formed, and an unnecessary portion is removed by etching to form a contact hole reaching the wiring or electrode layer which is formed from the same material as the gate electrode layer 111. The contact hole is provided for direct connection with a conductive film to be formed later. For example, a contact hole is formed when a transistor whose gate electrode layer is in direct contact with the source or drain electrode layer in the driver circuit portion is formed, or when a terminal that is electrically connected to a gate wiring of a terminal portion is formed.

Next, a lower conductive film to be the first electrode layer 114a and the second electrode layer 114b is formed over the gate insulating film 102. The lower conductive film is formed using a conductive film whose conductivity is equal to or lower than those of the first wiring layer 115a and the second wiring layer 115b and is equal to or higher than that of the semiconductor layer 113, as described in Embodiment 1. Note that the lower conductive film can be formed by a sputtering method or a vacuum evaporation method.

In this embodiment, the lower conductive film is formed using an In—Ga—Zn—O-based oxide semiconductor film having n-type conductivity. Since the carrier concentration of the In—Ga—Zn—O-based oxide semiconductor film can be controlled by deposition conditions, a semiconductor film having n-type conductivity can be formed under such a condition that the carrier concentration is increased, which can be used as a lower conductive film. Note that the case where an In—Ga—Zn—O-based oxide semiconductor film is used for the semiconductor layer 113 including a channel formation region is described later.

The In—Ga—Zn—O-based oxide semiconductor film having n-type conductivity is formed by a sputtering method in an atmosphere of a rare gas such as an argon gas and an oxygen gas. In this case, deposition is performed under the condition where the flow rate of a rare gas such as an argon gas is higher than that of an oxygen gas or deposition is performed in an atmosphere of only a rare gas such as an argon gas without using an oxygen gas. By such deposition, the lower conductive film whose conductivity is equal to or higher than that of the semiconductor layer 113 and is equal to or lower than those of the first wiring layer 115a and the second wiring layer 115b can be formed.

As an example of specific conditions of sputtering deposition, an oxide semiconductor target containing In, Ga, and Zn ($In_2O_3$:$Ga_2O_3$:ZnO=1:1:1) of 8 inches in diameter is used, a distance between the substrate and the target is set to 170 mm, the pressure is set at 0.4 Pa, the direct (DC) current power source is 0.5 kW, a flow rate ratio of a film formation gas is Ar:$O_2$=50:1 (sccm), and the deposition temperature is set at room temperature.

The In—Ga—Zn—O-based oxide semiconductor film having n-type conductivity has electrical conductivity within the range of from $1 \times 10^4$ S/cm to $1 \times 10^2$ S/cm inclusive and also has good electrical connection with the In—Ga—Zn—O-based oxide semiconductor film used for the semiconductor layer 113 described later in this embodiment, which is preferable.

Next, a third photolithography step is performed. A resist mask 133 is formed and the lower conductive film is etched to form the first electrode layer 114a and the second electrode layer 114b. Wet etching or dry etching is employed as an etching method at this time.

For example, in the case of using the In—Ga—Zn—O-based oxide semiconductor film having n-type conductivity for the lower conductive film, an etchant used for formation of the semiconductor layer 113 including a channel formation region, described later, may be used. As an example in such a case, wet etching can be conducted with use of ITO-07N (product of Kanto Chemical Co., Inc.) as an etchant. In addition, wet etching allows the layers to be etched isotropically, so that the end portions of the first and second electrode layers 114a and 114b are positioned more inwardly than those of the resist mask 133. A cross-sectional view at this stage is illustrated in FIG. 2A.

Next, an upper conductive film to be the first wiring layer 115a and the second wiring layer 115b is formed over the entire surface of the substrate, which includes surfaces of the first and second electrode layers 114a and 114b. The upper conductive film to be the first wiring layer 115a and the second wiring layer 115b can be formed using a material similar to the conductive material used for the gate electrode layer 111 described in Embodiment 1. In addition, the upper conductive film can be formed with a single layer or a stacked layer including a plurality of layers. Note that the upper conductive film can be formed by a sputtering method or a vacuum evaporation method.

In this embodiment, a stacked film of a 20-nm-thick titanium film and a 150-nm-thick aluminum film is used as the upper conductive film. Aluminum is a material having low wiring resistance. When the titanium film is stacked, the wiring layer can have heat resistance.

Next, a fourth photolithography step is performed. A resist mask 134 is formed, and the upper conductive film is etched by etching to form the first wiring layer 115a, the second wiring layer 115b, and a second terminal 122. Wet etching or dry etching is employed as an etching method at this time.

For example, when the upper conductive film is formed with a stacked film of a titanium film and an aluminum film, wet etching can be conducted using a hydrogen peroxide solution, heated hydrochloric acid, or a nitric acid solution containing ammonium fluoride as an etchant. Further, the titanium film and the aluminum film are collectively etched with use of KSMF-240 (produced by KANTO CHEMICAL CO., INC.), for example. Alternatively, dry etching can be employed to etch the titanium film and the aluminum film collectively.

The first electrode layer 114a and the second electrode layer 114b formed through the above steps serve as a source electrode layer and a drain electrode of the transistor, and the first wiring layer 115a and the second wiring layer 115b serve as a source wiring and a drain wiring. A cross-sectional view at this stage is illustrated in FIG. 2B.

Note that in this embodiment, end portions of the first and second electrode layers 114a and 114b, which overlap with an opening portion of the gate electrode layer 111, are covered with the first and second wiring layers 115a and 115b. However, such end portions of the first and second electrode layers 114a and 114b may be projected more outwardly than end portions of the first and second wiring layers 115a and 115b.

In addition, in this fourth photolithography step, the second terminal 122 is left in a terminal portion. Note that the second terminal 122 is formed using a part of the source wiring and is electrically connected to a signal line.

In addition, in the terminal portion, a connection electrode 120 is directly connected to the first terminal 118 of the terminal portion through a contact hole formed in the gate insulating film. Note that although not illustrated here, a source wiring or a drain wiring, and a gate electrode of a transistor in a driver circuit are directly connected through an opening in the gate insulating film through the same steps as the above-described steps.

Note that before an oxide semiconductor film 103 including a channel formation region described later is formed, reverse sputtering by which plasma is generated by introduction of an argon gas in a chamber where the substrate 100 is provided is preferably performed, whereby dust attached to a surface of the gate insulating film is removed. By the reverse sputtering, planarity of the surface of the gate insulating film 102 can be improved. The reverse sputtering refers to a method in which, without application of a voltage to a target side, an RF power source is used for application of a voltage to a substrate side for formation of plasma in an argon atmosphere to modify a surface. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used. After the reverse sputtering, the oxide semiconductor film 103 is formed without being exposed to air, whereby dust or moisture can be prevented from attaching to an interface between the oxide semiconductor film 103 and the gate insulating film 102.

Next, the oxide semiconductor film 103 which is to be the semiconductor layer 113 is formed by a sputtering method without the surface being exposed to air, in an atmosphere of a rare gas such as an argon gas and an oxygen gas. As the oxide semiconductor film 103, any of the oxide semiconductors described in Embodiment 1 can be used, and it is preferable to use an In—Ga—Zn—O-based oxide semiconductor.

Specifically, the oxide semiconductor film 103 is formed by a sputtering method under conditions where an oxide semiconductor target containing In, Ga, and Zn ($In_2O_3$:$Ga_2O_3$:$ZnO$=1:1:1) of 8 inches in diameter is used, the distance between the substrate and the target is 170 mm, a pressure is 0.4 Pa, a direct-current (DC) power source is 0.5 kW, a flow rate ratio of a film formation gas is $Ar:O_2$=10:5 (sccm), and the deposition temperature is room temperature. As the target, $Ga_2O_3$ and $ZnO$ in a pellet state may be disposed on a disk of 8 inches in diameter which contains $In_2O_3$. Note that a pulse direct current (DC) power supply is preferable because dust can be reduced and the film thickness can be uniform. The thickness of the In—Ga—Zn—O-based non-single-crystal film is from 5 nm to 200 nm, preferably from 20 nm to 60 nm A cross-sectional view at this stage is illustrated in FIG. 2C.

In the case where an In—Ga—Zn—O-based non-single-crystal film is formed by a sputtering method, an oxide semiconductor target containing In, Ga, and Zn may include an insulating impurity. The impurity may be insulating oxide typified by silicon oxide, germanium oxide, or the like; insulating nitride typified by silicon nitride, or the like; insulating oxynitride such as silicon oxynitride; or the like. For example, $SiO_2$ is preferably mixed into the oxide semiconductor target at from 0.1 wt % to 30 wt % inclusive.

By addition of the insulating impurity to the oxide semiconductor, an oxide semiconductor film to be deposited can be made amorphous easily. In addition, in the case where the oxide semiconductor film 103 is subjected to heat treatment, crystallization of the oxide semiconductor film 103 can be suppressed.

As well as the In—Ga—Zn—O-based oxide semiconductor, a similar effect can be obtained by addition of an insulating impurity to the following oxide semiconductors: an In—Sn—Zn—O-based oxide semiconductor, an Sn—Ga—Zn—O-based oxide semiconductor, an In—Zn—O-based oxide semiconductor, an Sn—Zn—O-based oxide semiconductor, a Ga—Zn—O-based oxide semiconductor, an In—O-based oxide semiconductor, an Sn—O-based oxide semiconductor, and a Zn—O-based oxide semiconductor.

For example, in the case where a film of an In—Sn—Zn—O-based oxide semiconductor to which silicon oxide is added is formed by a sputtering method, a target in which $In_2O_3$, $SnO_2$, $ZnO$, and $SiO_2$ are sintered at a predetermined ratio is used as a target thereof. In the case of the In—Zn—O-based oxide semiconductor to which silicon oxide is added, a film is formed using a target in which $In_2O_3$, $ZnO$, and $SiO_2$ are sintered at predetermined ratio. Further, in the case of a film of an Sn—Zn—O-based oxide semiconductor to which silicon oxide is added is formed by a sputtering method, a target in which $SnO_2$ and ZnO are mixed at predetermined ratio and $SiO_2$ is added at from 1 wt % to 30 wt %, with respect to the total of $SnO_2$ and ZnO and sintered is used.

A chamber used for formation of the In—Ga—Zn—O-based non-single-crystal film may be the same as or different from the chamber in which the reverse sputtering has been performed.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are also a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a fifth photolithography step is performed. A resist mask 135 is formed, and the In—Ga—Zn—O-based non-single-crystal film is etched. In etching of the In—Ga—Zn—O-based non-single-crystal film, organic acid such as citric acid or oxalic acid can be used for etchant. In this embodiment, an unnecessary portion of the In—Ga—Zn—O-based non-single-crystal film is removed by wet etching with use of ITO-07N (manufactured by Kanto Chemical Co., Inc.) to process the In—Ga—Zn—O-based non-single-crystal film into an island-like shape, so that the semiconductor layer 113 which is the In—Ga—Zn—O-based non-single-crystal film is formed. The end portion of the semiconductor layer 113 is etched into a tapered shape, whereby disconnection of a wiring due to a step shape can be prevented.

Note that the etching here is not limited to wet etching, and dry etching may be employed. As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. As a dry etching apparatus by which uniform electric discharge can be obtained over a wider area as compared to an ICP etching apparatus, there is an ECCP (enhanced capacitively coupled plasma) mode apparatus in which an upper electrode is grounded, a high-frequency power source at 13.56 MHz is connected to a lower electrode, and further a low-frequency power source at 3.2 MHz is connected to the lower electrode. This ECCP mode etching apparatus can be applied even when, as the substrate, a substrate, the size of which exceeds 3 m of the tenth generation, is used, for example.

Through the above process, the transistor 141 in which the semiconductor layer 113 including an oxide semiconductor is used for a channel formation region can be manufactured. A cross-sectional view at this stage is illustrated in FIG. 3A.

After the resist mask 135 is removed, heat treatment at 200° C. to 600° C., typically 250° C. to 500° C., is preferably performed. In this embodiment, heat treatment is performed under a nitrogen atmosphere in a furnace at 350° C. for an hour. Through this heat treatment, rearrangement at the atomic level occurs in the In—Ga—Zn—O-based non-single-crystal film. Since strain energy which inhibits carrier movement is released by the heat treatment, the heat treatment (including optical annealing) is important. Note that there is no particular limitation on the timing of heat treatment as long as it is performed after formation of the In—Ga—Zn—O-based non-single-crystal film, and, for example, heat treatment may be performed after formation of a pixel electrode.

Further, the rear surface of the channel formation region of the semiconductor layer 113 including an oxide semiconductor, so-called back channel, may be subjected to oxygen radical treatment. By the oxygen radical treatment, the transistor can serve as a normally-off transistor. In addition, the radical treatment can repair damages of an exposed surface of the semiconductor layer 113 including an oxide semiconductor. The radical treatment is preferably performed in an atmosphere of $O_2$ or $N_2O$, and more preferably an atmosphere of $N_2$, He, or Ar each containing oxygen. The radical treatment may also be performed in an atmosphere in which $Cl_2$ and/or $CF_4$ are/is added to the above atmosphere. Note that the radical treatment is preferably performed with no bias applied.

Next, a protective insulating layer 109 is formed so as to cover the transistor 141. The protective insulating layer 109 can be formed of a silicon nitride film, a silicon oxide film, a silicon oxynitride film, an aluminum oxide film, a tantalum oxide film or the like formed by a sputtering method.

Then, a sixth photolithography step is performed. A resist mask is formed, and the protective insulating layer 109 is etched to form a contact hole 125 that reaches the second wiring layer 115b. In addition, by etching at this time, a contact hole 124 that reaches the second terminal 122 and a contact hole 126 that reaches the connection electrode 120 are also formed. A cross-sectional view after the resist mask is removed is illustrated in FIG. 3B.

Then, a transparent conductive film is formed. The transparent conductive film is formed using indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—ZnO) may be used to improve etching processability.

Next, a seventh photolithography step is performed. A resist mask is formed, and unnecessary portions are removed by etching, whereby a pixel electrode layer 128 is formed.

Further, in this seventh photolithography step, the capacitor wiring 123 and the pixel electrode layer 128 together form a storage capacitor with use of the gate insulating film 102 and the protective insulating layer 109 as dielectrics.

In addition, in this seventh photolithography step, the first terminal and the second terminal are covered with the resist mask, and transparent conductive films 127 and 129 are left in the terminal portion. The transparent conductive films 127 and 129 function as electrodes or wirings to be connected to an FPC. The transparent conductive film 129 formed over the connection electrode 120 that is directly connected to the first terminal 118 serves as a terminal electrode for connection which functions as an input terminal for the gate wiring. The transparent conductive film 127 formed over the second terminal 122 serves as a terminal electrode for connection which functions as an input terminal for the source wiring.

After that, the resist mask is removed. A cross-sectional view at this stage is illustrated in FIG. 3C.

Further, FIGS. 4A1 and 4A2 are a cross-sectional view and a plan view of a gate wiring terminal portion at this stage, respectively. FIG. 4A1 is the cross-sectional view taken along the line C1-C2 of FIG. 4A2 In FIG. 4A1, a transparent conductive film 155 formed over a protective insulating film 154 is a terminal electrode for connection which functions as an input terminal. Furthermore, in FIG. 4A1, in the terminal portion, a first terminal 151 formed from the same material as the gate wiring and a connection electrode 153 formed from the same material as the source wiring are in direct contact with each other to be electrically connected and overlapped through an opening portion provided in a gate insulating film 152 therebetween. In addition, the connection electrode 153 and the transparent conductive film 155 are in direct contact with each other through a contact hole provided in the protective insulating film 154 so as to be electrically connected.

Further, FIGS. 4B1 and 4B2 are a cross-sectional view and a plan view of a source wiring terminal portion, respectively. FIG. 4B 1 is the cross-sectional view taken along line D1-D2 of FIG. 4B2. In FIG. 4B1, the transparent conductive film 155 formed over the protective insulating film 154 is used for a terminal electrode for connection which serves as an input terminal. Furthermore, in FIG. 4B1, in the terminal portion, an electrode 156 formed from the same material as the gate wiring is located below and overlapped with a second terminal 150, which is electrically connected to the source wiring, with the gate insulating film 152 interposed therebetween. The electrode 156 is not electrically connected to the second terminal 150, and a capacitor to prevent noise or static electricity can be formed if the potential of the electrode 156 is set to a potential different from that of the second terminal 150, such as floating, GND, or 0 V. The second terminal 150 is electrically connected to the transparent conductive film 155 with the protective insulating film 154 therebetween.

A plurality of gate wirings, source wirings, and capacitor wirings are provided depending on the pixel density. Also in the terminal portion, a plurality of first terminals at the same potential as gate wirings, second terminals at the same potential as source wirings, third terminals at the same potential as capacitor wirings, and the like are arranged. The number of each of the terminals may be any number, and the number of the terminals may be determined by a practitioner as appropriate.

Through these seven photolithography steps, a pixel portion including the transistor 141 that is a bottom-gate n-channel transistor and a storage capacitor can be completed with use of seven photomasks. By arranging the transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 5:
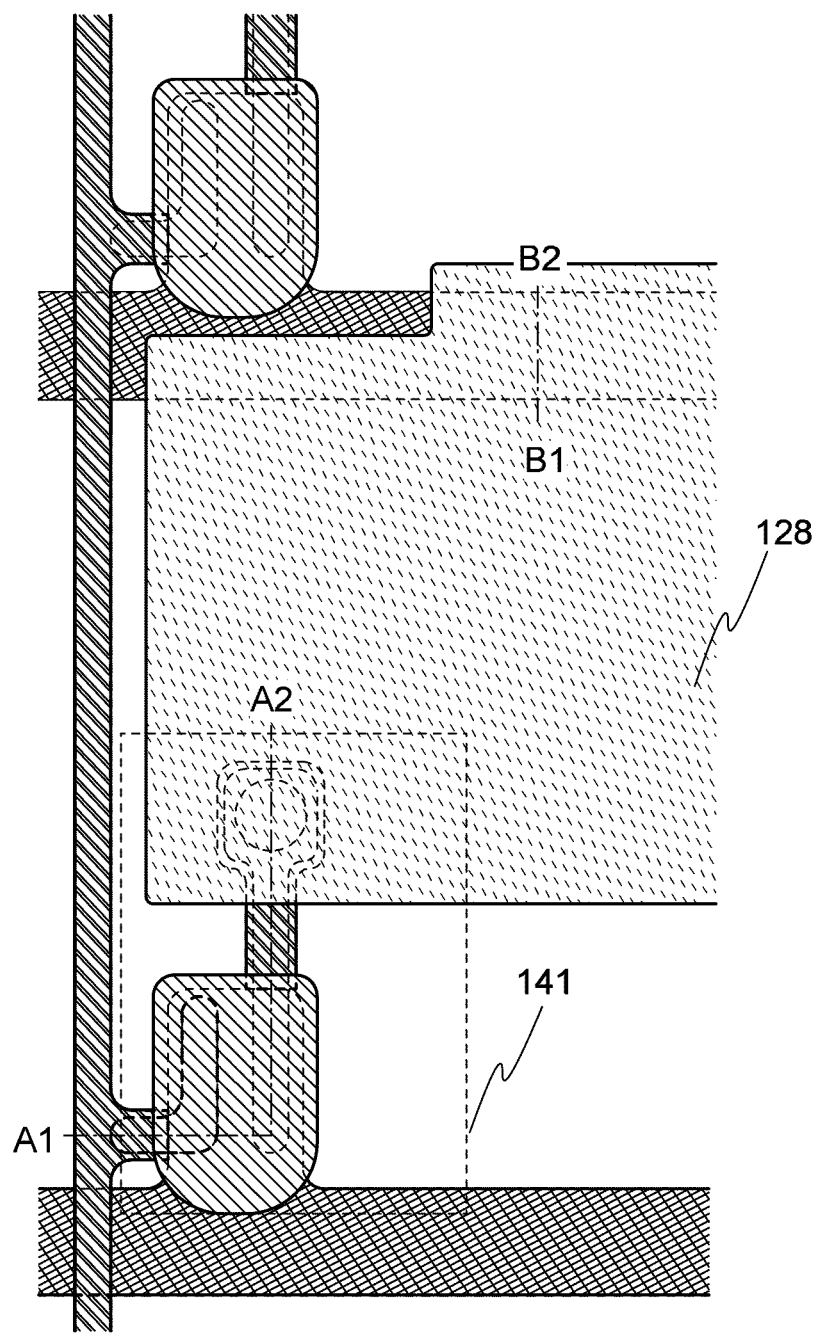
FIG. 5 illustrates a semiconductor device according to one embodiment of the present invention.

Further, this embodiment is not limited to a pixel structure in FIG. 1A, and an example of a plan view different from FIG. 1A is illustrated in FIG. 5. FIG. 5 illustrates an example in which a capacitor wiring is not provided and a storage capacitor is formed with a pixel electrode and a gate wiring of an adjacent pixel, which are overlapped with each other, with a protective insulating film and a gate insulating film interposed therebetween. In this case, the capacitor wiring and the third terminal connected to the capacitor wiring can be omitted. Note that in FIG. 5, portions similar to those in FIG. 1A are denoted by the same reference numerals.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion may be employed in which black is displayed on the whole screen every other frame period.

Alternatively, a driving method called double-frame rate driving may be employed in which a vertical synchronizing frequency is 1.5 times or more, preferably, 2 times or more as high as usual vertical synchronizing frequency to improve the moving-image characteristics.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

With the above-described structure, end portions of the first wiring layer and the second wiring layer having high electrical conductivity do not overlap with the gate electrode, whereby concentration of an electric field in the vicinity of the first electrode layer and the second electrode layer is reduced.

Thus, a transistor in which generation of hot carriers is suppressed can be provided. In addition, a transistor in which hot-carrier degradation, that is, reduction in the on current (drain current flowing during an on state of a semiconductor element) over time is hardly caused can be provided. In addition, since the contact area between the first and second electrode layers and the semiconductor layer including a channel formation region is sufficiently large, a transistor has less variation in characteristics as well as lower contact resistance; thus, reliability of the transistor can be improved.

Moreover, the transistor obtained in this embodiment can have excellent dynamic characteristics. By using the transistor for a pixel portion and a driver circuit portion of a liquid crystal display device or a light-emitting display device in combination with driving techniques thereof, a highly reliable display device having excellent electric characteristics can be provided.

Note that the structure described in this embodiment can be combined with any structure exemplified in the other embodiments as appropriate.

(Embodiment 3)

In the case of Embodiment 2, two masks are used in total in the third photolithography step through which the first electrode layer and the second electrode layer are formed and the fourth photolithography step through which the first wiring layer and the second wiring layer are formed. On the other hand, this embodiment exemplifies the case of using a resist mask having regions with plural thicknesses (typically, two different thicknesses) which is formed using a multi-tone (high-tone) mask. With use of such a resist mask, the number of necessary resist masks can be reduced, resulting in simplified process and lower costs.

Figure 6A:
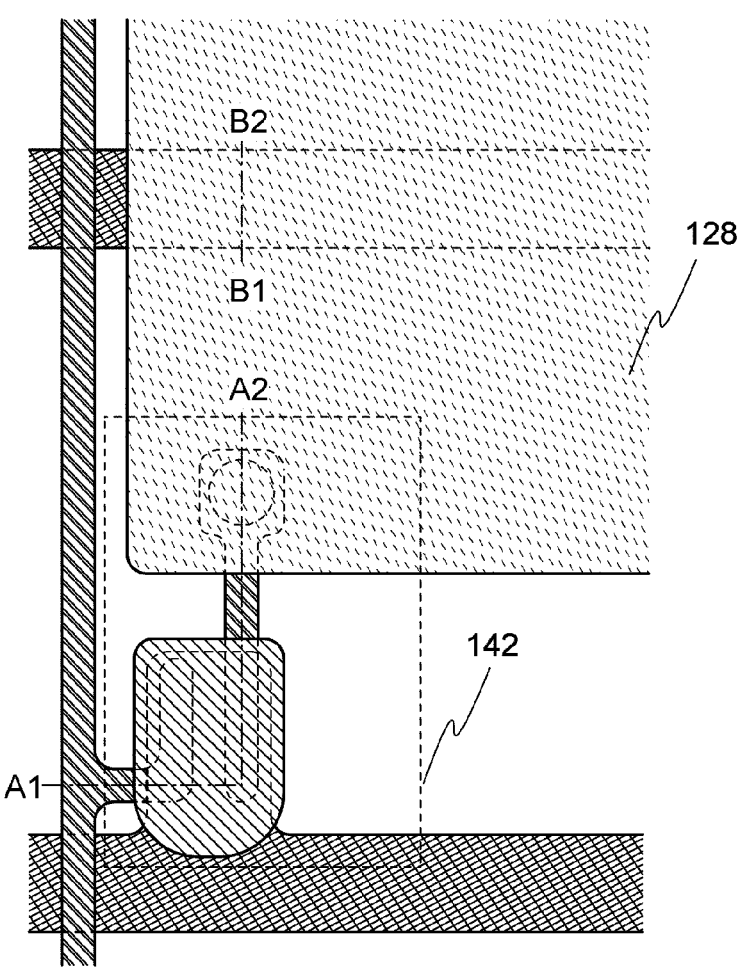
FIGS. 6A to 6C illustrate a semiconductor device according to one embodiment of the present invention.
Figure 6B:
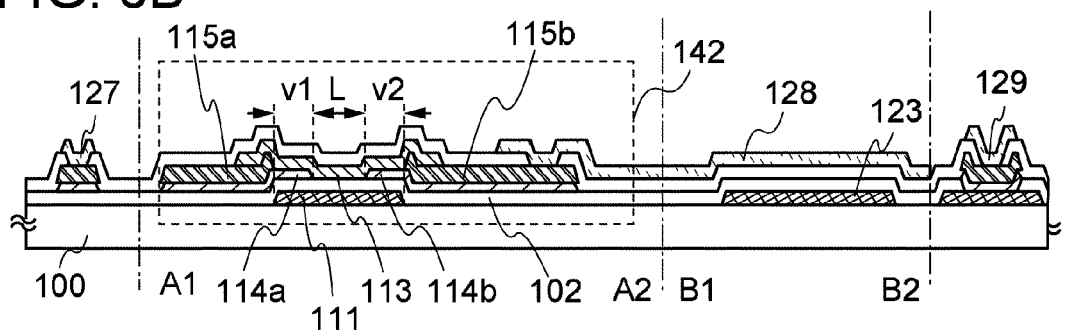
Figure 6C:
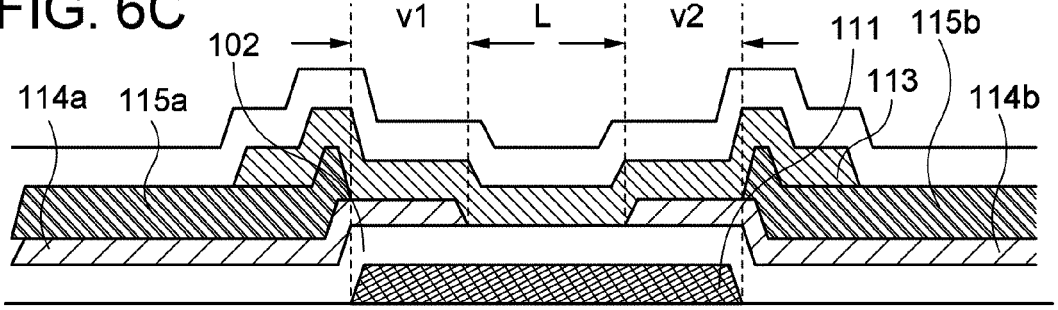

FIGS. 6A to 6C illustrate a transistor having a bottom gate structure of this embodiment. FIG. 6A is a plan view, and FIG. 6B is a cross-sectional view taken along line A1-A2 and line B1-B2 of FIG. 6A. FIG. 6C is a cross-sectional view in which a portion in a transistor 142 of FIG. 6B where a first electrode layer 114a is extended more inwardly than a first wiring layer 115a and a second electrode layer 114b is extended more inwardly than a second wiring layer 115b is enlarged.

In the transistor 142 illustrated in FIGS. 6A to 6C, a gate electrode layer 111 is formed over a substrate 100, a gate insulating film 102 is formed over the gate electrode layer 111, and the first electrode layer 114a and the second electrode layer 114b serving as a source electrode layer and a drain electrode layer are formed over the gate insulating film 102 in such a way that end portions of the first electrode layer 114a and the second electrode layer 114b overlap with the gate electrode layer 111. In addition, the first wiring layer 115a and the second wiring layer 115b are formed over the first electrode layer 114a and the second electrode layer 114b, respectively to be electrically connected to each other. Moreover, a semiconductor layer 113 is formed in a region overlapping with the gate electrode layer 111.

The first wiring layer 115a and the second wiring layer 115b each overlap with an opening portion of the gate electrode layer 111. An end portion of the first wiring layer 115a is located above one of end portions of the gate electrode layer 111 with the gate insulating film 102 and the first electrode layer 114a therebetween, and an end portion of the second wiring layer 115b is located above the other end portion of the gate electrode layer 111 with the gate insulating film 102 and the second electrode layer 114b therebetween. The first electrode layer 114a is extended so as to have the end portion positioned more inwardly than the end portion of the first wiring layer 115a and overlap with the gate electrode layer 111, and the second electrode layer 114b is extended so as to have the end portion positioned more inwardly than the end portion of the second wiring layer 115b and overlap with the gate electrode layer 111.

Note that the semiconductor layer 113 is provided so as to be in contact with side and top faces of the first electrode layer 114a and side and top faces of the second electrode layer 114b, and at least part of the semiconductor layer 113 is provided so as to be in contact with the gate insulating film 102.

Further, in the transistor 142 illustrated in FIGS. 6A to 6C, the first electrode layer 114a, the second electrode layer 114b, the first wiring layer 115a, and the second wiring layer 115b can be formed using any of the materials described in Embodiment 1.

In this embodiment, a method for manufacturing the transistor 142 in FIGS. 6A to 6C by a photolithography step using a multi-tone mask is described with reference to FIGS. 7A to 7C and FIGS. 8A to 8C. Specifically, a manufacturing process of a pixel portion of a display device including a transistor is described.

A first photolithography step is performed in a manner similar to that described in Embodiment 2, so that a gate wiring including the gate electrode layer 111, a capacitor wiring 123, and a first terminal 118 are formed over the substrate 100. Next, a second photolithography step is performed to form a contact hole that reaches an electrode layer or a wiring layer formed from the same material as the gate electrode layer 111.

Then, in a manner similar to that described in Embodiment 2, a lower conductive film to be the first and second electrode layers 114a and 114b is entirely formed over the gate insulating film 102, and an upper conductive film to be the first and second wiring layers 115a and 115b is entirely formed over the lower conductive film.

Next, a third photolithography step is performed with use of a multi-tone (high-tone) mask with which transmitted light has a plurality of intensities. As illustrated in FIG. 7A, a resist mask 133a having regions with a plurality of different thicknesses is formed over the upper conductive film. The resist mask 133a has a small-thickness region in a region that overlaps with part of the gate electrode layer 111. Then, the upper conductive film and the lower conductive film are etched with use of the resist mask 133a to be processed into island-like shapes, so that a source wiring including the first or second wiring layer 115a or 115b and the first or second electrode layer 114a or 114b is formed. A cross-sectional view at this stage is illustrated in FIG. 7A.

Next, the resist mask 133a is subjected to ashing to form the resist mask 133b. As illustrated in FIG. 7B, the area and the thickness of the resist mask 133b are reduced and the resist in the small-thickness region is removed by ashing.

Then, with use of the resist mask 133b with reduced area, outer edge portions of the first and second wiring layers 115a and 115b are etched, and portions of the first and second wiring layers 115a and 115b which overlap with the gate electrode layer 111 are removed. As a result, the first electrode layer 114a whose end portion is positioned more inwardly than the end portion of the first wiring layer 115a to overlap with the gate electrode layer 111, and the second electrode layer 114b whose end portion is positioned more inwardly than the end portion of the second wiring layer 115b to overlap with the gate electrode layer 111 are formed. In addition, outer edge portions of the first electrode layer 114a and the second electrode layer 114b are positioned more outwardly than the outer edge portions of the first wiring layer 115a and the second wiring layer 115b, respectively, due to reduction in the size of the resist mask 133a to the size of the resist mask 133b. A cross-sectional view at this stage is illustrated in FIG. 7B.

After that, the resist mask is removed, and reverse sputtering is performed as in Embodiment 2. Then, an oxide semiconductor film 103 is formed. A cross-sectional view at this stage is illustrated in FIG. 7C.

Next, a fourth photolithography step is performed. A resist mask 134 is formed, and the oxide semiconductor film 103 is etched in a manner similar to that described in Embodiment 2, so that the semiconductor layer 113 which is an In—Ga—Zn—O-based non-single crystal film is formed. Note that the portions of the first and second electrode layers 114a and 114b projected more outwardly than the outer edges of the first and second wiring layers 115a and 115b can be removed using the first and second wiring layers 115a and 115b as a mask.

Through the above steps, the transistor 142 in which the semiconductor layer 113 including an oxide semiconductor is used for a channel formation region can be formed. A cross-sectional view at this stage is illustrated in FIG. 8A.

Next, a protective insulating layer 109 is formed so as to cover the transistor 142. A fifth photolithography step is performed to form a resist mask, so that a contact hole 124, a contact hole 125, and a contact hole 126 are formed. A cross-sectional view after the resist mask is removed is illustrated in FIG. 8B.

Then, a transparent conductive film is formed in a manner similar to Embodiment 2, and a sixth photolithography step is performed with use of a resist mask, so that a pixel electrode layer 128, a storage capacitor, an input terminal of the source wiring, and an input terminal of the gate wiring are formed. A cross-sectional view after the resist mask is removed is illustrated in FIG. 8C.

As described above, with use of a resist mask having regions with plural thicknesses (typically, two different thicknesses) which is formed using a multi-tone (high-tone) mask, the number of resist masks can be reduced. As a result, a manufacturing process of a transistor which is an embodiment of the present invention can be simplified, and cost can be reduced.

Further, the end portions of the first wiring layer and the second wiring layer having high electrical conductivity do not overlap with the gate electrode, whereby concentration of an electric field in the vicinity of the first electrode layer and the second electrode layer is reduced. Thus, a transistor in which generation of hot carriers is suppressed can be provided. In addition, a transistor in which hot-carrier degradation, that is, reduction in the on current (drain current flowing during an on state of a semiconductor element) over time is hardly caused can be provided. In addition, since the contact area between the first and second electrode layers and the semiconductor layer including a channel formation region is sufficiently large, a transistor has less variation in characteristics as well as lower contact resistance; thus, reliability of the transistor can be improved.

Moreover, the transistor obtained in this embodiment can have excellent dynamic characteristics. By using the transistor for a pixel portion and a driver circuit portion of a liquid crystal display device or a light-emitting display device in combination with driving techniques thereof, a highly reliable display device having excellent electric characteristics can be provided.

Note that the structure described in this embodiment can be combined with any structure exemplified in the other embodiments as appropriate.

(Embodiment 4)

Electrical characteristics of a transistor which is an embodiment of the present invention were calculated.

Electric field intensity in the horizontal direction, and $I_d$-$V_g$ characteristics of the transistor can be estimated from calculation results obtained by using a calculator. Here, the electric field intensity in the horizontal direction indicates the intensity of an electric field generated in the vicinity of an interface between a gate insulating film and a semiconductor layer and an interface between the gate insulating film and first and second electrode layers. Calculation models and calculation conditions are described below.

Calculation was performed with use of a simulator "Atlas" produced by Silvaco Data Systems Inc., and the calculation models are transistors 144a to 144e whose cross-sectional structures are illustrated in FIGS. 26A1 and 26A2, 26B1 and 26B2, and 26C1 and 26C2 and FIGS. 27A1 and 27A2 and 27B1 and 27B2. Note that FIGS. 26A2, 26B2, and 26C2 and FIGS. 27A2 and 27B2 are enlarged views illustrating the vicinity of a second electrode layer 114b, of FIGS. 26A1, 26B1, and 26C1 and FIGS. 27A1 and 27B1, respectively. A gate insulating film 102 over a gate electrode layer 111 (with a work function of 4.6 eV) is an oxynitride silicon layer (with a thickness of 100 nm and a relative dielectric constant of 4.1). A semiconductor layer 113 including a channel formation region is an In—Ga—Zn—O-based oxide semiconductor layer (with a thickness of 50 nm and an electron affinity of 4.3 eV). A first electrode layer 114a and the second electrode layer 114b are In—Ga—Zn—O-based oxide semiconductor layers (with a thickness of 10 nm and an electron affinity of 4.3 eV). A first wiring layer 115a and a second wiring layer 115b are formed using titanium (Ti) (with a work function of 4.3 eV). In the semiconductor layer 113 including a channel formation region, a channel length (L) and a channel width (W) in the channel direction are 4 μm and 100 μm, respectively, and the electron mobility of an electron and the mobility of a hole are 15 $cm^2$/Vs and 0.1 $cm^2$/Vs, respectively.

FIGS. 28A to 28C and FIGS. 29A and 29B show calculation results of $I_d$-$V_g$ characteristics which show transmission of the current flowing between the drain and source ($I_{ds}$ [A]) with respect to the voltage between the gate and source ($V_{gs}$ [V]) in the transistors 144a to 144e in the case where the carrier concentration of the first and second electrode layers 114a and 114b in each transistor is 1×10$^{16}$/cm$^3$, 1×10$^{17}$/cm$^3$, and 1×10$^{18}$/cm$^3$. Note that the voltage between the drain and source ($V_{ds}$) was set to 10 V.

FIGS. 30A to 30C and FIGS. 31A and 31B show calculation results of electric field intensity in the horizontal direction, generated in an interface of the gate insulating film 102 in contact with the semiconductor layer 113 or the second electrode layer 114b in the transistors 144a to 144e. Note that the electric field intensity was calculated under such conditions that the carrier concentration of the first and second electrode layers 114a and 114b was 1×10$^{18}$/cm$^3$, the voltage between the gate and source ($V_{gs}$) was set to 2 V, and the voltage between the drain and source ($V_{ds}$) was set to 10 V.

A cross-sectional view of the transistor 144a which is an embodiment of the present invention is illustrated in FIG. 26A1. In the transistor 144a which is an embodiment of the present invention, the first wiring layer 115a and the second wiring layer 115b are provided in an opening portion of the gate electrode layer 111, and end portions of the first wiring layer 115a and the second wiring layer 115b are located above end portions of the gate electrode layer 111. The length of a region where the gate electrode layer 111 and an end portion of the first electrode layer 114a overlap with each other and the length of a region where the gate electrode layer 111 and an end portion of the second electrode layer 114b overlap with each other are each 3 μm. The gate electrode layer 111 and the first wiring layer 115a do not overlap with each other, and the gate electrode layer 111 and the second wiring layer 115b do not overlap with each other.

Figure 28A:
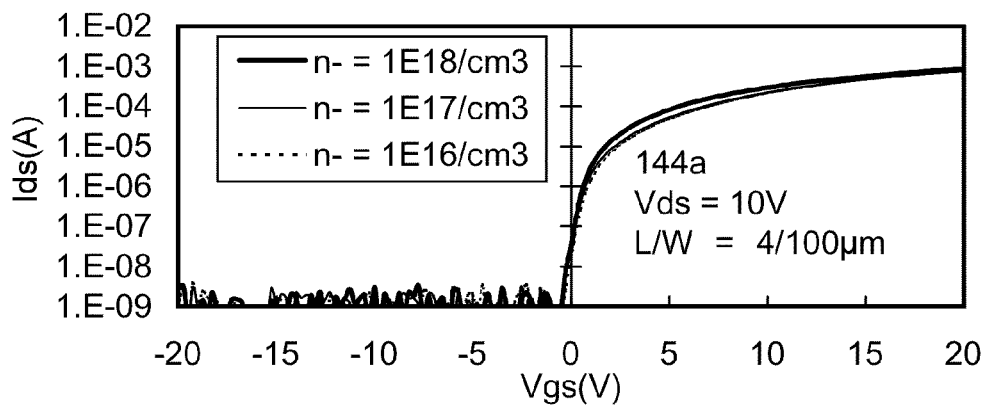
FIGS. 28A to 28C are graphs showing electrical characteristics of semiconductor devices according to one embodiment of the present invention.
Figure 30A:
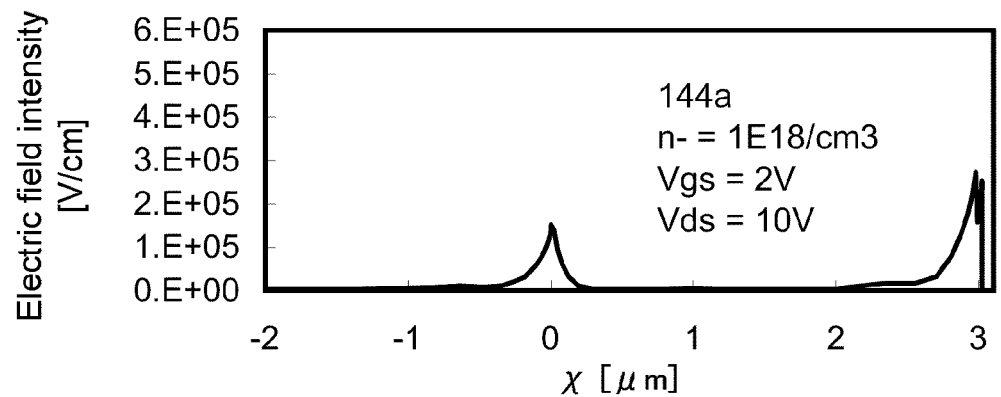
FIGS. 30A to 30C are graphs showing calculation results of semiconductor devices according to one embodiment of the present invention.

A cross-sectional view of a portion of FIG. 26A1 in which the vicinity of the second wiring layer 115b is enlarged is illustrated in FIG. 26A2. A position in an interface of the gate insulating film 102 in contact with the semiconductor layer 113 or the second electrode layer 114b is represented by a coordinate of an axis represented as χ. FIG. 30A shows a calculation result of electric field intensity in Position χ, and FIG. 28A shows a calculation result of $I_d$-$V_g$ characteristics in the transistor 144a.

FIG. 30A shows that there are two maximum points of electric field intensity in the horizontal direction, in an interface of the gate insulating film 102 of the transistor 144a, which are separately generated over the end portion of the second electrode layer 114b and the end portion of the gate electrode layer 111. Electric field concentration is generated in two portions, whereby generation of hot carriers is suppressed. In addition, favorable on current can be observed in terms of the $I_d$-$V_g$ characteristics shown in FIG. 28A.

A cross-sectional view of the transistor 144b which is an embodiment of the present invention is illustrated in FIG. 26B1. In the transistor 144b which is an embodiment of the present invention, the length of a region where the gate electrode layer 111 and the end portion of the first electrode layer 114a overlap with each other and the length of a region where the gate electrode layer 111 and the end portion of the second electrode layer 114b overlap with each other are 3 μm, which is the same length as those of the transistor 144a. Further, the first wiring layer 115a and the second wiring layer 115b are arranged in such a way that there are a space of 1 μm between one of the end portions of the gate electrode layer 111 and an end portion of the first wiring layer 115a and a space of 1 μm between the other end portion of the gate electrode layer 111 and an end portion of the second wiring layer 115b, when seen in the direction vertical to the substrate.

Figure 28B:
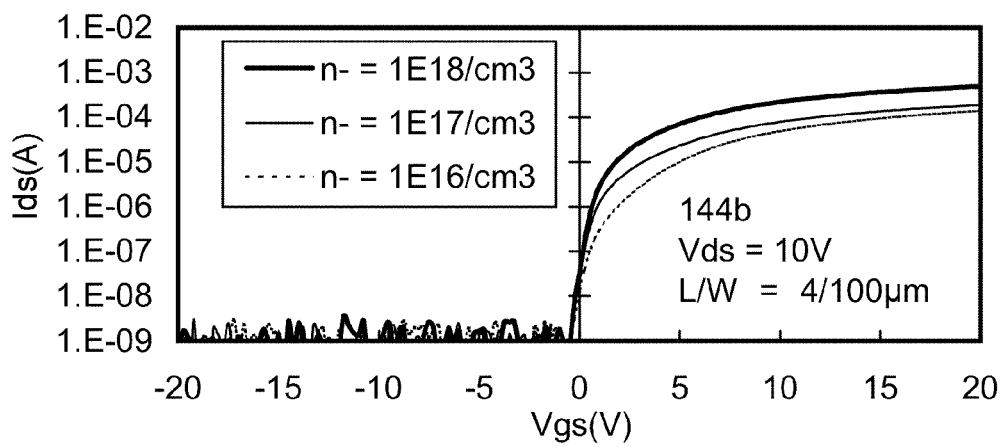
Figure 30B:
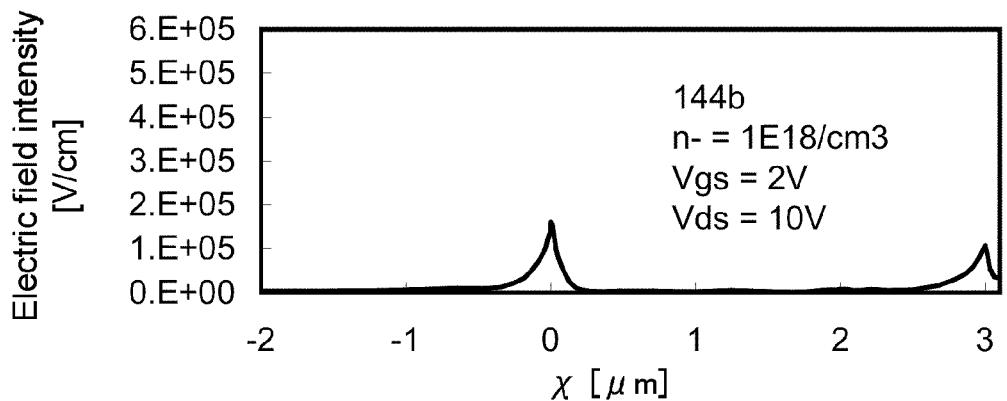

A cross-sectional view of a portion of FIG. 26B1 in which the vicinity of the second wiring layer 115b is enlarged is illustrated in FIG. 26B2. A position in an interface of the gate insulating film 102 in contact with the semiconductor layer 113 or the second electrode layer 114b is represented by a coordinate of an axis represented as χ. FIG. 30B shows a calculation result of electric field intensity in Position χ, and FIG. 28B shows a calculation result of $I_d$-$V_g$ characteristics in the transistor 144b.

FIG. 30B shows that there are two maximum points of electric field intensity in the horizontal direction, in an interface of the gate insulating film 102 of the transistor 144b, which are separately generated over the end portion of the second electrode layer 114b and the end portion of the gate electrode layer 111. Electric field concentration is generated in two portions, whereby generation of hot carriers is suppressed. Further, the on current of $I_d$-$V_g$ characteristics shown in FIG. 28B changes with decrease of the carrier concentration of the first electrode layer 114a and the second electrode layer 114b. A region of the first electrode layer 114a, with which neither the gate electrode layer 111 nor the first wiring layer 115a overlaps, and a region of the second electrode layer 114b, with which neither the gate electrode layer 111 nor the second wiring layer 115b overlaps, serve as series resistors, which increase dielectric strength voltage of the transistor.

A cross-sectional view of the transistor 144c which is an embodiment of the present invention is illustrated in FIG. 26C1. In the transistor 144c which is an embodiment of the present invention, the length of a region where the gate electrode layer 111 and the end portion of the first electrode layer 114a overlap with each other and the length of a region where the gate electrode layer 111 and the end portion of the second electrode layer 114b overlap with each other are each 3 μm, which is the same length as those of the transistor 144a. Further, the first wiring layer 115a and the second wiring layer 115b are arranged in such a way that there are a space of 3 μm between one of the end portions of the gate electrode layer 111 and an end portion of the first wiring layer 115a and a space of 3 μm between the other end portion of the gate electrode layer 111 and an end portion of the second wiring layer 115b, when seen in the direction vertical to the substrate.

Figure 28C:
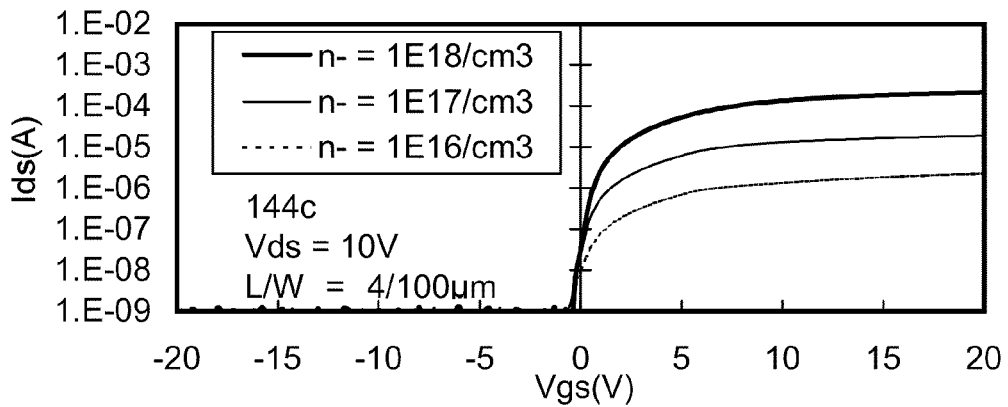
Figure 30C:
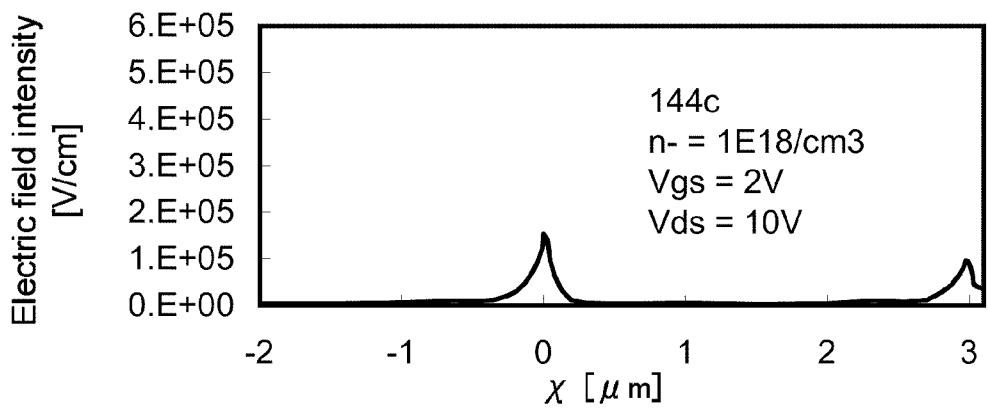

A cross-sectional view of a portion of FIG. 26C1 in which the vicinity of the second wiring layer 115b is enlarged is illustrated in FIG. 26C2. A position in an interface of the gate insulating film 102 in contact with the semiconductor layer 113 or the second electrode layer 114b is represented by a coordinate of an axis represented as χ. FIG. 30C shows a calculation result of electric field intensity in Position χ, and FIG. 28C shows a calculation result of $I_d$-$V_g$ characteristics in the transistor 144c.

FIG. 30C shows that there are two maximum points of electric field intensity in the horizontal direction, in an interface of the gate insulating film 102 of the transistor 144c, which is separately generated over the end portion of the second electrode layer 114b and the end portion of the gate electrode layer 111. Electric field concentration is generated in two portions, whereby generation of hot carriers is suppressed. Further, the on current of $I_d$-$V_g$ characteristics shown in FIG. 28C changes with decrease in the carrier concentration of the first electrode layer 114a and the second electrode layer 114b. A region of the first electrode layer 114a, with which neither the gate electrode layer 111 nor the first wiring layer 115a overlaps, and a region of the second electrode layer 114b, with which neither the gate electrode layer 111 nor the second wiring layer 115b overlaps, serve as series resistors, which increase dielectric strength voltage of the transistor.

A cross-sectional view of the transistor 144d is illustrated in FIG. 27A1. In the transistor 144d, the length of a region where the gate electrode layer 111 and the end portion of the first electrode layer 114a overlap with each other and the length of a region where the gate electrode layer 111 and the end portion of the second electrode layer 114b overlap with each other are each 3 μm, which is the same length as those of the transistor 144a. Further, the first wiring layer 115a and the second wiring layer 115b are arranged to overlap with the gate electrode layer 111. The length of the region where the gate electrode layer 111 and the first wiring layer 115a overlap with each other and the length of the region where the gate electrode layer 111 and the second wiring layer 115b overlap with each other are each 1.5 μm.

Figure 29A:
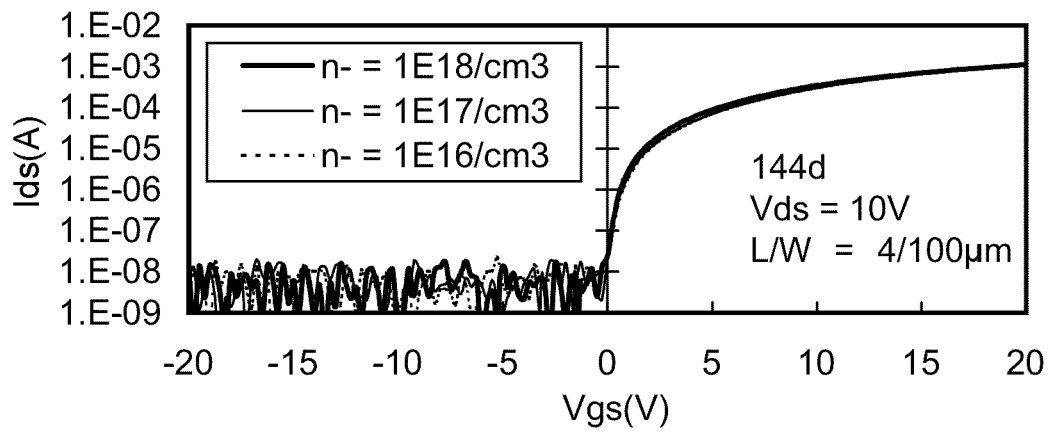
FIGS. 29A and 29B are graphs showing electrical characteristics of semiconductor devices according to one embodiment of the present invention.
Figure 31A:
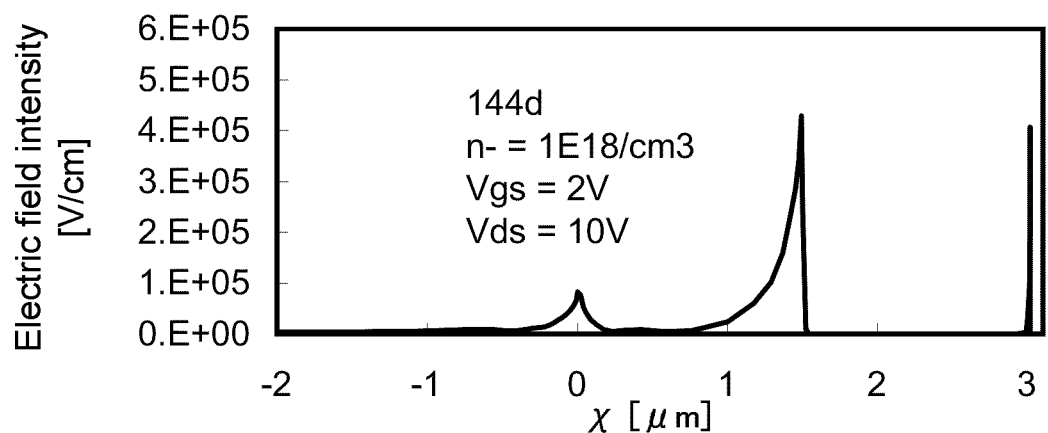
FIGS. 31A and 31B are graphs showing calculation results of semiconductor devices according to one embodiment of the present invention.

A cross-sectional view of a portion of FIG. 27A1 in which the vicinity of the second wiring layer 115b is enlarged is illustrated in FIG. 27A2. A position in an interface of the gate insulating film 102 in contact with the semiconductor layer 113 or the second electrode layer 114b is represented by a coordinate of an axis represented as χ. FIG. 31A shows a calculation result of electric field intensity in Position χ, and FIG. 29A shows a calculation result of $I_d$-$V_g$ characteristics in the transistor 144d.

FIG. 31A shows that there are two maximum points of electric field intensity in the horizontal direction, in an interface of the gate insulating film 102 of the transistor 144d, which are separately generated over the end portion of the second electrode layer 114b and the end portion of the second wiring layer 115b. Although electric field concentration is generated in two portions, the electric field intensity in the vicinity of the end portion of the second wiring layer 115b overlapping with the gate electrode layer 111 is higher than that in the structure of the transistor 144a.

A cross-sectional view of the transistor 144e is illustrated in FIG. 27B1. In the transistor 144e, the length of a region where the gate electrode layer 111 and the end portion of the first electrode layer 114a overlap with each other and the length of a region where the gate electrode layer 111 and the end portion of the second electrode layer 114b overlap with each other are 3 µm, which is the same length as those of the transistor 144a. Further, the length of the region where the gate electrode layer 111 and the first wiring layer 115a overlap with each other and the length of the region where the gate electrode layer 111 and the second wiring layer 115b overlap with each other are each 3 µm. In other words, the end portion of the first wiring layer 115a and the end portion of the first electrode layer 114a are aligned with each other, and the end portion of the second wiring layer 115b and the end portion of the second electrode layer 114b are aligned with each other.

Figure 29B:
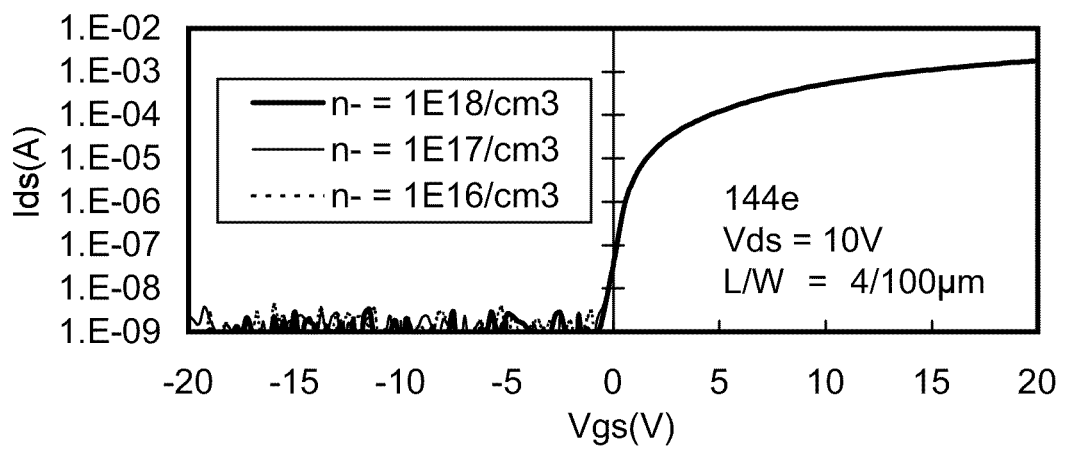
Figure 31B:
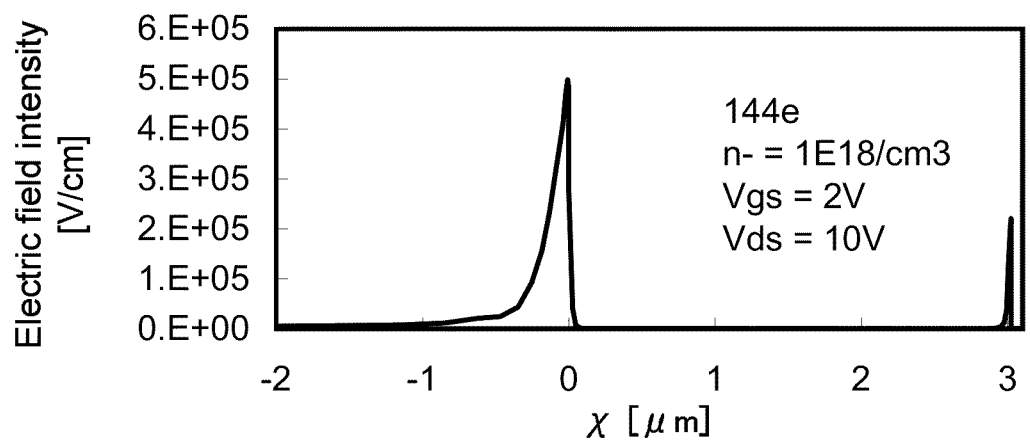

A cross-sectional view of a portion of FIG. 27B1 in which the vicinity of the second wiring layer 115b is enlarged is illustrated in FIG. 27B2. A position in an interface of the gate insulating film 102 in contact with the semiconductor layer 113 or the second electrode layer 114b is represented by a coordinate of an axis represented as χ. FIG. 31B shows a calculation result of electric field intensity in Position χ, and FIG. 29B shows a calculation result of $I_d$-$V_g$ characteristics in the transistor 144e.

FIG. 31B shows that a maximum point of electric field intensity in the horizontal direction, in an interface of the gate insulating film 102 of the transistor 144e, concentrates in one portion of the end portion of the second wiring layer 115b and the end portion of the second electrode layer 114b. At such a portion where the high electric field in the horizontal direction concentrates, carriers are accelerated; accordingly, hot carriers are easily generated.

The above calculation results indicate that in the transistor which is an embodiment of the present invention, in which the end portions of the first and second wiring layers having high electrical conductivity do not overlap with the gate electrode layer, concentration of an electric field in the vicinity of the first electrode layer and the second electrode layer is reduced, and generation of hot carriers is suppressed. Thus, as a transistor which is an embodiment of the present invention, a transistor in which hot-carrier degradation, that is, reduction in the on current (drain current flowing during an on state of a semiconductor element) over time is hardly caused can be provided. In addition, since the contact area between the first and second electrode layers and the semiconductor layer including a channel formation region is sufficiently large, a transistor has less variation as well as lower contact resistance; thus, reliability of the transistor can be improved.

Moreover, the transistor obtained in this embodiment can have excellent dynamic characteristics. By using the transistor for a pixel portion and a driver circuit portion of a liquid crystal display device or a light-emitting display device in combination with driving techniques thereof, a highly reliable display device having excellent electric characteristics can be provided.

Note that the structure described in this embodiment can be combined with any structure exemplified in the other embodiments as appropriate.

(Embodiment 5)

Figure 9A:
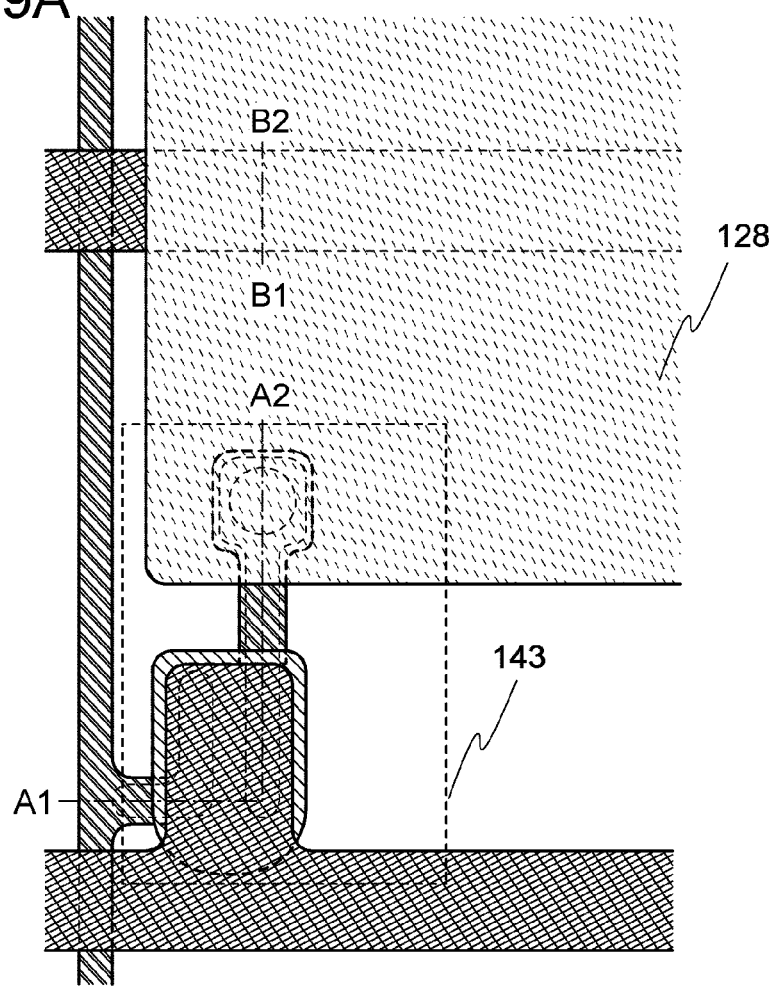
FIGS. 9A and 9B illustrate a semiconductor device according to one embodiment of the present invention.
Figure 9B:
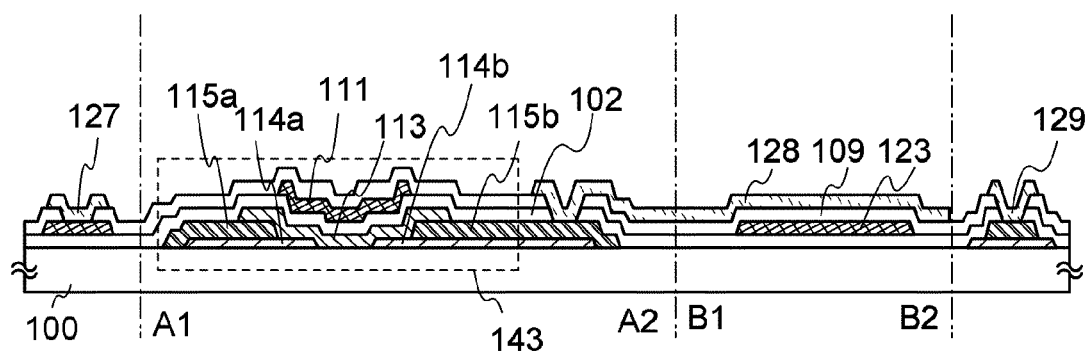

In this embodiment, a transistor of a semiconductor device will be described. Specifically, a pixel portion of a display device including a top gate transistor will be described. FIGS. 9A and 9B illustrate a transistor of this embodiment. FIG. 9A is a plan view and FIG. 9B is a cross-sectional view taken along lines A1-A2 and B1-B2 of FIG. 9A.

In a transistor 143 illustrated in FIGS. 9A and 9B, a first electrode layer 114a and a second electrode layer 114b serving as a source electrode layer and a drain electrode layer are provided over a substrate 100. A first wiring layer 115a and a second wiring layer 115b are provided over the first electrode layer 114a and the second electrode layer 114b, respectively, and a semiconductor layer 113 is provided over the first electrode layer 114a and the second electrode layer 114b. A gate insulating film 102 is provided over the semiconductor layer 113, and a gate electrode layer 111 is provided to overlap with end portions of the first and second electrode layers 114a and 114b with the gate insulating film 102 therebetween. Note that the gate electrode layer 111 is provided in an opening portion of the first and second wiring layers 115a and 115b, and the semiconductor layer 113 is electrically connected to side and top faces of the first electrode layer 114a and side and top faces of the second electrode layer 114b.

The first electrode layer 114a and the second electrode layer 114b are formed using the lower conductive film described in Embodiments 1 to 3 and in a manner similar thereto. In this embodiment, the first electrode layer 114a and the second electrode layer 114b are formed using a 20-nm-thick In—Ga—Zn—O-based oxide semiconductor film having n-type conductivity.

The first wiring layer 115a and the second wiring layer 115b are formed using the upper conductive film described in Embodiments 1 to 3, and in a manner similar thereto. In this embodiment, the first wiring layer 115a and the second wiring layer 115b are formed using a 150-nm-thick aluminum film.

The semiconductor layer 113 is formed using the semiconductor film described in Embodiments 1 to 3, and in a manner similar thereto. In this embodiment, a 50-nm-thick In—Ga—Zn—O-based oxide semiconductor is used.

The gate insulating film 102 formed over the semiconductor layer 113 is formed using any of the materials described in Embodiments 1 to 3, and in a manner similar thereto. The gate electrode layer 111 overlapping with the end portions of the first electrode layer 114a and the second electrode layer 114b with the gate insulating film 102 therebetween is formed using any of the materials described in Embodiments 1 to 3, and in a manner similar thereto.

With the above-described structure, end portions of the first wiring layer and the second wiring layer having high electrical conductivity do not overlap with the gate electrode layer, whereby concentration of an electric field in the vicinity of the first electrode layer and the second electrode layer is reduced. Thus, a transistor in which generation of hot carriers is suppressed can be provided. In addition, a transistor in which hot-carrier degradation, that is, reduction in the on current (drain current flowing during an on state of a semiconductor element) over time is hardly caused can be provided.

Moreover, end portions of the gate electrode layer are located above the end portions of the first wiring layer 115a and the second wiring layer 115b, whereby a transistor in which the drain current flowing in an on state of the transistor is hardly reduced can be provided.

Note that the structure described in this embodiment can be combined with any structure exemplified in the other embodiments as appropriate.

(Embodiment 6)

In this embodiment, an example in which at least part of a driver circuit and a transistor provided in a pixel portion are formed over the same substrate in a display device which is one of semiconductor devices will be described with reference to FIGS. 10A and 10B, FIG. 11, FIG. 12, FIG. 13, FIG. 14, and FIG. 15.

In addition, transistors are each formed by using an In—Ga—Zn—O-based oxide for the semiconductor layer and are formed over the same substrate, in the method similar to the method exemplified in any of the other embodiments. A portion of a driver circuit including n-channel TFTs of driver circuits is formed over the same substrate as the transistors of the pixel portion.

Figure 10A:
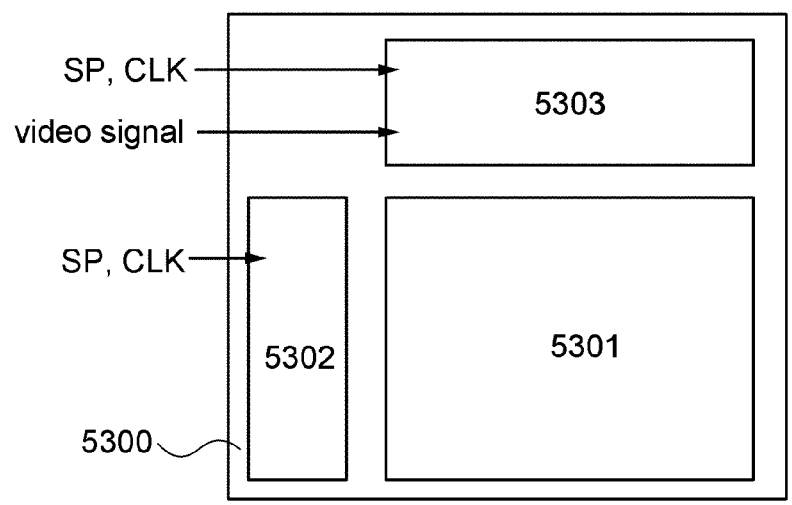
FIGS. 10A and 10B are block diagrams of a semiconductor device.

FIG. 10A is an example of a block diagram of an active matrix liquid crystal display device which is an example of semiconductor devices. The display device illustrated in FIG. 10A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

Figure 11:
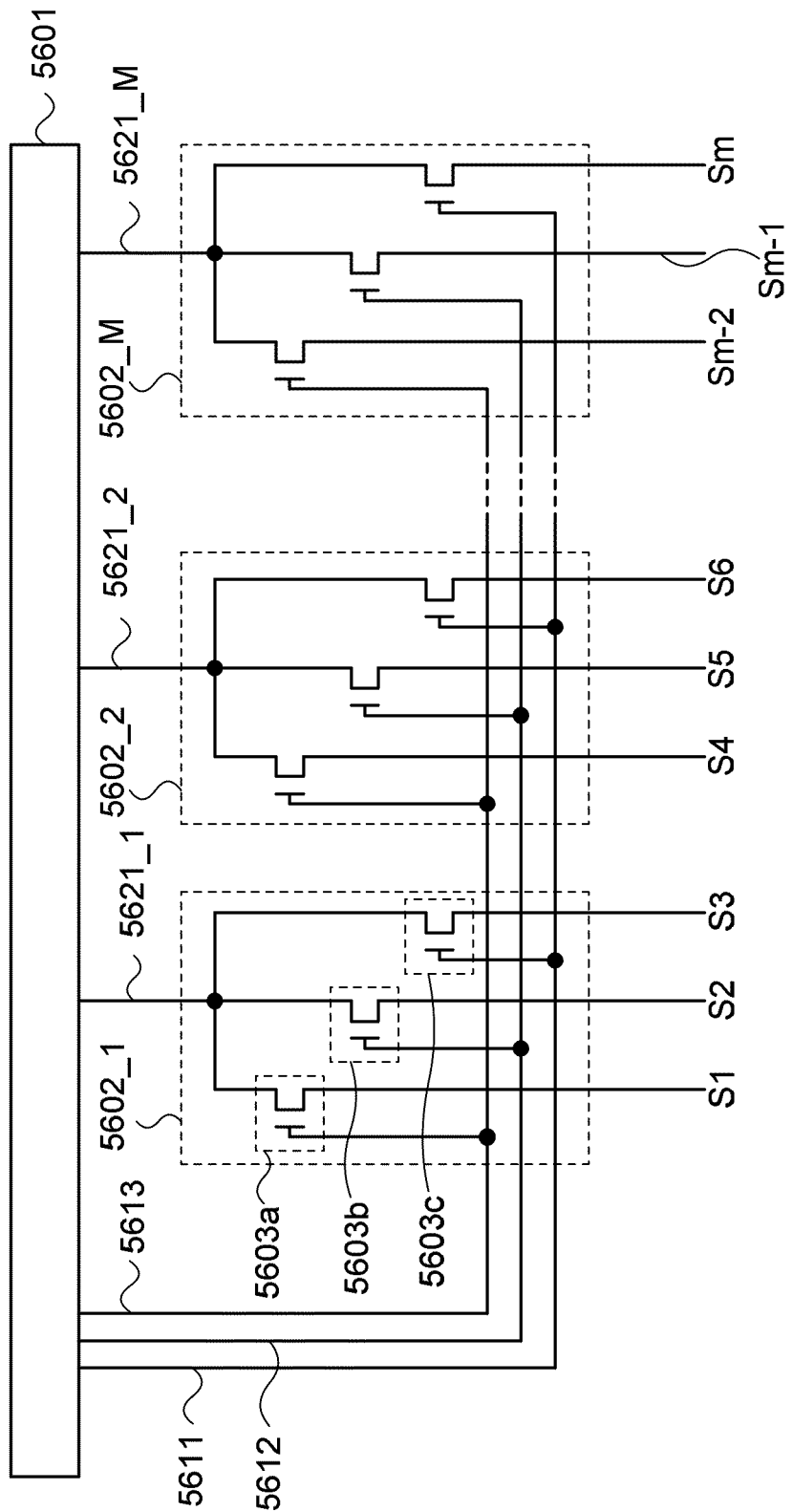
FIG. 11 is a diagram illustrating a structure of a signal line driver circuit.

Referring to FIG. 11, description will be made about a signal-line driver circuit which includes an n-channel TFT described as an example in any of other embodiments.

The signal line driver circuit illustrated in FIG. 11 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first transistor 5603a, a second transistor 5603b, and a third transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the wirings 5621_1 to 5621_M are connected to the switch groups 5602_1 to 5602_M, respectively. Each of the wirings 5621_1 to 5621_M is connected to three signal lines (a signal line Sm-2, a signal line Sm-1, and a signal line Sm (m=3M)) via the first transistor 5603a, the second transistor 5603b, and the third transistor 5603c. For example, the wiring 5621_J of the J-th column (one of the wirings 5621_1 to 5621_M) is connected to a signal line Sj-2, a signal line Sj-1, and a signal line Sj (j=3J) via the first transistor 5603a, the second transistor 5603b, and the third transistor 5603c which are included in the switch group 5602_J.

A signal is input to each of the first wiring 5611, the second wiring 5612, and the third wiring 5613.

Note that the driver IC 5601 is preferably formed using a single crystal semiconductor. Further, the switch groups 5602_1 to 5602_M are preferably formed over the same substrate as the pixel portion is. Therefore, the driver IC 5601 and the switch groups 5602_1 to 5602_M are preferably connected through an FPC or the like. Alternatively, the driver IC 5601 may be formed using a single crystal semiconductor layer which is provided by a method such as bonding over the same substrate as the pixel portion is.

Figure 12:
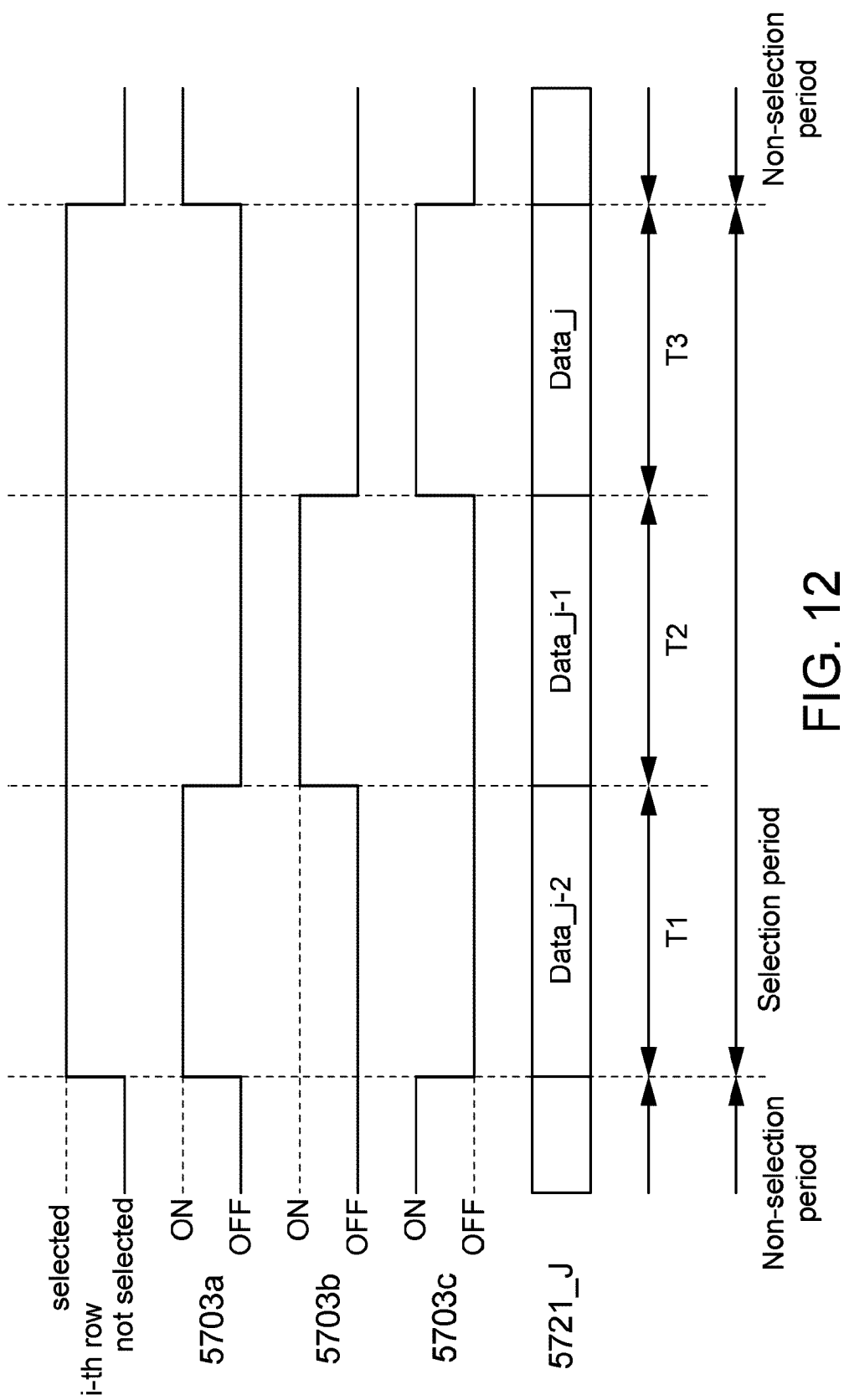
FIG. 12 is a timing chart of operation of a signal line driver circuit.

Next, operation of the signal line driver circuit illustrated in FIG. 11 is described with reference to a timing chart in FIG. 12. The timing chart in FIG. 12 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 11 operates similarly to that in FIG. 12 even when a scan line of another row is selected.

Note that the timing chart in FIG. 12 shows a case where the wiring 5621_J in the J-th column is connected to the signal line Sj-2, the signal line Sj-1, and the signal line Sj via the first transistor 5603a, the second transistor 5603b, and the third transistor 5603c.

The timing chart in FIG. 12 shows timing at which the scan line Gi of the i-th row is selected, timing 5703a of on/off of the first transistor 5603a, timing 5703b of on/off of the second transistor 5603b, timing 5703c of on/off of the third transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj-2, a video signal input to the wiring 5621_J in the second sub-selection period T2 is input to the signal line Sj-1, and a video signal input to the wiring 5621_J in the third sub-selection period T3 is input to the signal line Sj. In addition, the video signals input to the wiring 5621_J in the first sub-selection period T1, the second sub-selection period T2, and the third sub-selection period T3 are denoted by Data_j-2, Data j-1, and Data_j.

As illustrated in FIG. 12, in the first sub-selection period T1, the first transistor 5603a is turned on, and the second transistor 5603b and the third transistor 5603c are turned off. At this time, Data_j-2 input to the wiring 5621_J is input to the signal line Sj-2 via the first transistor 5603a. In the second sub-selection period T2, the second transistor 5603b is turned on, and the first transistor 5603a and the third transistor 5603c are turned off. At this time, Data_j-1 input to the wiring 5621_J is input to the signal line Sj-1 via the second transistor 5603b. In the third sub-selection period T3, the third transistor 5603c is turned on, and the first transistor 5603a and the second transistor 5603b are turned off. At this time, Data_j input to the wiring 5621_J is input to the signal line Sj via the third transistor 5603c.

As described above, in the signal line driver circuit of FIG. 11, by dividing one gate selection period into three, video signals can be input to three signal lines from one wiring 5621 in one gate selection period. Therefore, in the signal line driver circuit of FIG. 11, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit of FIG. 11 can be improved.

Note that there are no particular limitations on the arrangement, the number, a driving method, and the like of the transistors, as long as one gate selection period is divided into a plurality of sub-selection periods and video signals are input to a plurality of signal lines from one wiring in each of the plurality of sub-selection periods as illustrated in FIG. 11.

For example, when video signals are input to three or more signal lines from one wiring in each of three or more sub-selection periods, a transistor and a wiring for controlling the transistor may be added. Note that when one gate selection period is divided into four or more sub-selection periods, one sub-selection period becomes shorter. Therefore, one gate selection period is preferably divided into two or three sub-selection periods.

Figure 13:
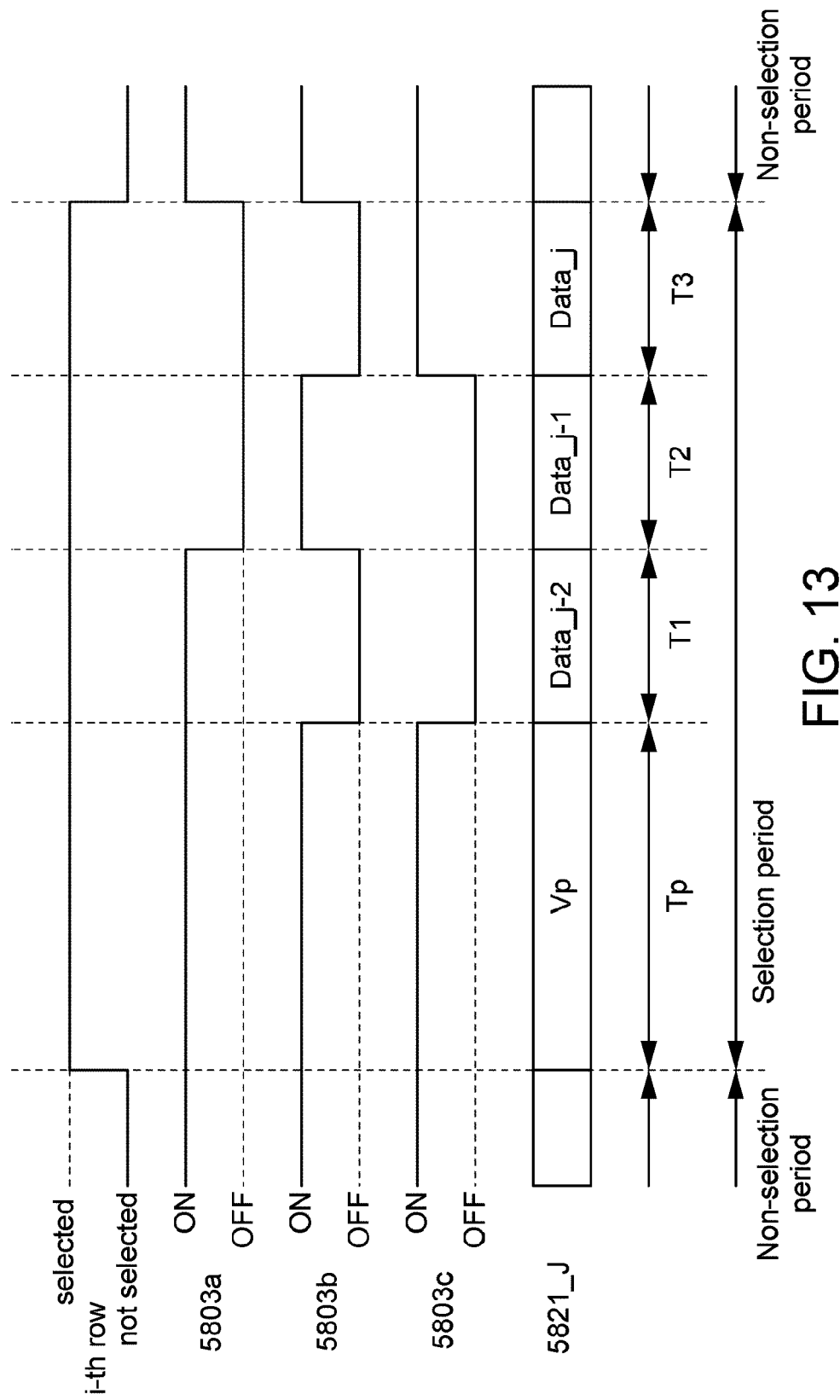
FIG. 13 is a timing chart of operation of a signal line driver circuit.

As another example, one gate selection period may be divided into four periods of a precharge period Tp, the first sub-selection period T1, the second sub-selection period T2, and the third sub-selection period T3 as illustrated in a timing chart in FIG. 13. The timing chart in FIG. 13 shows timing at which the scan line Gi of the i-th row is selected, timing 5803*a* of on/off of the first transistor 5603*a*, timing 5803*b* of on/off of the second transistor 5603*b*, timing 5803*c* of on/off of the third transistor 5603*c*, and a signal 5821_J input to the wiring 5621_J of the J-th column As illustrated in FIG. 13, the first transistor 5603*a*, the second transistor 5603*b*, and the third transistor 5603*c* are turned on in the precharge period Tp. At this time, precharge voltage Vp input to the wiring 5621_J is input to each of the signal line Sj-2, the signal line Sj-1, and the signal line Sj via the first transistor 5603*a*, the second transistor 5603*b*, and the third transistor 5603*c*. In the first sub-selection period T1, the first transistor 5603*a* is turned on, and the second transistor 5603*b* and the third transistor 5603*c* are turned off. At this time, Data_j-2 input to the wiring 5621_J is input to the signal line Sj-2 via the first transistor 5603*a*. In the second sub-selection period T2, the second transistor 5603*b* is turned on, and the first transistor 5603*a* and the third transistor 5603*c* are turned off. At this time, Data_j-1 input to the wiring 5621_J is input to the signal line Sj-1 via the second transistor 5603*b*. In the third sub-selection period T3, the third transistor 5603*c* is turned on, and the first transistor 5603*a* and the second transistor 5603*b* are turned off. At this time, Data_j input to the wiring 5621_J is input to the signal line Sj via the third transistor 5603*c*.

As described above, in the signal line driver circuit in FIG. 13 to which the timing chart in FIG. 13 is applied, the video signal can be written to the pixel at high speed because the signal line can be precharged by providing a precharge period before a sub-selection period. Note that portions in FIG. 13 which are similar to those of FIG. 12 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

One mode of a shift register which is used for a part of a scan line driver circuit is described with reference to FIG. 14 and FIG. 15.

Figure 14:
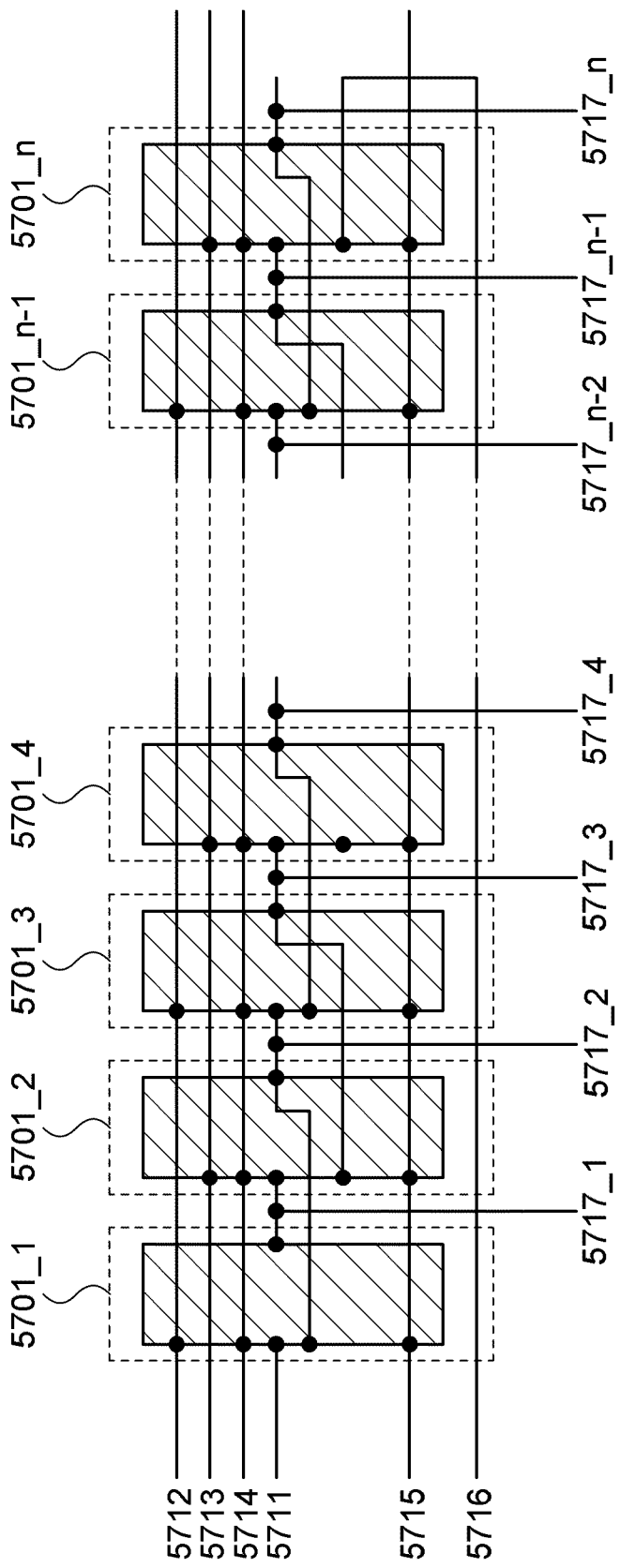
FIG. 14 is a diagram illustrating a structure of a shift register.

FIG. 14 illustrates a circuit configuration of the shift register. The shift register illustrated in FIG. 14 includes a plurality of flip-flops: flip-flops 5701_1 to 5701_n. The shift register is operated with input of a first clock signal, a second clock signal, a start pulse signal, and a reset signal.

Connection relations of the shift register in FIG. 14 are described. The flip-flop 5701_1 of a first stage is connected to a first wiring 5711, a second wiring 5712, a fourth wiring 5714, a fifth wiring 5715, a seventh wiring 5717_1, and a seventh wiring 5717_2. The flip-flop 5701_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, the flip-flop 5701_i (any one of the flip-flops 5701_1 to 5701_n) of an i-th stage is connected to one of the second wiring 5712 and the third wiring 5713, the fourth wiring 5714, the fifth wiring 5715, a seventh wiring 5717_i–1, a seventh wiring 5717_i, and a seventh wiring 5717_i+1. Here, when the "i" is an odd number, the flip-flop 5701_i of the i-th stage is connected to the second wiring 5712; when the "i" is an even number, the flip-flop 5701_i of the i-th stage is connected to the third wiring 5713.

The flip-flop 5701_n of an n-th stage is connected to one of the second wiring 5712 and the third wiring 5713, the fourth wiring 5714, the fifth wiring 5715, a seventh wiring 5717_n-1, the seventh wiring 5717_n, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Figure 15:
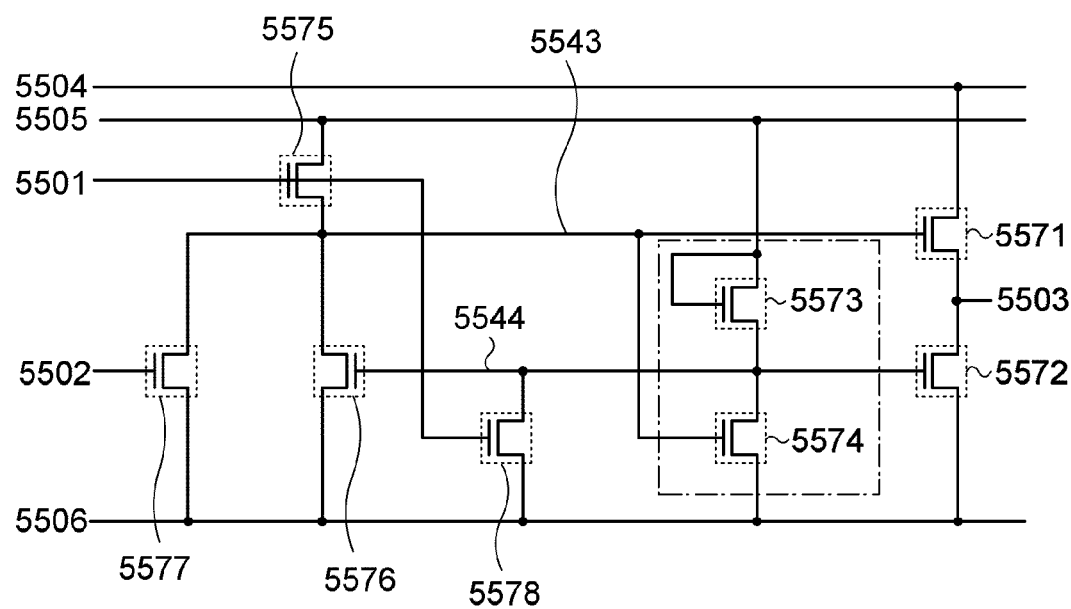
FIG. 15 illustrates connections in a structure of a flip flop according to one embodiment of the present invention.

Next, FIG. 15 illustrates details of the flip-flop illustrated in FIG. 14. A flip-flop illustrated in FIG. 15 includes a first transistor 5571, a second transistor 5572, a third transistor 5573, a fourth transistor 5574, a fifth transistor 5575, a sixth transistor 5576, a seventh transistor 5577, and an eighth transistor 5578. Each of the first transistor 5571, the second transistor 5572, the third transistor 5573, the fourth transistor 5574, the fifth transistor 5575, the sixth transistor 5576, the seventh transistor 5577, and the eighth transistor 5578 is an n-channel transistor and is turned on when the gate-source voltage ($V_{gs}$) exceeds the threshold voltage ($V_{th}$).

In addition, the flip-flop illustrated in FIG. 15 includes a first wiring 5501, a second wiring 5502, a third wiring 5503, a fourth wiring 5504, a fifth wiring 5505, and a sixth wiring 5506.

Although the example in which all the transistors are enhancement type n-channel transistors is described in this embodiment, there is no particular limitation. For example, the driver circuit can be driven even when n-channel depletion-mode transistors are used.

Next, connection structures of the flip-flop illustrated in FIG. 15 are described below.

A first electrode (one of a source electrode and a drain electrode) of the first transistor 5571 is connected to the fourth wiring 5504. A second electrode (the other of the source electrode and the drain electrode) of the first transistor 5571 is connected to the third wiring 5503.

A first electrode of the second transistor 5572 is connected to the sixth wiring 5506. A second electrode of the second transistor 5572 is connected to the third wiring 5503.

A first electrode of the third transistor 5573 is connected to the fifth wiring 5505. A second electrode of the third transistor 5573 is connected to a gate electrode of the second transistor 5572. A gate electrode of the third transistor 5573 is connected to the fifth wiring 5505.

A first electrode of the fourth transistor 5574 is connected to the sixth wiring 5506. A second electrode of the fourth transistor 5574 is connected to the gate electrode of the second transistor 5572. A gate electrode of the fourth transistor 5574 is connected to a gate electrode of the first transistor 5571.

A first electrode of the fifth transistor 5575 is connected to the fifth wiring 5505. A second electrode of the fifth transistor 5575 is connected to the gate electrode of the first transistor 5571. A gate electrode of the fifth transistor 5575 is connected to the first wiring 5501.

A first electrode of the sixth transistor 5576 is connected to the sixth wiring 5506. A second electrode of the sixth transistor 5576 is connected to the gate electrode of the first transistor 5571. A gate electrode of the sixth transistor 5576 is connected to a gate electrode of the second transistor 5572.

A first electrode of the seventh transistor 5577 is connected to the sixth wiring 5506. A second electrode of the seventh transistor 5577 is connected to the gate electrode of the first transistor 5571. A gate electrode of the seventh transistor 5577 is connected to the second wiring 5502.

A first electrode of the eighth transistor 5578 is connected to the sixth wiring 5506. A second electrode of the eighth transistor 5578 is connected to the gate electrode of the second transistor 5572. A gate electrode of the eighth transistor 5578 is connected to the first wiring 5501.

Note that the point at which the gate electrode of the first transistor 5571, the gate electrode of the fourth transistor 5574, the second electrode of the fifth transistor 5575, the second electrode of the sixth transistor 5576, and the second electrode of the seventh transistor 5577 are connected is referred to as a node 5543. The point at which the gate electrode of the second transistor 5572, the second electrode of the third transistor 5573, the second electrode of the fourth transistor 5574, the gate electrode of the sixth transistor 5576, and the second electrode of the eighth transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In the flip-flop 5701_i of the i-th stage, the first wiring 5501 in FIG. 15 is connected to the seventh wiring 5717_i−1 in FIG. 14. The second wiring 5502 in FIG. 15 is connected to the seventh wiring 5717_i+1 in FIG. 14. The third wiring 5503 in FIG. 15 is connected to the seventh wiring 5717_i. The sixth wiring 5506 in FIG. 15 is connected to the fifth wiring 5715.

If the "i" is an odd number, the fourth wiring 5504 in FIG. 15 is connected to the second wiring 5712 in FIG. 14; if the "i" is an even number, the fourth wiring 5504 in FIG. 15 is connected to the third wiring 5713 in FIG. 14. In addition, the fifth wiring 5505 in FIG. 15 is connected to the fourth wiring 5714 in FIG. 14.

Note that in the flip-flop 5701_1 of the first stage, the first wiring 5501 in FIG. 15 is connected to the first wiring 5711 in FIG. 14. In addition, in the flip-flop 5701_n of the n-th stage, the second wiring 5502 in FIG. 15 is connected to the sixth wiring 5716 in FIG. 14.

Alternatively, the signal-line driver circuit and the scan-line driver circuit can be formed using only the n-channel TFTs described as an example in any of other embodiments. The n-channel TFT described as an example in any of other embodiments has a high mobility, and thus the driving frequency of a driver circuit can be increased. For example, the scan-line driver circuit which includes the n-channel TFT described as an example in any of other embodiments can operate at a high speed; therefore, a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving scan lines of even-numbered rows is provided on one side and a scan line driver circuit for driving scan lines of odd-numbered rows is provided on the opposite side; thus, an increase in frame frequency can be realized. Furthermore, the use of the plurality of scan line driver circuits for output of signals to the same scan line is advantageous in increasing the size of a display device.

Figure 10B:
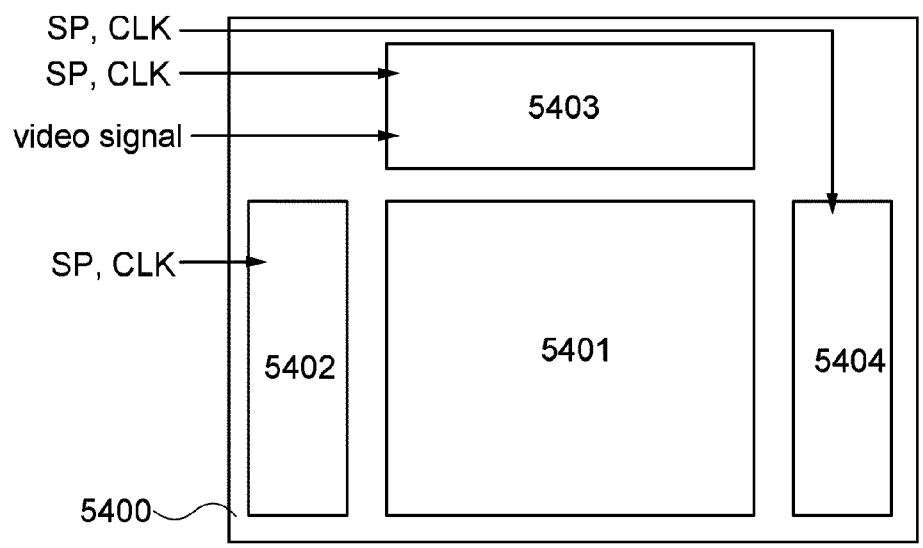

Further, when an active matrix light-emitting display device which is an example of a semiconductor device is manufactured, a plurality of transistors are arranged in at least one pixel, and thus a plurality of scan line driver circuits are preferably arranged. FIG. 10B is a block diagram illustrating an example of an active matrix light-emitting display device.

The light-emitting display device illustrated in FIG. 10B includes, over a substrate 5400, a pixel portion 5401 having a plurality of pixels provided with a display element, a first scan line driver circuit 5402 and a second scan line driver circuit 5404 that select a pixel, and a signal line driver circuit 5403 that controls input of a video signal to the selected pixel.

When the video signal input to a pixel of the light-emitting display device illustrated in FIG. 10B is a digital signal, a pixel emits light or does not emit light by switching of on/off of a transistor. Thus, grayscale can be displayed using an area grayscale method or a time grayscale method. An area grayscale method refers to a driving method in which one pixel is divided into a plurality of subpixels and the respective subpixels are driven independently based on video signals so that grayscale is displayed. Further, a time grayscale method refers to a driving method in which a period during which a pixel emits light is controlled so that grayscale is displayed.

Since the response time of a light-emitting element is higher than that of a liquid crystal element or the like, the light-emitting element is more suitable for a time grayscale method than the liquid crystal element. Specifically, in the case of displaying with a time grayscale method, one frame period is divided into a plurality of subframe periods. Then, in accordance with video signals, the light-emitting element in the pixel is brought into a light-emitting state or a non-light-emitting state in each subframe period. By dividing one frame period into a plurality of subframe periods, the total length of time, in which a pixel actually emits light in one frame period, can be controlled by video signals so that grayscale can be displayed.

Note that in the light-emitting display device of FIG. 10B, in the case where one pixel includes two switching TFTs, a signal which is input to a first scan line which is a gate wiring of one of the switching TFTs is generated in the first scan line driver circuit 5402 and a signal which is input to a second scan line which is a gate wiring of the other switching TFT is generated in the second scan line driver circuit 5404. However, both of the signals which are input to the first scan line and the second scan line may be generated in one scan line driver circuit. In addition, for example, there is a possibility that a plurality of scan lines used for controlling the operation of the switching element are provided in each pixel, depending on the number of the switching TFTs included in one pixel. In this case, one scan line driver circuit may generate all signals that are input to the plurality of scan lines, or a plurality of scan line driver circuits may generate signals that are input to the plurality of scan lines.

In addition, also in the light-emitting device, a part of a driver circuit that can include n-channel TFTs among driver circuits can be formed over the same substrate as that for the transistors of the pixel portion. Alternatively, the signal-line driver circuit and the scan-line driver circuit can be formed using only the n-channel TFTs described as an example in any of other embodiments.

Moreover, the above-described driver circuit can be used for an electronic paper that drives electronic ink using an element electrically connected to a switching element, without being limited to applications to a liquid crystal display device or a light-emitting display device. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. An electrophoretic display device does not need to use a polarizer which is required in a liquid crystal display device, and both the thickness and weight of the electrophoretic display device can be reduced to a half of those of a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. For example, the active matrix substrate obtained by using the transistors which can be formed by the method described as an example in any of other embodiments can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Since a transistor of an embodiment of the present invention, in which reduction of the on current (the drain current flowing during an on state of a semiconductor element) over time is suppressed, is mounted, the display device described in this embodiment has high reliability.

Note that the structure described in this embodiment can be combined with any structure exemplified in the other embodiments as appropriate.

(Embodiment 7)

When the thin film transistors exemplified in any of the other embodiments are manufactured and used for a pixel portion and further for a driver circuit, a semiconductor device having a display function (also referred to as a display device) can be manufactured. Moreover, part or whole of a driver circuit can be formed over the same substrate as a pixel portion, using the thin film transistor described as an example in any of the other embodiments, so that a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by the current or the voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which a display element is sealed, and a module in which an IC including a controller or the like is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, the appearance and a cross section of a liquid crystal display panel which is one embodiment of the present invention, will be described with reference to FIGS. 16A1 and 16A2 and 16B. FIGS. 16A1 and 16A2 are top views of a panel in which high reliable thin film transistors 4010 and 4011 each including the In—Ga—Zn—O-based non-single-crystal film as the oxide semiconductor layer exemplified in any of the other embodiments, and a liquid crystal element 4013 which are formed over a first substrate 4001, are sealed between the first substrate 4001 and a second substrate 4006 with a sealant 4005. FIG. 16B is a cross-sectional view taken along line M-N of FIGS. 16A1 and 16A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 16A1 illustrates an example of mounting the signal line driver circuit 4003 by a COG method, and FIG. 16A2 illustrates an example of mounting the signal line driver circuit 4003 by a TAB method.

The pixel portion 4002 and the scan line driver circuit 4004 provided over the first substrate 4001 include a plurality of thin film transistors. FIG. 16B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

The highly reliable thin film transistor including In—Ga—Zn—O-based non-single-crystal films as the oxide semiconductor layers, exemplified in any of the other embodiments, can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010 is. With use of the common connection portion, the counter electrode layer 4031 and the common potential line can be electrically connected to each other through conductive particles arranged between a pair of substrates. Note that the conductive particles are included in the sealant 4005.

Alternatively, liquid crystal exhibiting a blue phase for which an alignment film is unnecessary may be used. A blue phase is a type of liquid crystal phase which appears just before a cholesteric liquid crystal changes into an isotropic phase while the temperature of the cholesteric liquid crystal is increased. Since the blue phase appears only within a narrow range of temperature, liquid crystal composition containing a chiral agent at 5 wt % or more for improving the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Note that although this embodiment shows an example of a transmissive liquid crystal display device, the present invention can also be applied to a reflective liquid crystal display device or a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce the surface roughness of the thin film transistor and to improve the reliability of the thin film transistor, the thin film transistor exemplified in any of the other embodiments is covered with the insulating layers (the insulating layer 4020 and the insulating layer 4021) serving as a protective film or a planarizing insulating film. Note that the protective film is provided to prevent entry of contaminant impurities such as an organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, the present invention is not limited to this method and a variety of methods may be employed.

In this embodiment, the insulating layer 4020 having a layered structure is formed as the protective film. As a first layer of the insulating layer 4020, a silicon oxide film is formed by a sputtering method. The use of a silicon oxide film as a protective film has an effect of preventing hillock of an aluminum film used for the source and drain electrode layers.

As a second layer of the protective film, an insulating layer is formed. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical properties of the TFT.

Further, after the protective film is formed, the oxide semiconductor layer may be annealed (at 300° C. to 400° C.).

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case where the insulating layer 4021 is formed using a material solution, the oxide semiconductor layer may be annealed (at 300° C. to 400° C.) at the same time of a baking step. When the baking of the insulating layer 4021 and the annealing of the oxide semiconductor layer are performed at the same time, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied, from an FPC 4018, to the signal line driver circuit 4003 which is formed separately, the scan line driver circuit 4004, or the pixel portion 4002.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 via an anisotropic conductive film 4019.

Although FIGS. 16A1 and 16A2 and 16B illustrate an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

Figure 17:
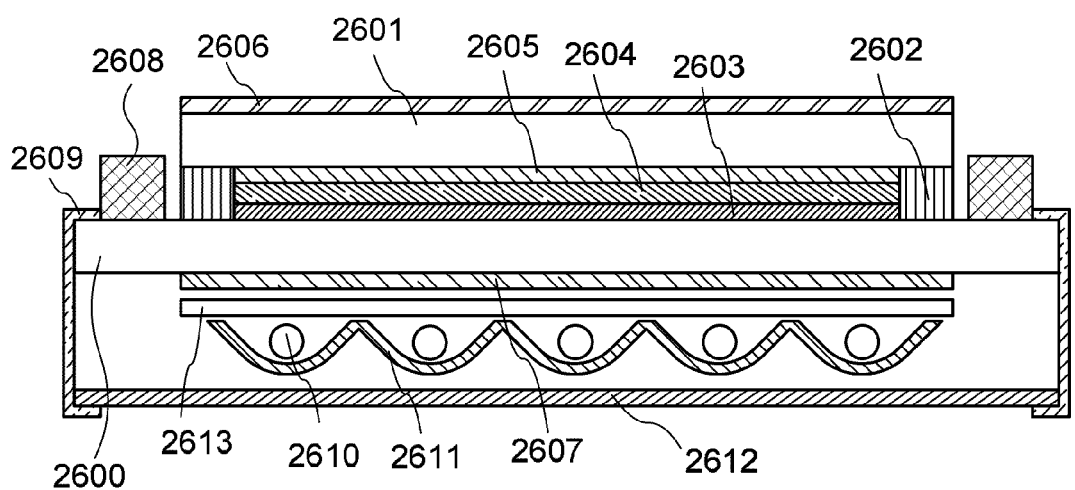
FIG. 17 illustrates a semiconductor device according to one embodiment of the present invention.

FIG. 17 illustrates an example in which a liquid crystal display module is formed as a semiconductor device with the use of a TFT substrate 2600 which is manufactured by application of the TFT described as an example in any other embodiments.

FIG. 17 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

Since in this embodiment, a thin film transistor in which reduction of the on current (the drain current flowing during an on state of a semiconductor element) over time is suppressed is mounted, a liquid crystal display panel described in this embodiment has high reliability.

Note that the structure described in this embodiment can be combined with any structure exemplified in the other embodiments as appropriate.

(Embodiment 8)

In this embodiment, an example of an electronic paper will be described as a semiconductor device to which the thin film transistors exemplified in any of the other embodiments are applied.

Figure 18:
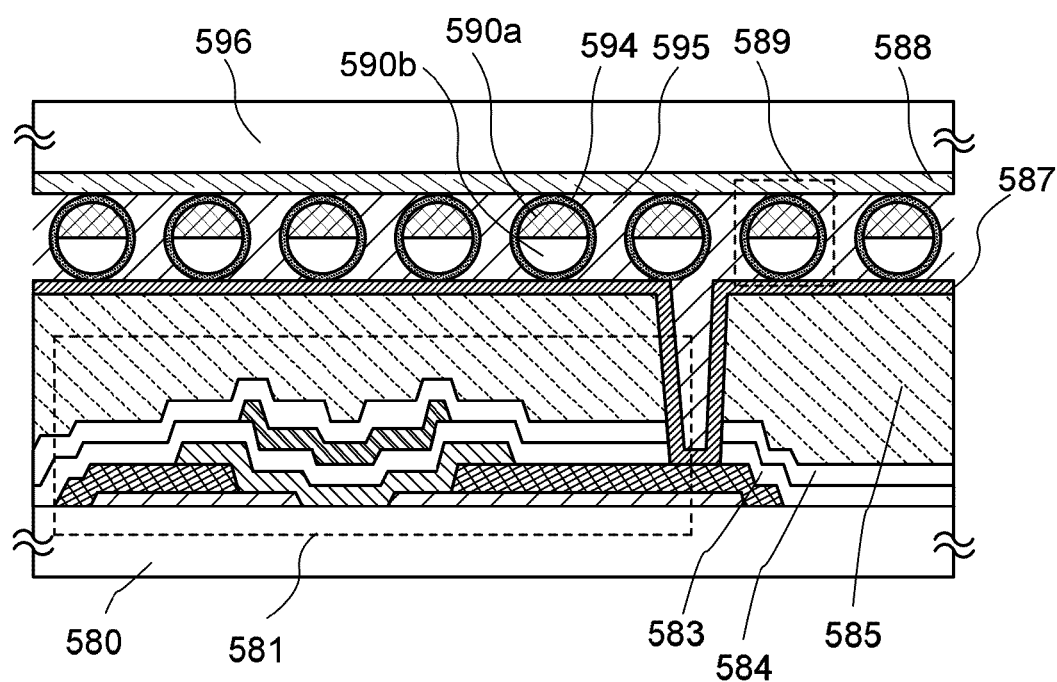
FIG. 18 illustrates a semiconductor device according to one embodiment of the present invention.

FIG. 18 illustrates an active matrix electronic paper as an example of a semiconductor device. As a thin film transistor 581 used for the semiconductor device, the thin film transistor exemplified in any of the other embodiments can be applied.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 sealed between a substrate 580 and a substrate 596 is a thin film transistor with a top gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 are provided. Each spherical particle 589 includes a black region 590*a* and a white region 590*b*, and a cavity 594 filled with liquid around the black region 590*a* and the white region 590*b*. The circumference of the spherical particle 589 is filled with filler 595 such as a resin (see FIG. 18). In this embodiment, the first electrode layer 587 corresponds to a pixel electrode, and the second electrode layer 588 corresponds to a common electrode. The second electrode layer 588 is electrically connected to a common potential line provided over the same substrate as that for the thin film transistor 581. The second electrode layer 588 and the common potential line are electrically connected through conductive particles disposed between a pair of substrates using the common connection portion exemplified in any of the other embodiments.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule provided between the first electrode layer and the second electrode layer, when an electric field is applied by the first electrode layer and the second electrode layer, the white microparticles and the black microparticles move to opposite directions to each other, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Since in this embodiment, a thin film transistor in which reduction of the on current (the drain current flowing during an on state of a semiconductor element) over time is suppressed is mounted, an electronic paper described in this embodiment has high reliability.

Note that the structure described in this embodiment can be combined with any structure exemplified in the other embodiments as appropriate.

(Embodiment 9)

In this embodiment, an example of a light-emitting display device will be described as a semiconductor device to which the thin film transistors exemplified in any of the other embodiments are applied. As a display element included in a display device, a light-emitting element utilizing electroluminescence will be described in this embodiment. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made in this embodiment using an organic EL element as a light-emitting element.

Figure 19:
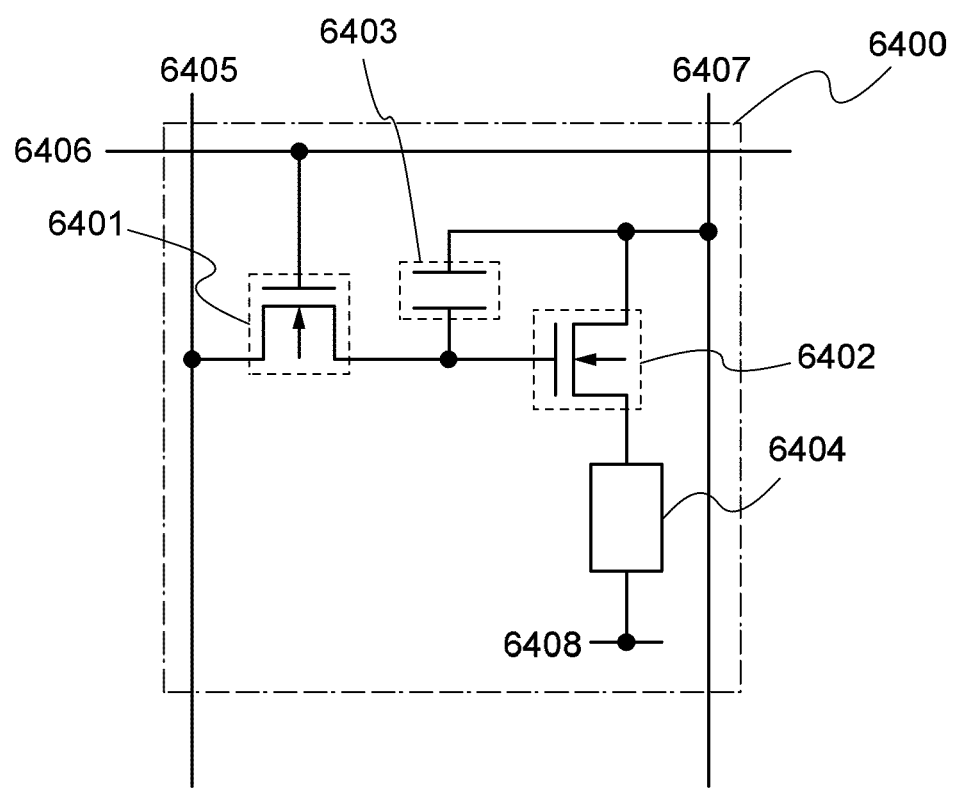
FIG. 19 is a pixel equivalent circuit of a semiconductor device according to one embodiment of the present invention.

FIG. 19 illustrates an example of a pixel structure as an example of a semiconductor device of the present invention, which can be driven by a digital time grayscale method.

A structure and operation of a pixel to which digital time grayscale driving can be applied are described. In this embodiment, one pixel includes two of the n-channel transistors in each of which a channel formation region is formed in an oxide semiconductor layer (In—Ga—Zn—O-based non-single-crystal film) described as an example in other embodiments.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying that the low power supply potential is lower than a high power supply potential (low power supply potential<high power supply potential) based on the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to the sum voltage of the power supply line voltage and $V_{th}$ of the driver transistor 6402 (voltage of the power supply line+$V_{th}$ of the driver transistor 6402) is applied to the signal line 6405.

In the case of using an analog grayscale method instead of the digital time grayscale method, the same pixel structure as in FIG. 19 can be employed by inputting signals in a different way.

In the case of performing analog grayscale driving, a voltage higher than or equal to the sum voltage of forward voltage of the light-emitting element 6404 and $V_{th}$ of the driver transistor 6402 (forward voltage of the light-emitting element 6404+$V_{th}$ of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

The pixel structure illustrated in FIG. 19 is not limited thereto. For example, a switch, a resistor, a capacitor, a transistor, a logic circuit, or the like may be added to the pixel illustrated in FIG. 19.

Next, structures of a light-emitting element are described with reference to FIGS. 20A to 20C. In this embodiment, a cross-sectional structure of a pixel will be described by taking an n-channel driving TFT as an example. Driving TFTs 7001, 7011, and 7021 used in semiconductor devices illustrated in FIGS. 20A, 20B, and 20C, respectively can be formed in a manner similar to the thin film transistor described in any other embodiments and are highly reliable thin film transistors each including an In—Ga—Zn—O-based non-single-crystal film as a semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure of the present invention can be applied to a light-emitting element having any of these emission structures.

A light-emitting element with a top-emission structure is described with reference to FIG. 20A.

Figure 20A:
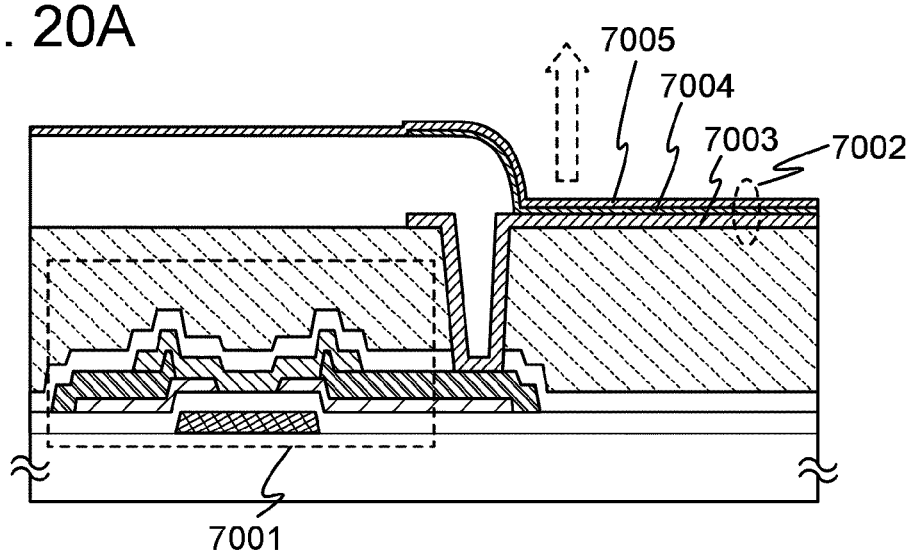
FIGS. 20A to 20C illustrate a semiconductor device according to one embodiment of the present invention.

FIG. 20A is a cross-sectional view of a pixel in the case where the driving TFT 7001 is an n-channel transistor and light is emitted from a light-emitting element 7002 to an anode 7005 side. In FIG. 20A, a cathode 7003 of the light-emitting element 7002 is electrically connected to the TFT 7001 serving as a driving TFT, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a conductive film with a light-transmitting property with respect to visible light, such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

The light-emitting element 7002 corresponds to a region where the light-emitting layer 7004 is sandwiched between the cathode 7003 and the anode 7005. In the case of the pixel illustrated in FIG. 20A, light is emitted from the light-emitting element 7002 to the anode 7005 side as indicated by the arrow of FIG. 20A.

Next, a light-emitting element having the bottom-emission structure is described with reference to FIG. 20B. FIG. 21B is a cross-sectional view of a pixel in the case where the driving TFT 7011 is an n-channel transistor and light is emitted from a light-emitting element 7012 to a cathode 7013 side. In FIG. 20B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed so as to cover the anode 7015 when the anode 7015 has a light-transmitting property with respect to visible light. For the cathode 7013, a variety of materials can be used as in the case of FIG. 20A as long as the cathode 7013 is a conductive film having a low work function. The cathode 7013 is formed to have a thickness that can transmit light (preferably, approximately 5 nm to 30 nm). For example, an aluminum film with a thickness of 20 nm can be used as the cathode 7013. The light-emitting layer 7014 may be formed of a single layer or by stacking a plurality of layers as in the case of FIG. 20A. The anode 7015 is not required to transmit light, but can be formed using a conductive material having a light-transmitting property with respect to visible light as in the case of FIG. 20A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 20B, light is emitted from the light-emitting element 7012 to the cathode 7013 side as indicated by the arrow of FIG. 20B. Next, a light-emitting element having a dual-emission structure is described with reference to FIG. 20C. In FIG. 20C, a cathode 7023 of a light-emitting element 7022 is formed over a light-transmitting conductive film 7027 with respect to visible light which is electrically connected to the driver TFT 7021, and a light-emitting layer 7024 and an anode 7025 are stacked in this order over the cathode 7023. As in the case of FIG. 20A, the cathode 7023 can be formed of any of a variety of conductive materials as long as it is conductive and has a low work function. The cathode 7023 is formed to have a thickness that can transmit light. For example, a film of Al having a thickness of 20 nm can be used as the cathode 7023. The light-emitting layer 7024 may be formed using a single layer or by stacking a plurality of layers as in the case of FIG. 20A. As in the case of FIG. 20A, the anode 7025 can be formed using a conductive material having a light-transmitting property with respect to visible light.

The light-emitting element 7022 corresponds to a region where the cathode 7023, the light-emitting layer 7024, and the anode 7025 overlap with one another. In the pixel illustrated in FIG. 20C, light is emitted from the light-emitting element 7022 to both the anode 7025 side and the cathode 7023 side as indicated by the arrows of FIG. 20C.

Although an organic EL element is described in this embodiment as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 20B:
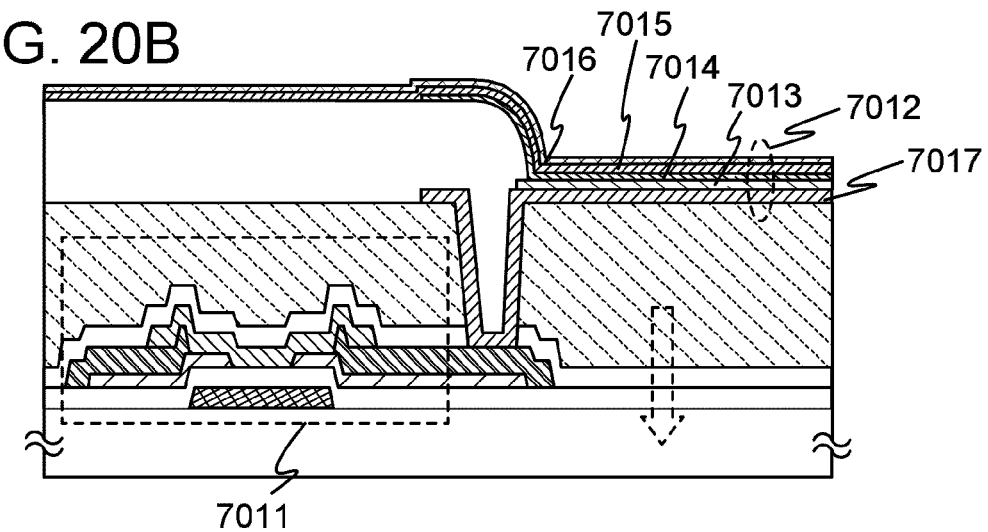
Figure 20C:
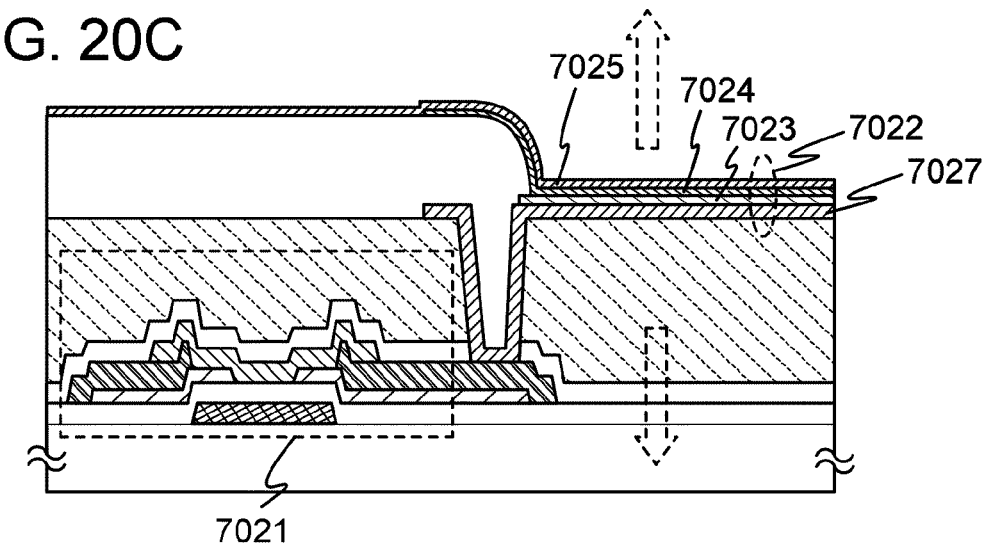

The semiconductor device described in this embodiment is not limited to the structures illustrated in FIGS. 20A to 20C, and can be modified in various ways based on the spirit of techniques according to the present invention.

Figure 21A:
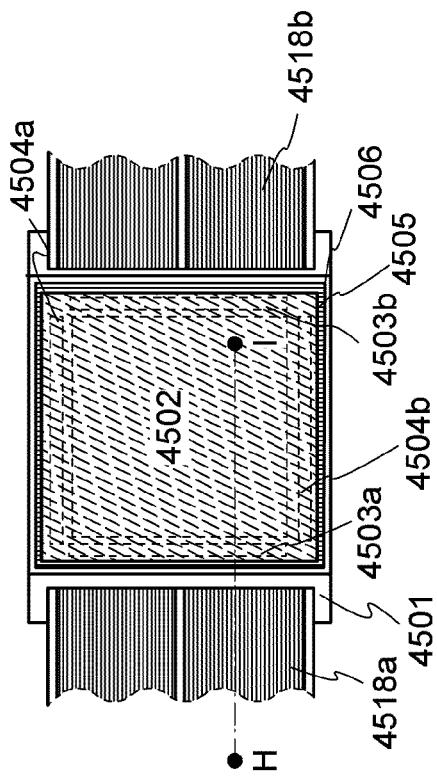
FIGS. 21A and 21B illustrate a semiconductor device according to one embodiment of the present invention.
Figure 21B:
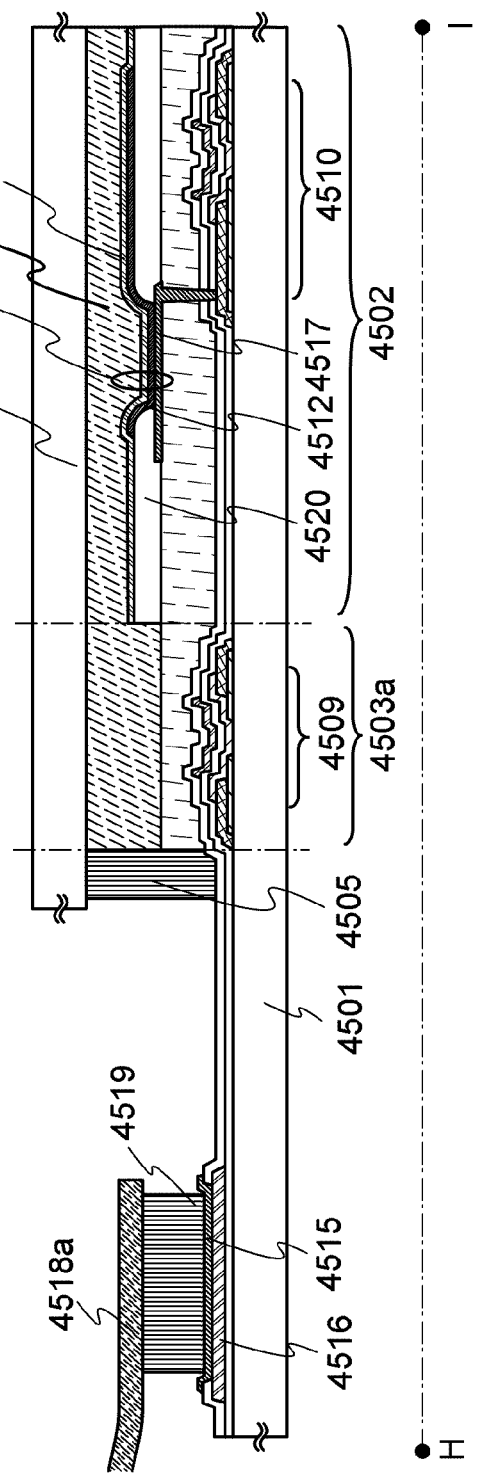

Next, the appearance and a cross section of a light-emitting display panel (also referred to as a light-emitting panel) to which the thin film transistor exemplified in any of the other embodiments is applied will be described with reference to FIGS. 21A and 21B. FIG. 21A is a top view of a panel in which a thin film transistor and a light-emitting element formed over a first substrate are sealed between the first substrate and a second substrate with a sealant. FIG. 21B is a cross-sectional view taken along line H-I of FIG. 21A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 21B.

For the thin film transistors 4509 and 4510, the highly reliable thin film transistor including an In—Ga—Zn—O-based non-single-crystal film as a semiconductor layer described in any of other embodiments can be employed. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that a structure of the light-emitting element 4511 is not limited to the stacked structure shown in this embodiment, which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

The substrate located in the direction in which light is extracted from the light-emitting element 4511 needs to have a light-transmitting property with respect to visible light. In that case, a material having a light-transmitting property with respect to visible light, such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be mounted as driver circuits formed using a single crystal semiconductor film or a polycrystalline semiconductor film over a substrate separately prepared. In addition, only the signal line driver circuit or only part thereof, or only the scan line driver circuit or only part thereof may be separately formed to be mounted. This embodiment is not limited to the structure illustrated in FIGS. 21A and 21B.

Since in this embodiment, a thin film transistor in which reduction of the on current (the drain current flowing during an on state of a semiconductor element) over time is suppressed is mounted, a light-emitting display described in this embodiment has high reliability.

Note that the structure described in this embodiment can be combined with any structure exemplified in the other embodiments as appropriate.

(Embodiment 10)

A semiconductor device to which the thin film transistor described as an example in other embodiments can be applied as an electronic paper. An electronic paper can be used for electronic devices of a variety of fields as long as they can display data. For example, an electronic paper can be applied to an e-book reader (electronic book), a poster, an advertisement in a vehicle such as a train, or displays of various cards such as a credit card. An example of such an electronic device is illustrated in FIG. 22.

Figure 22:
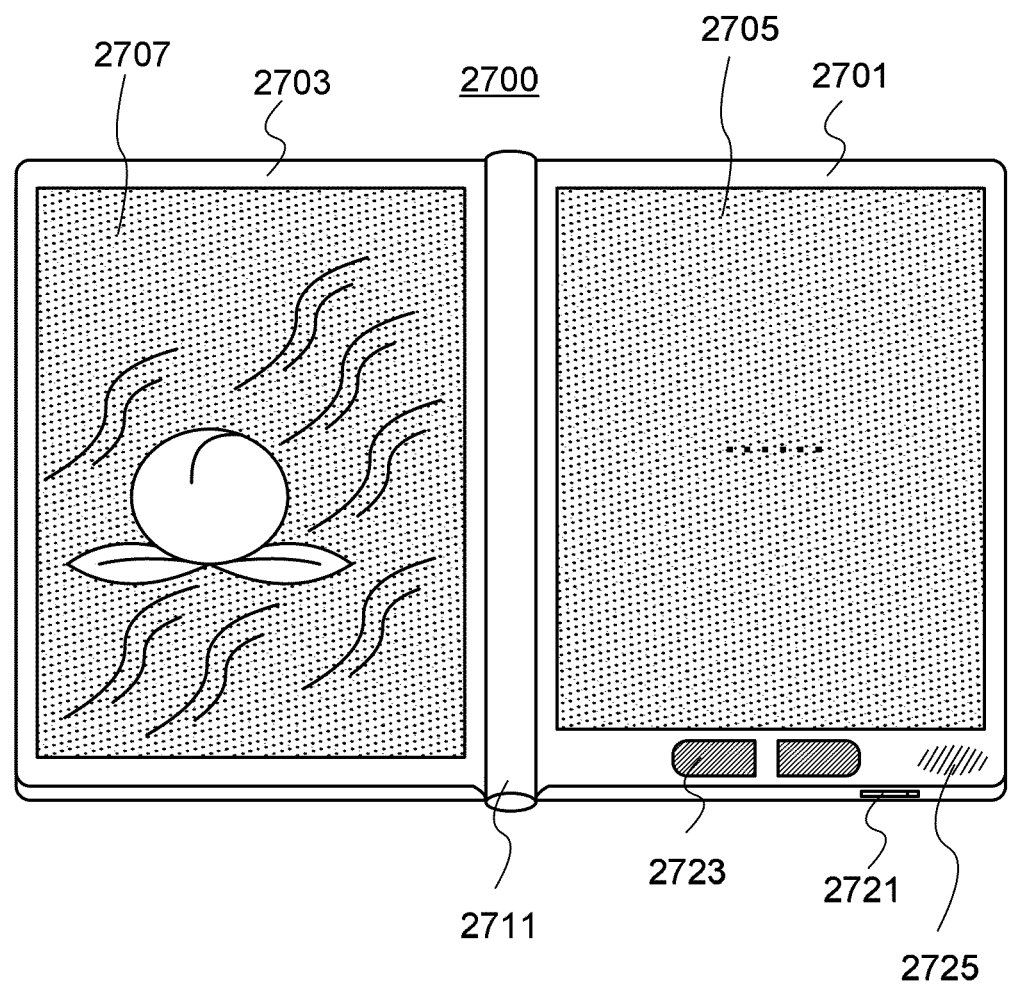
FIG. 22 is an external view illustrating an example of an electronic book reader.

FIG. 22 illustrates an example of an electronic book reader (e-book reader) 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 22) can display text and a display portion on the left side (the display portion 2707 in FIG. 22) can display graphics.

FIG. 22 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Since in this embodiment, a thin film transistor in which reduction of the on current (the drain current flowing during an on state of a semiconductor element) over time is suppressed is mounted, a display device described in this embodiment has high reliability.

Note that the structure described in this embodiment can be combined with any structure exemplified in the other embodiments as appropriate.

(Embodiment 11)

The semiconductor device including the thin film transistor exemplified in other embodiments can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 23A:
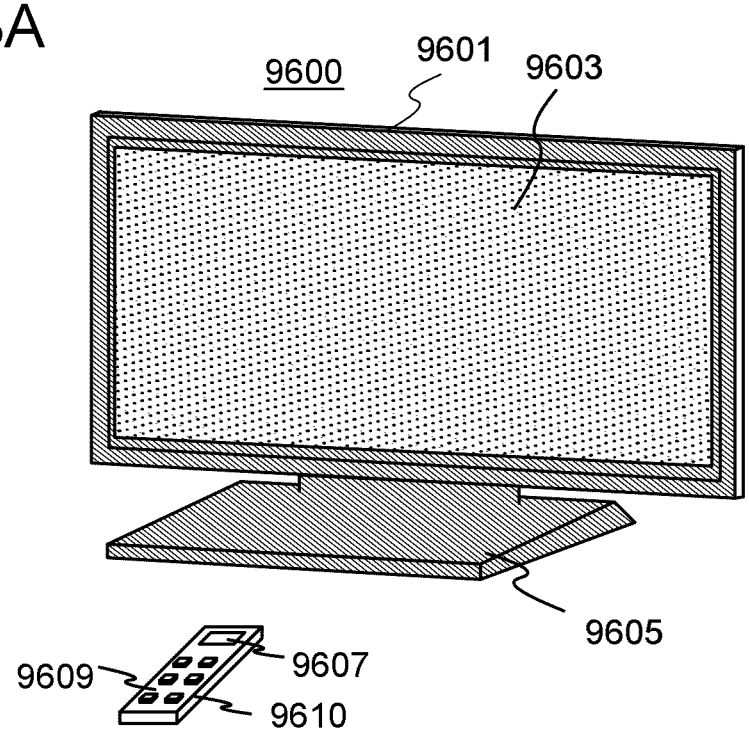
FIGS. 23A and 23B are external views illustrating examples of a television device and a digital photo frame.

FIG. 23A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 23B:
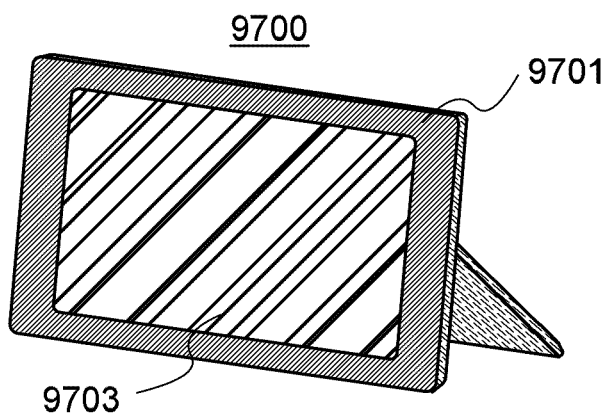

FIG. 23B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 24A:
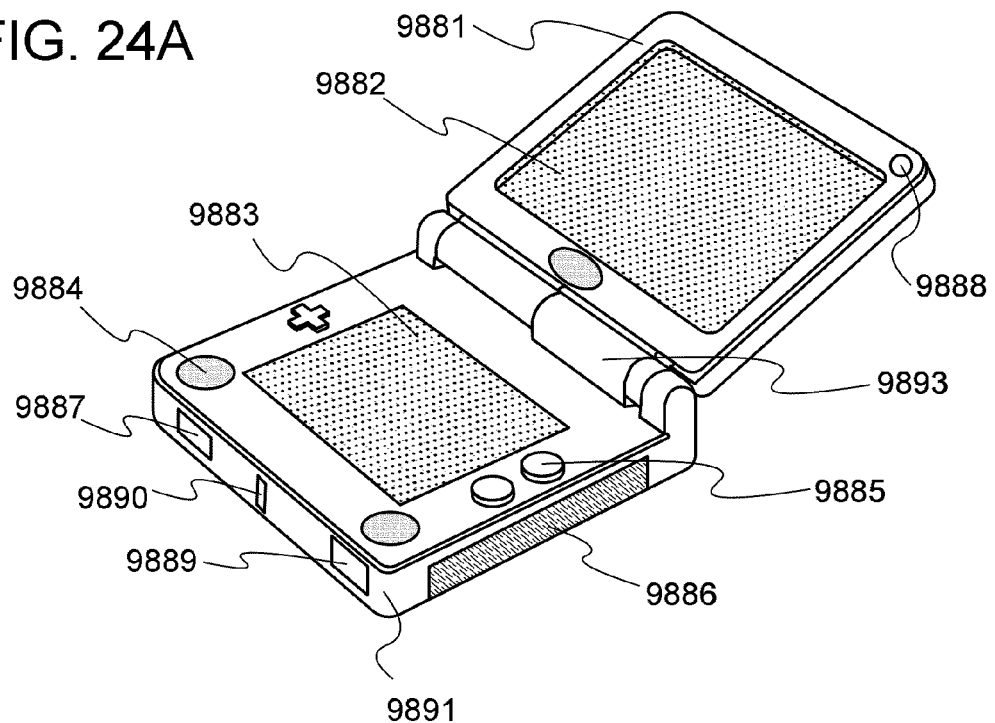
FIGS. 24A and 24B are external views illustrating examples of game machines.

FIG. 24A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 24A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable amusement machine is not limited to the above and other structures provided with at least a semiconductor device of the present invention may be employed. The portable amusement machine may include other accessory equipment as appropriate. The portable game machine illustrated in FIG. 24A has a function of reading a program or data stored in the recording medium to display it on the display portion, and a function of sharing information with another portable game machine by wireless communication. Note that a function of the portable game machine illustrated in FIG. 24A is not limited to the described-above, and the portable game machine can have a variety of functions.

Figure 24B:
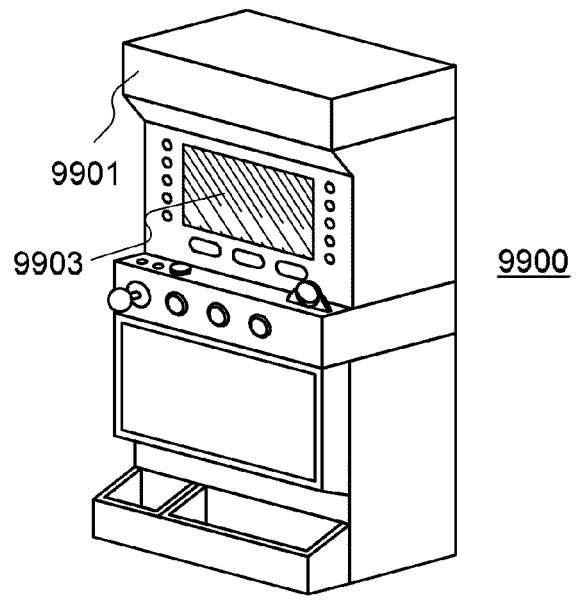

FIG. 24B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device of the present invention may be employed. The slot machine 9900 may include other accessory equipment as appropriate.

Figure 25:
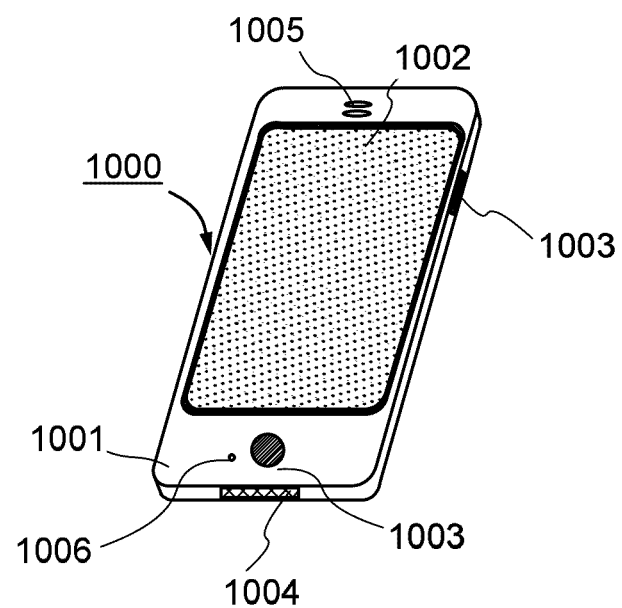
FIG. 25 is an external view illustrating an example of a mobile phone.

FIG. 25 illustrates an example of a mobile phone 1000. The mobile phone 1000 includes a display portion 1002 incorporated in a housing 1001, an operation button 1003, an external connection port 1004, a speaker 1005, a microphone 1006 and the like.

In the mobile phone 1000 illustrated in FIG. 25, data can be input when users touch the display portion 1002 with their fingers or the like. Users can make a call or text messaging by touching the display portion 1002 with their fingers or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in a case of making a call or composing a mail, a text input mode mainly for inputting text is selected for the display portion 1002 so that text displayed on a screen can be input. In that case, it is preferable that a keyboard or number buttons be displayed on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Further, by providing a backlight or a sensing light source which emits a near-infrared light in the display portion, an image of a finger vein, a palm vein, or the like can be taken.

Since in this embodiment, a thin film transistor in which reduction of the on current (the drain current flowing during an on state of a semiconductor element) over time is suppressed is mounted, an electronic display including a display described in this embodiment has high reliability.

Note that the structure described in this embodiment can be combined with any structure exemplified in the other embodiments as appropriate.

This application is based on Japanese Patent Application serial no. 2009-083250 filed with Japan Patent Office on Mar. 30, 2009, the entire contents of which are hereby incorporated by reference.

What is claimed is:

1. A semiconductor device comprising:
   a gate electrode over a substrate;
   a gate insulating film over the gate electrode;
   a first electrode and a second electrode over the gate insulating film;
   a first wiring over the first electrode;
   a second wiring over the second electrode;
   an oxide semiconductor layer over the first wiring and the second wiring, the oxide semiconductor layer being in contact with a side face and a top face of each of the first electrode and the second electrode and a side face and a top face of each of the first wiring and the second wiring; and
   a protective insulating layer over the oxide semiconductor layer,
   wherein the first electrode is extended so as to have an end portion positioned more inwardly than an end portion of the first wiring and overlap with the gate electrode, and the second electrode is extended so as to have an end portion positioned more inwardly than an end portion of the second wiring and overlap with the gate electrode,
   wherein the first wiring and the second wiring do not overlap with the gate electrode,
   wherein electrical conductivity of each of the first electrode and the second electrode is equal to or higher than electrical conductivity of the oxide semiconductor layer,
   wherein electrical conductivity of the first electrode is equal to or lower than electrical conductivity of the first wiring,
   wherein electrical conductivity of the second electrode is equal to or lower than electrical conductivity of the second wiring, and
   wherein the protective insulating layer has direct contact with the gate insulating film, the first wiring, the second wiring, and the oxide semiconductor layer without having direct contact with any portion of the first electrode and the second electrode.

2. The semiconductor device according to claim 1, wherein the end portion of the first wiring is aligned with one end portion of the gate electrode, and wherein the end portion of the second wiring is aligned with the other end portion of the gate electrode.

3. The semiconductor device according to claim 1, wherein a thickness of the oxide semiconductor layer is within the range of from 5 nm to 200 nm inclusive, and wherein a thickness of each of the first electrode and the second electrode is within the range of from 5 nm to 200 nm inclusive.

4. The semiconductor device according to claim 1, wherein electrical conductivity of each of the first electrode and the second electrode is within the range of from $1 \times 10^{-4}$ S/cm to $1 \times 10^{2}$ S/cm inclusive.

5. The semiconductor device according to claim 1, wherein a length of a region where the first electrode overlaps with the gate electrode and a length of a region where the second electrode overlaps with the gate electrode are each within the range of from 0.2 μm to 5 μm inclusive.

6. The semiconductor device according to claim 1,
   wherein each of the first electrode and the second electrode comprises indium, gallium, and zinc, and
   wherein the oxide semiconductor layer comprises indium, gallium, and zinc.

7. A semiconductor device comprising:
   a gate electrode over a substrate;
   a gate insulating film overlapping with the gate electrode;
   a first electrode and a second electrode overlapping with the gate insulating film;
   a first wiring overlapping with the first electrode;
   a second wiring overlapping with the second electrode;
   an oxide semiconductor layer over the first wiring and the second wiring, the oxide semiconductor layer being in contact with a side face and a top face of each of the first electrode and the second electrode and a side face and a top face of each of the first wiring and the second wiring; and a protective insulating layer over the oxide semiconductor layer, wherein the first electrode is extended so as to have an end portion positioned more inwardly than an end portion of the first wiring and overlap with the gate electrode, and the second electrode is extended so as to have an end portion positioned more inwardly than an end portion of the second wiring and overlap with the gate electrode, wherein the first wiring and the second wiring do not overlap with the gate electrode, wherein electrical conductivity of each of the first electrode and the second electrode is equal to or higher than electrical conductivity of the oxide semiconductor layer, wherein electrical conductivity of the first electrode is equal to or lower than electrical conductivity of the first wiring, wherein electrical conductivity of the second electrode is equal to or lower than electrical conductivity of the second wiring, and wherein the protective insulating layer has direct contact with the gate insulating film, the first wiring, the second wiring, and the oxide semiconductor layer without having direct contact with any portion of the first electrode and the second electrode.

8. The semiconductor device according to claim 7, wherein the end portion of the first wiring is aligned with one end portion of the gate electrode, and wherein the end portion of the second wiring is aligned with the other end portion of the gate electrode.

9. The semiconductor device according to claim 7, wherein a thickness of the oxide semiconductor layer is within the range of from 5 nm to 200 nm inclusive, and wherein a thickness of each of the first electrode and the second electrode is within the range of from 5 nm to 200 nm inclusive.

10. The semiconductor device according to claim 7, wherein electrical conductivity of each of the first electrode and the second electrode is within the range of from $1 \times 10^{-4}$ S/cm to $1 \times 10^2$ S/cm inclusive.

11. The semiconductor device according to claim 7, wherein a length of a region where the first electrode overlaps with the gate electrode and a length of a region where the second electrode overlaps with the gate electrode are each within the range of from 0.2 μm to 5 μm inclusive.

12. The semiconductor device according to claim 7,
wherein each of the first electrode and the second electrode comprises indium, gallium, and zinc, and
wherein the oxide semiconductor layer comprises indium, gallium, and zinc.

13. A semiconductor device comprising:
a gate electrode over a substrate;
a gate insulating film overlapping with the gate electrode;
a first electrode and a second electrode overlapping with the gate insulating film;
a first wiring overlapping with the first electrode;
a second wiring overlapping with the second electrode;
an oxide semiconductor layer over the first wiring and the second wiring, the oxide semiconductor layer being in contact with a side face and a top face of each of the first electrode and the second electrode and a side face and a top face of each of the first wiring and the second wiring; and
a protective insulating layer over the oxide semiconductor layer,
wherein the first electrode is extended so as to have an end portion positioned more inwardly than an end portion of the first wiring and overlap with the gate electrode, and the second electrode is extended so as to have an end portion positioned more inwardly than an end portion of the second wiring and overlap with the gate electrode,
wherein the first wiring and the second wiring do not overlap with the gate electrode, and
wherein the protective insulating layer has direct contact with the gate insulating film, the first wiring, the second wiring, and the oxide semiconductor layer without having direct contact with any portion of the first electrode and the second electrode.

14. The semiconductor device according to claim 13, wherein the end portion of the first wiring is aligned with one end portion of the gate electrode, and wherein the end portion of the second wiring is aligned with the other end portion of the gate electrode.

15. The semiconductor device according to claim 13, wherein a thickness of the oxide semiconductor layer is within the range of from 5 nm to 200 nm inclusive, and wherein a thickness of each of the first electrode and the second electrode is within the range of from 5 nm to 200 nm inclusive.

16. The semiconductor device according to claim 13, wherein a length of a region where the first electrode overlaps with the gate electrode and a length of a region where the second electrode overlaps with the gate electrode are each within the range of from 0.2 μm to 5 μm inclusive.

17. The semiconductor device according to claim 13,
wherein each of the first electrode and the second electrode comprises indium, gallium, and zinc, and
wherein the oxide semiconductor layer comprises indium, gallium, and zinc.

* * * * *

UNITED STATES PATENT AND TRADEMARK OFFICE
CERTIFICATE OF CORRECTION

PATENT NO. : 8,927,981 B2  
APPLICATION NO. : 12/725478  
DATED : January 6, 2015  
INVENTOR(S) : Kengo Akimoto et al.

Page 1 of 1

It is certified that error appears in the above-identified patent and that said Letters Patent is hereby corrected as shown below:

In the Specification

At column 1, line 9, "thereof" should be --thereof.--;

At column 11, line 13, "minimized" should be --minimized.--;

At column 11, line 30, "1000 nm" should be --1000 nm.--;

At column 11, line 39, "AlN," should be --AlN,--;

At column 16, line 34, "60 nm" should be --60 nm.--;

At column 19, line 24, "4B 1" should be --4B1--;

At column 31, line 5, "column" should be --column.--;

At column 39, line 15, "nm" should be --nm.--;

In the Claims

In claim 3, at column 50, line 42, "nminclusive," should be --nm inclusive,--.

Signed and Sealed this  
Second Day of June, 2015

Michelle K. Lee  
*Director of the United States Patent and Trademark Office*